US006381257B1

(12) United States Patent
Ershov et al.

(10) Patent No.: US 6,381,257 B1
(45) Date of Patent: *Apr. 30, 2002

(54) VERY NARROW BAND INJECTION SEEDED $F_2$ LITHOGRAPHY LASER

(75) Inventors: Alexander I. Ershov; Eckehard D. Onkels, both of San Diego; Palash P. Das, Vista; William N. Partlo, Poway; Thomas Hofmann, San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,795

(22) Filed: Dec. 28, 1999

Related U.S. Application Data

(63) Continuation-in-part of application No. 09/459,165, filed on Dec. 10, 1999, which is a continuation-in-part of application No. 09/438,249, filed on Nov. 12, 1999, and a continuation-in-part of application No. 09/421,701, filed on Oct. 20, 1999, and a continuation-in-part of application No. 09/407,120, filed on Sep. 27, 1999, now Pat. No. 6,240,110.

(51) Int. Cl.$^7$ .............................. H01S 3/22; H01S 3/223
(52) U.S. Cl. ............................. 372/57; 372/60; 372/108
(58) Field of Search .............................. 372/55, 57–59, 372/61, 9, 20, 97–103, 108

(56) References Cited

U.S. PATENT DOCUMENTS

| 4,534,035 A | 8/1985 | Long ............................ 372/85 |
| 4,959,840 A | 9/1990 | Atkins et al. .................. 372/57 |
| 5,070,513 A | 12/1991 | Letardi ......................... 372/83 |
| 5,856,991 A | 1/1999 | Ershov ......................... 372/57 |
| 5,970,082 A | * 10/1999 | Ershov ........................ 372/102 |
| 6,128,323 A | * 10/2000 | Myers et al. .................. 372/38 |
| 6,154,470 A | 11/2000 | Basting et al. ................. 372/19 |

OTHER PUBLICATIONS

Kakehata et al., "Gain and saturation intensity measurements of a discharge pumped F2 laser at high excitation rates," *Appl. Phys. Letter,* 61(26), Dec. 28, 1992.

Kakehata et al., "Output characteristics of a discharge–pumped F2 laser (167 nm) with an injection–seeded unstable resonator," *J. Appl. Phys.* 74 (4), Aug. 15, 1993.

Hercher, Michael, "Tunable Single Mode Operation of Gas Lasers Using Intracavity Tilted Etalons," *Applied Optics,* vol. 8, No. 6, Jun. 1969, pp. 1103–1106.

Mueckenhelm et al., "Excimer laser with narrow linewidth and large internal beam diergence," *Journal of Physics E–Scientific Instruments* (ISSN 0022–3735), vol. 20, Nov. 1987, pp. 1394–1396 (Nov. 1987).

Reintjes, John F., "Laser Handbook," *Elsevier Science Publishers, B.V.,* 1985, pp. 44–50.

Balla and Hart, "Spectral brightness and other improvements to the tunable ArF excimer laser," *Rev. Sci. Instrum.,* vol. 59, No. 7, pp. 2591–2594 (Jul. 1998).

Bollanti et al., "Compact three electrodes excimer laser IANUS for a POPA optical system," In: High–power gas and sol state lasers; Proceedings of the Meeting, Vienna, Austria, Apr. 5–8, 1994 (A95–2267605–36), Bellingham, WA, Society of Photo–Optical Instrumentation Engineers, SPIE Proceedings, vol. 2206, 1994, pp. 144–153.

Bollanti et al., "Ianus, the three–electrode excimer laser," *Applied Physics B(Lasers and Optics),* vol. B66, No. 4, pp. 401–406, Publisher: Springer–Verlag (Apr. 1998).

Jenkins, Francis A. and White, Harvey E., "Foundamentals of Optics," McGraw–Hill Book Company, Fourth Edition, Copyright 1957, 1976, pp. 297–299.

* cited by examiner

Primary Examiner—James W. Davie
Assistant Examiner—Davienne Monbleau
(74) Attorney, Agent, or Firm—John R. Ross, Esq.

(57) ABSTRACT

A tunable injection seeded very narrow band $F_2$ lithography laser. The laser combines modular design features of prior art long life reliable lithography lasers with special techniques to produce a seed beam operated in a first gain medium which beam is used to stimulate narrow band lasing in a second gain medium to produce a very narrow band laser beam useful for integrated circuit lithography. In a preferred embodiment, two tunable etalon output couplers are used to narrow band an $F_2$ laser and the output of the seed laser is amplified in an $F_2$ amplifier.

14 Claims, 42 Drawing Sheets

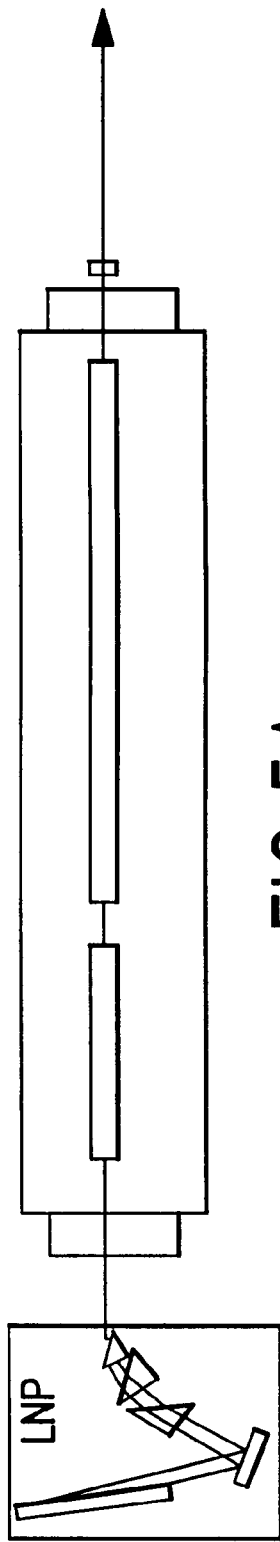
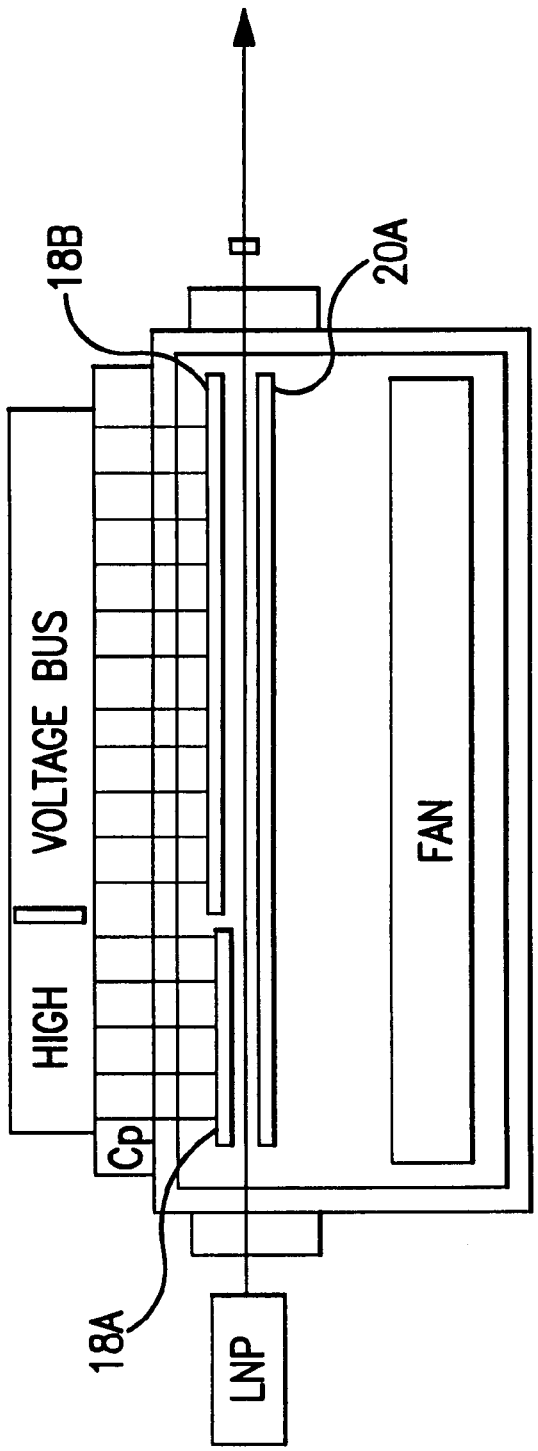

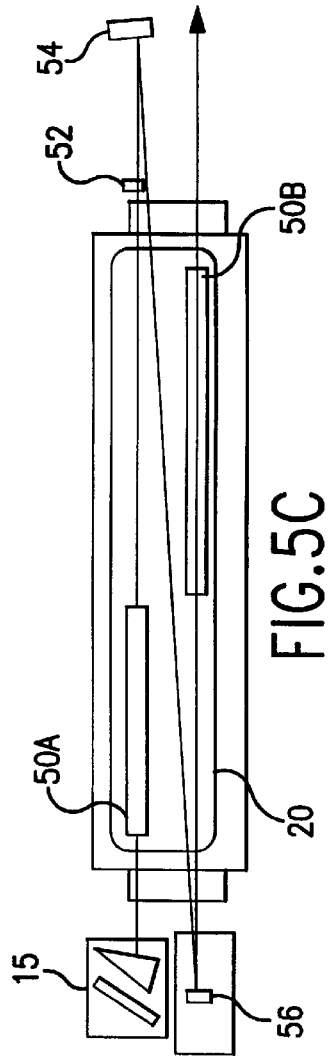
FIG.5C
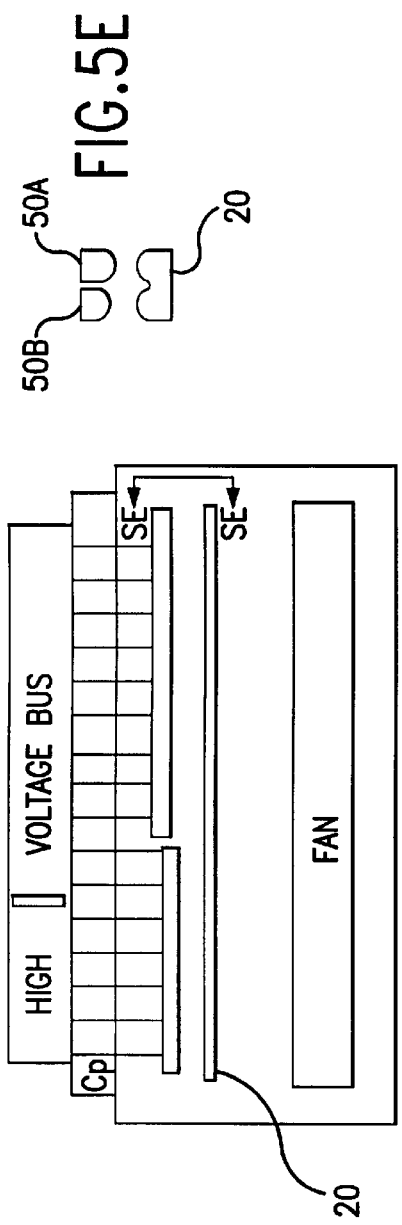
FIG.5D
FIG.5E
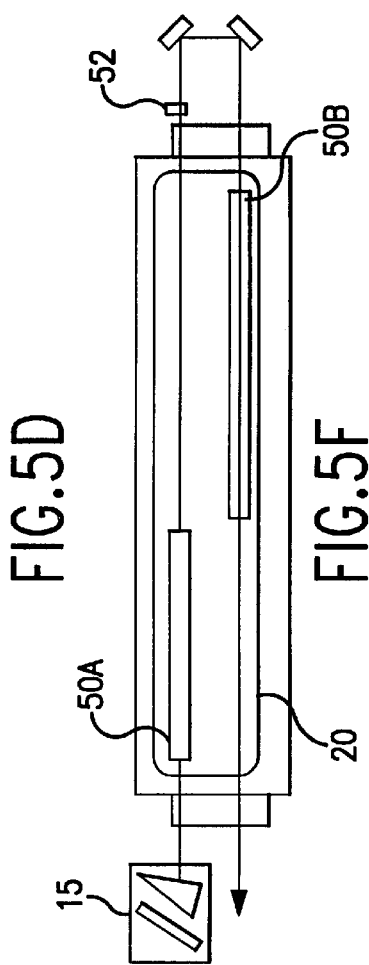
FIG.5F

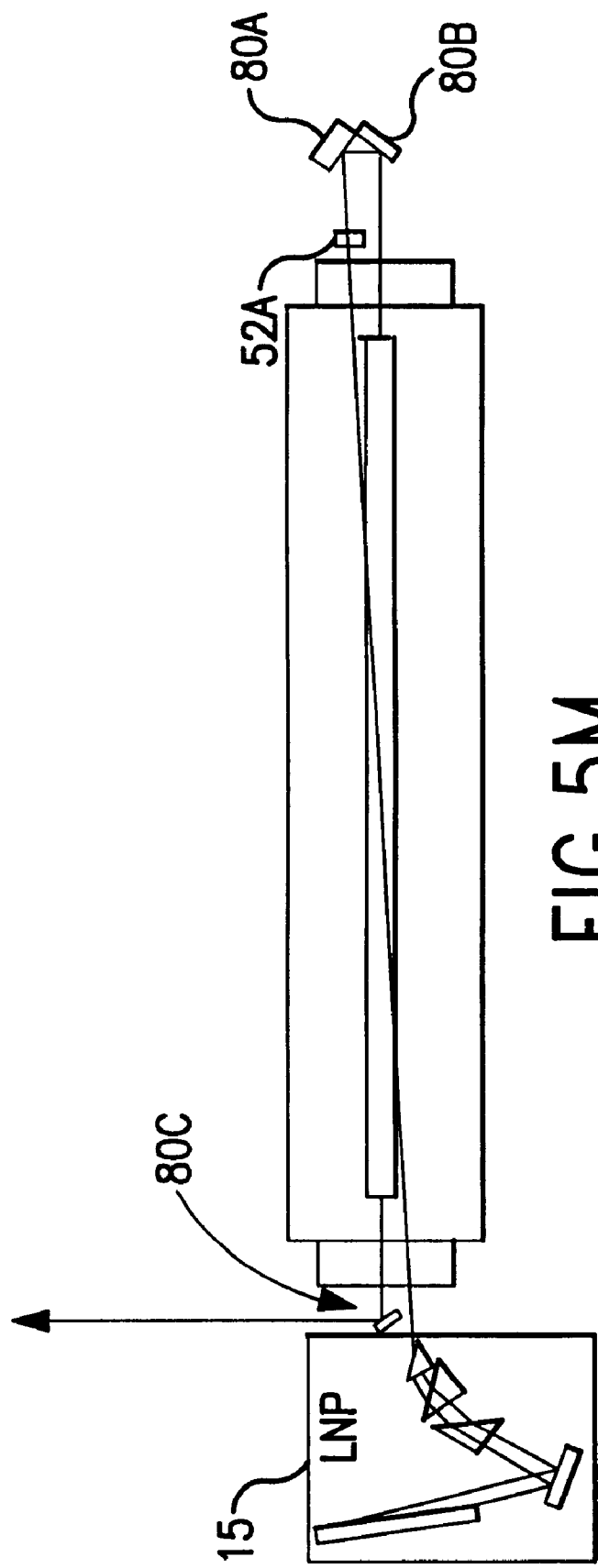

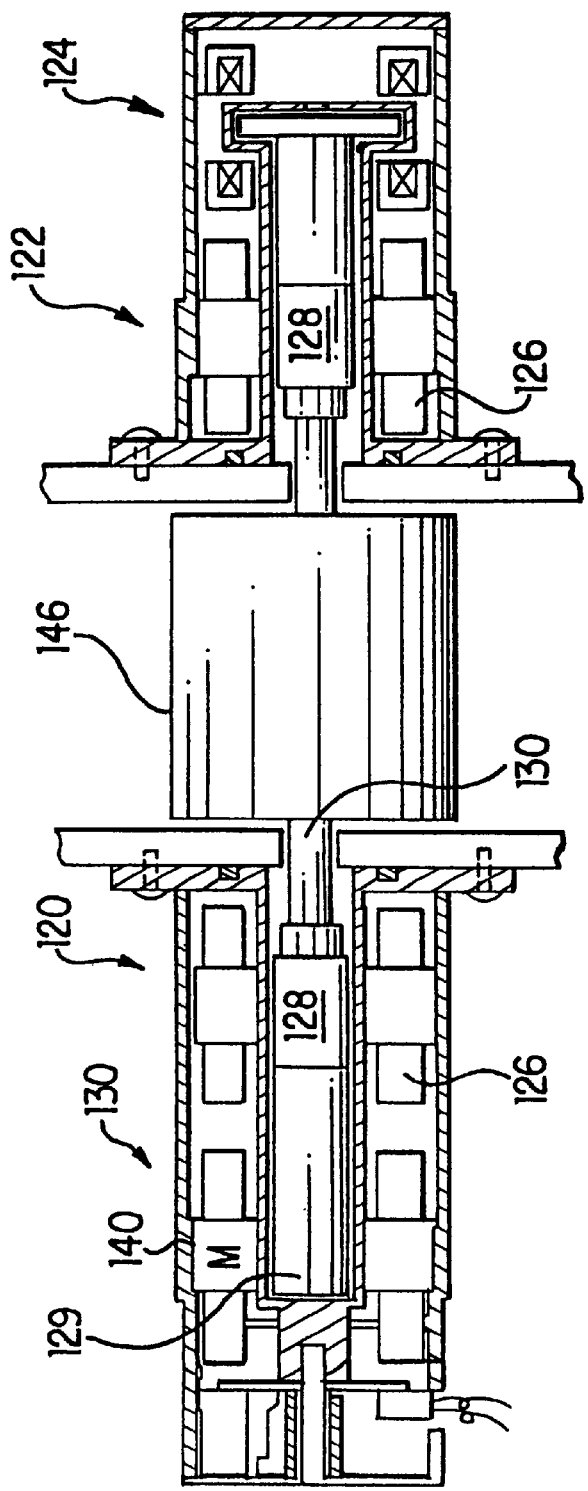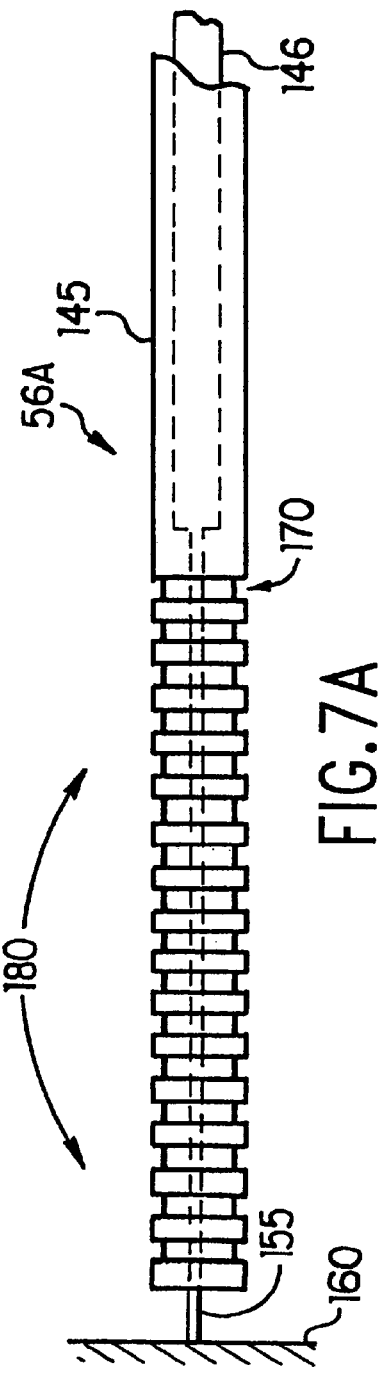
FIG.7B
FIG.7A

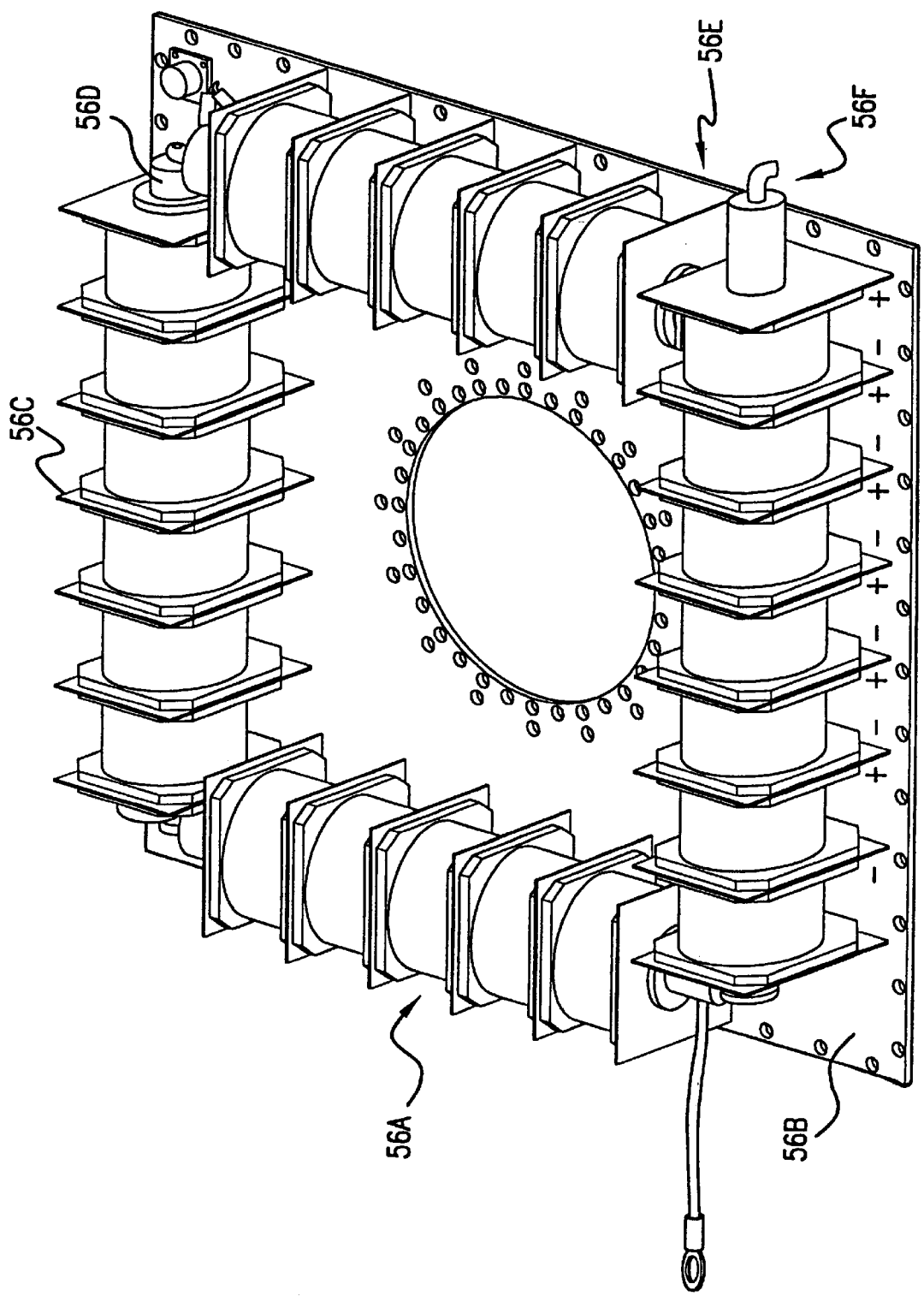

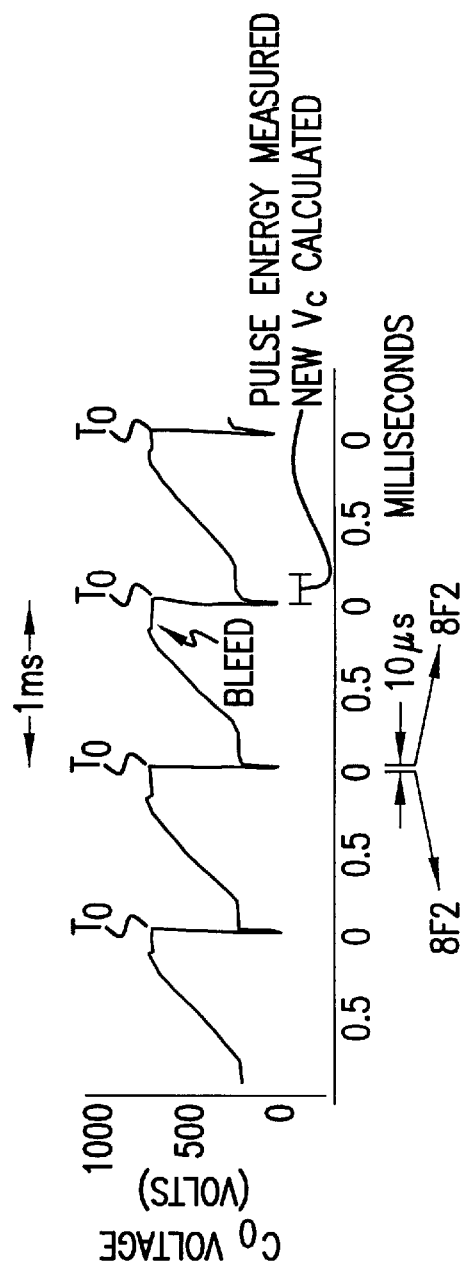
FIG.8F1
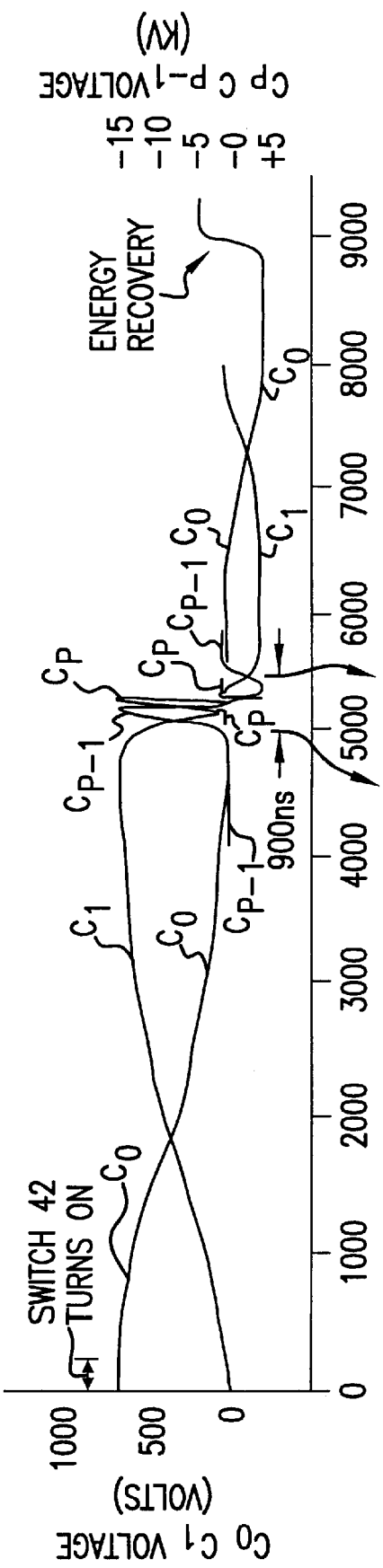
FIG.8F2

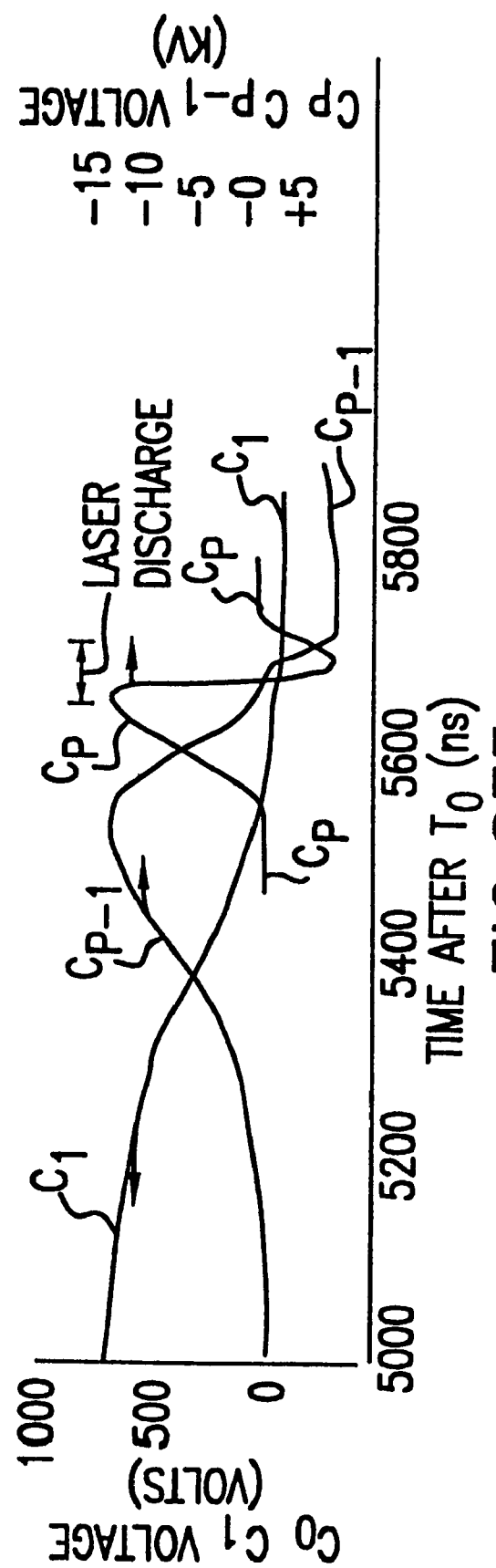
FIG. 8F3

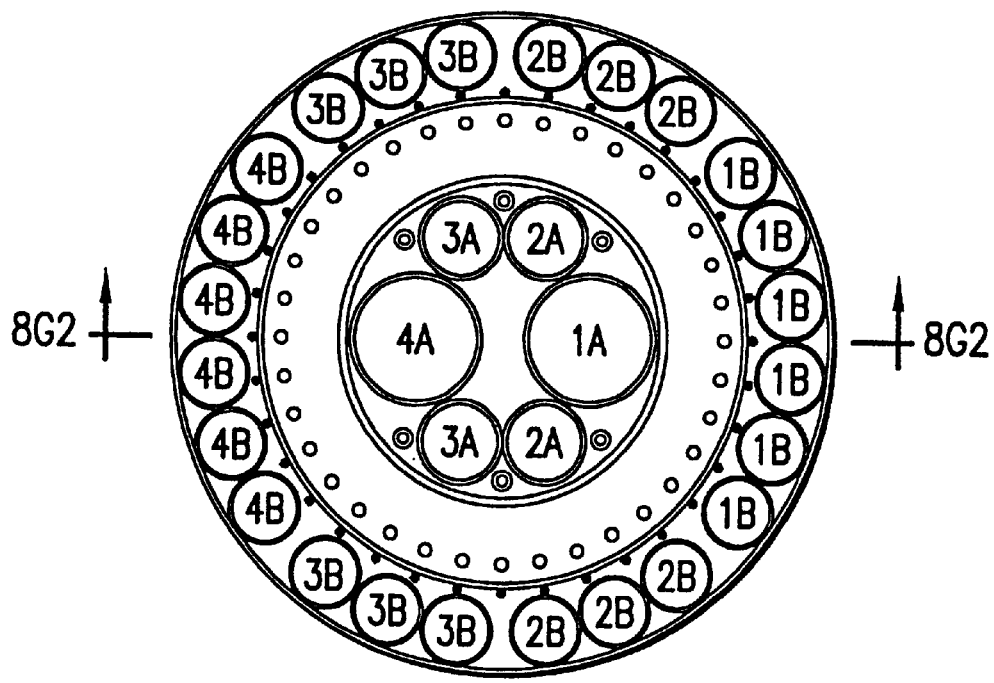
FIG.8G1
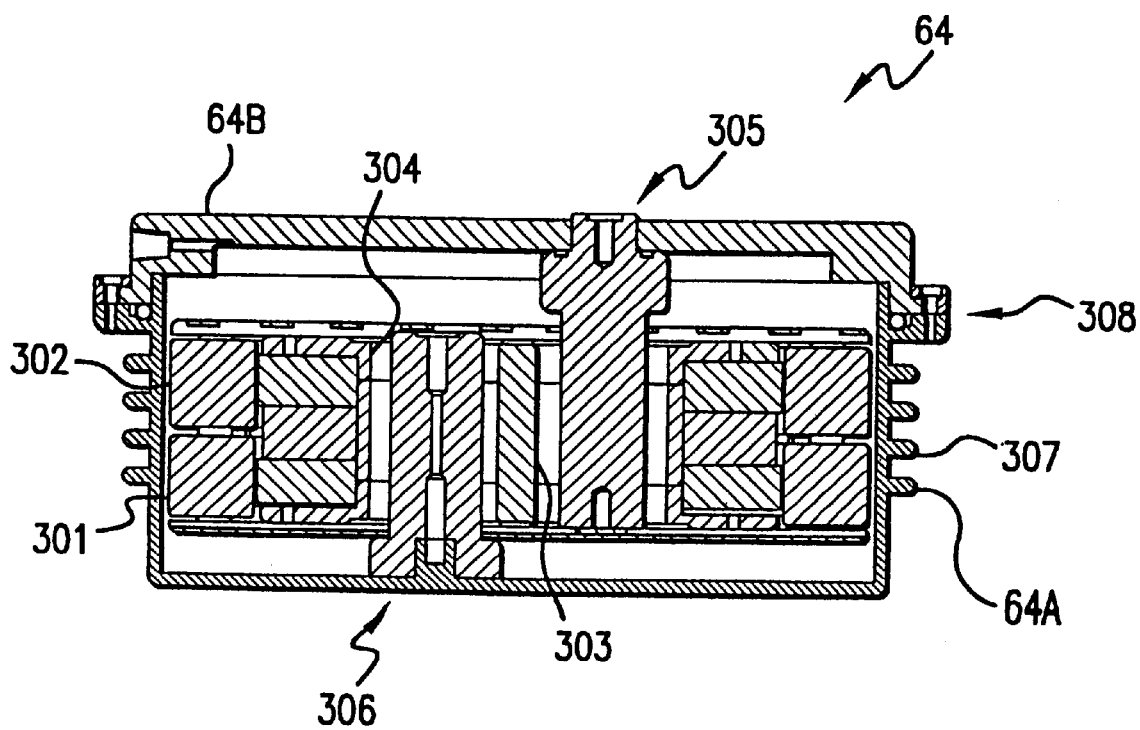
FIG.8G2

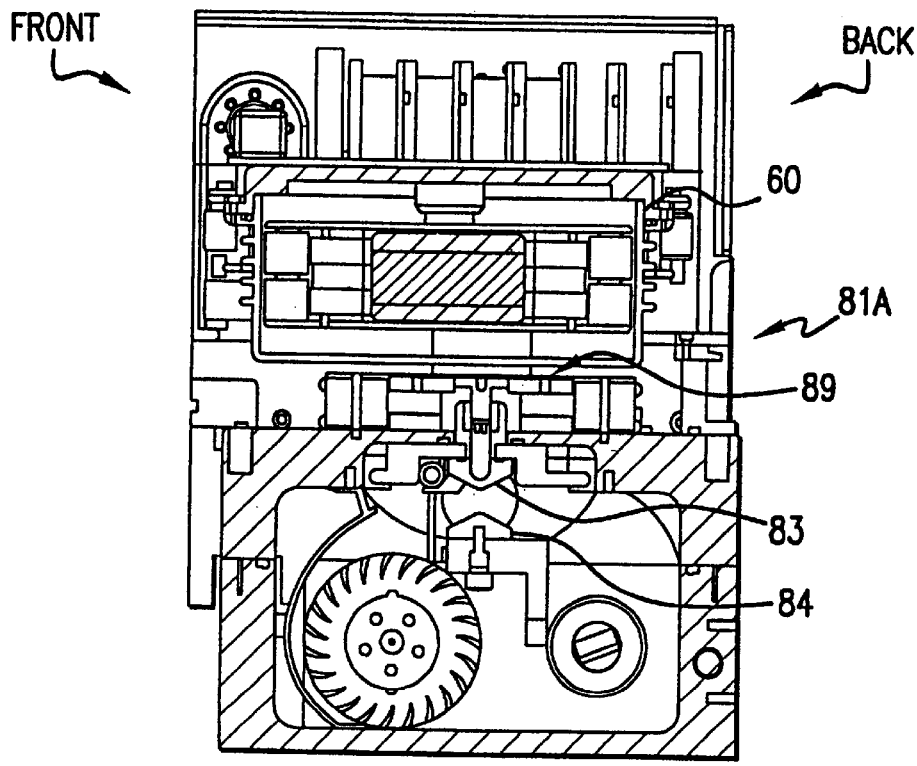
FIG.8H1
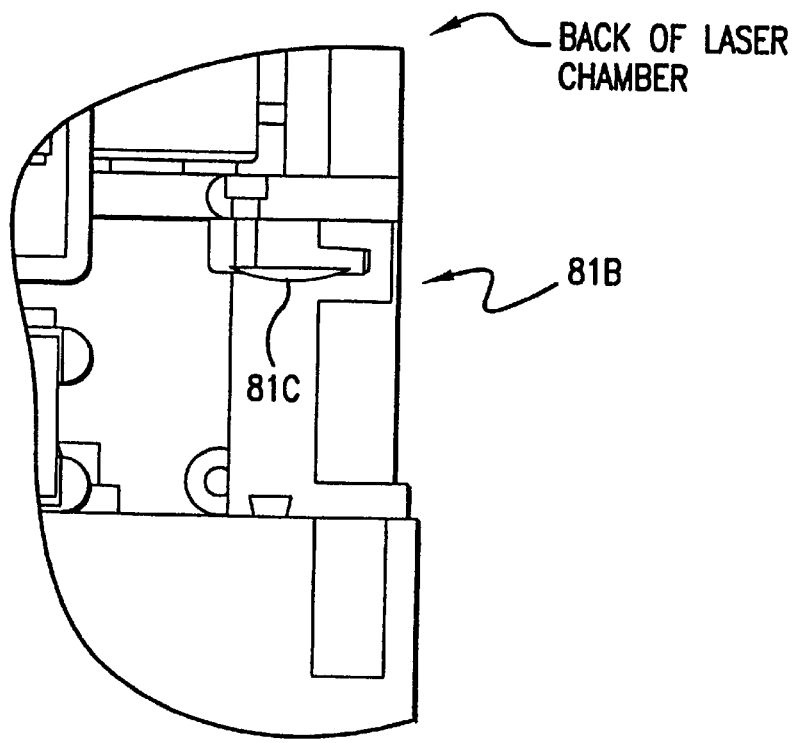
FIG.8H2

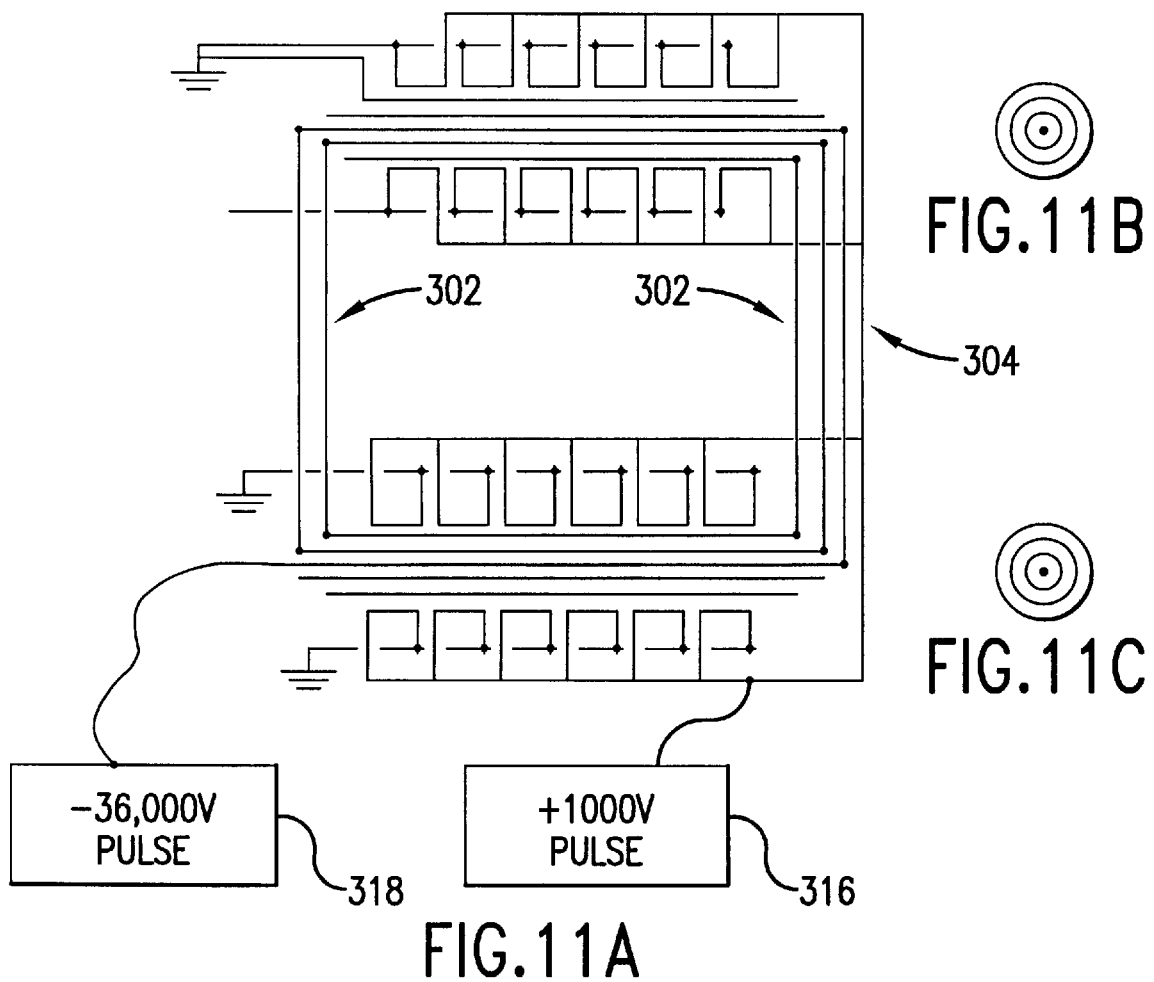
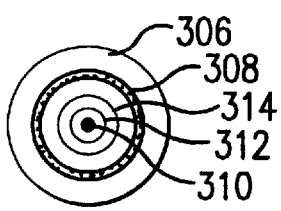
FIG.11A
FIG.11B
FIG.11C
FIG.11D

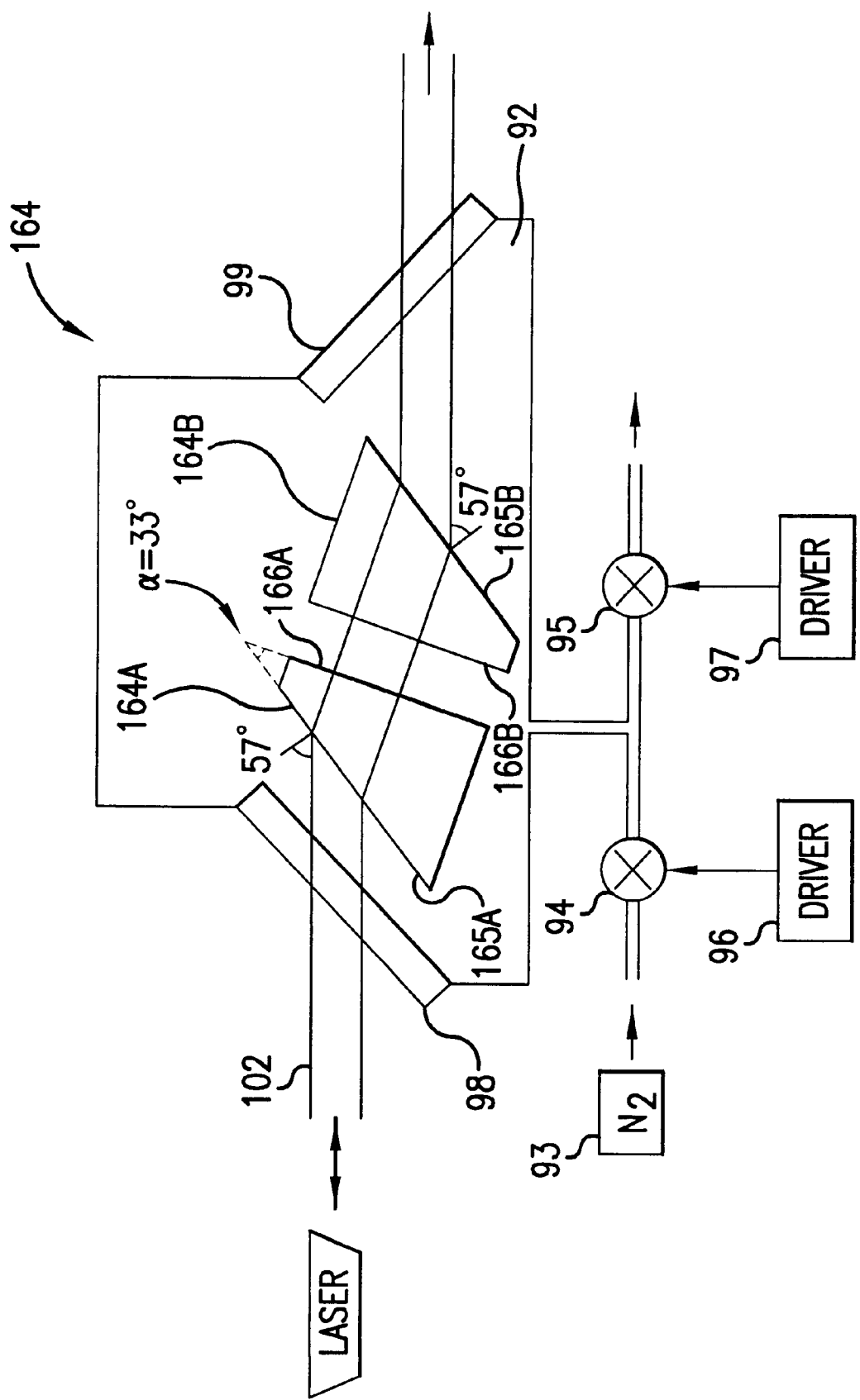

VERY NARROW BAND INJECTION SEEDED F$_2$ LITHOGRAPHY LASER

This Application is a Continuation-In-Part of Ser. No. 09/459,165 filed Dec. 10, 1999, "Injection Seeded F$_2$ Lithography Laser"; 09/438,249 filed Nov. 12, 1999, "F$_2$ Laser with Visible and IR Control"; Ser. No. 09/421,701, filed Oct. 20, 1999, "Single Chamber Gas Discharge Laser with Line Narrowed Seed Beam" and Ser. No. 09/407,120 now U.S. Pat. No. 6,240,110, filed Sep. 27, 1999, "Line Narrowed Laser with Etalon Output Coupler." This invention relates to lasers and in particular to injection seeded lasers used for integrated circuit lithography.

BACKGROUND OF THE INVENTION

Prior Art Lithography Lasers

KrF excimer lasers are the state of the art light source for integrated circuit lithography. One such laser is described in U.S. Pat. No. 4,959,840 issued Sep. 25, 1990. The lasers operate at wavelengths of about 248 nm. With the KrF laser integrated circuits with dimensions as small as 180 nm can be produced. Finer dimensions can be provided with ArF lasers which operate at about 193 nm or F$_2$ lasers which operate at about 157 nm.

These lasers, the KrF laser, the ArF laser and the F$_2$ lasers, are very similar, in fact the same basic equipment used to make a KrF laser can be used to produce an ArF laser or an F$_2$ laser merely by changing the gas concentration and modifying the controls and instrumentation to accommodate the slightly different wavelength.

Control of lithography lasers and other lithography equipment require laser pulse energy monitors sensitive to the UV light produced by these lasers. The standard prior art detectors used for monitoring pulse energy in state of the art integrated circuit lithography equipment are silicon photo diodes.

A typical prior-art KrF excimer laser used in the production of integrated circuits is depicted in FIG. 1 and FIG. 2. A cross section of the laser chamber of this prior art laser is shown in FIG. 3. As shown in FIG. 2A, pulse power system 2 powered by high voltage power supply 3 provides electrical pulses to electrodes 6 located in a discharge chamber 8. Typical state-of-the art lithography lasers are operated at a pulse rate of about 1000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 inches per second. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18 (sometimes referred to as a line narrowing package or LNP). Commercial excimer laser systems are typically comprised of several modules that may be replaced quickly without disturbing the rest of the system. Principal modules include:

Laser Chamber Module,
Pulse Power System with: high voltage power supply module,
commutator module and high voltage compression head module,
Output Coupler Module,
Line Narrowing Module,
Wavemeter Module,
Computer Control Module,
Gas Control Module,
Cooling Water Module Electrodes 6 consist of cathode 6A and anode 6B. Anode 6B is supported in this prior art embodiment by anode support bar 44 which is shown in cross section in FIG. 3. Flow is counter-clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the current return plate does not substantially affect the gas flow. A peaking capacitor comprised of an array of individual capacitors 19 is charged prior to each pulse by pulse power system 2. During the voltage buildup on the peaking capacitor, two preionizers 56 weakly ionize the lasing gas between electrodes 6A and 6B and as the charge on capacitors 19 reach about 16,000 volts, a discharge across the electrode is generated producing the excimer laser pulse. Following each pulse, the gas flow between the electrodes of about 1 inch per millisecond, created by blower 10, is sufficient to provide fresh laser gas between the electrodes in time for the next pulse occurring one millisecond later.

In a typical lithography excimer laser, a feedback control system measures the output laser energy of each pulse, determines the degree of deviation from a desired pulse energy, and then sends a signal to a controller to adjust the power supply voltage so that energy of the subsequent pulse is close to the desired energy.

These excimer lasers are typically required to operate continuously 24 hours per day, 7 days per week for several months, with only short outages for scheduled maintenance. One problem experienced with these prior-art lasers has been excessive wear and occasional failure of blower bearings. A need exists in the integrated circuit industry for a modular, reliable, production line quality F$_2$ laser in order to permit integrated circuit resolution not available with KrF and ArF lasers.

Injection Seeding

A well-known technique for reducing the band-width of gas discharge laser systems (including excimer laser systems) involves the injection of a narrow band "seed" beam into a gain medium. In one such system, a laser producing the seed beam called a "master oscillator" is designed to provide a very narrow band beam and that beam is used as a seed beam in the second laser. If the second laser functions as a power amplifier, the system is referred to as a master oscillator, power amplifier (MOPA) system. If the second laser itself has a resonance cavity, the system is referred to as an injection seeded oscillator (ISO) and the seed laser is called the master oscillator and the downstream laser is called the power oscillator. These techniques reduced the heat load on the line narrowing optics.

Laser systems comprised of two separate lasers tend to be substantially more expensive, larger and more complicated than comparable single laser systems. Therefore, commercial applications of two laser systems has been limited. In most examples of prior art MOPA and ISO systems two separate laser chambers are utilized. However, systems have been proposed for using a single laser chamber to contain two sets of electrodes. For example, FIG. 3A shows a side-by-side arrangement described by Letardi in U.S. Pat. No. 5,070,513. Another arrangement shown in FIG. 3B described by Long in U.S. Pat. No. 4,534,035 in which the elongated electrode sets are positioned on opposite sides of the chamber. Gas flows from a common "in" plentum separately between the two sets of electrodes into a common "out" plenum. An arrangement proposed by McKee in U.S. Pat. No. 4,417,342 is shown in FIG. 3C. This system has two elongated electrode sets mounted parallel to each other on one half of the chamber. A tangential fan and heat exchanger is located in the other half. Gas flows in parallel through between the two sets of electrodes. The system shown in FIG. 3A has not been considered suitable for high pulse rate laser because debris from the upstream discharge interferes with the downstream discharge. According to an article published in Applied Physics B Lasers and Optics 1998, this laser is operated at a pulse repetition rate of about 100 pulses per second. The authors indicate that an attempt to operate at 1000 Hz would lead to turbulent flow which is not desirable for generation of a high quality beam. The system shown in FIG. 3C has not been considered suitable for high pulse rate lasers because splitting of the flow reduces the velocity of the gas between the electrodes by about 50% as compared to a single set of electrodes on the system shown in FIG. 3A. The system shown in FIG. 3B has not been considered satisfactory for high pulse rate lasers because the blower circulation is axial rather than tangential as shown in FIG. 3.

$F_2$ Lasers Bandwidth

A typical KrF laser has a natural bandwidth of about 400 pm (FWHM) centered at about 248 nm and for lithography use it is line narrowed to about 0.6 pm. ArF lasers have a natural bandwidth of about 40 pm centered at about 193 nm and is typically line narrowed to about 0.5 pm. These lasers can be relatively easy tuned over a larger portion of their natural bandwidth using the line narrowing module 18 shown in FIG. 2. $F_2$ lasers typically produce laser beams at two narrow lines centered at about 157.63 and 157.52. Often, the less intense of these two lines is suppressed and the laser is forced to operate at the 157.63 line. The natural bandwidth of the 157.63 line is about 1.0 to 1.6 pm. A problem with the $F_2$ laser and this line for lithography purposes is that the line is not narrow enough to satisfy focusing requirements and it is too narrow to provide desired tuning flexibility.

What is needed is an improved narrow band $F_2$ laser system.

SUMMARY OF THE INVENTION

The present invention provides a tunable injection seeded very narrow band $F_2$ lithography laser. The laser combines modular design features of prior art long life reliable lithography lasers with special techniques to produce a seed beam operated in a first gain medium which beam is used to stimulate narrow band lasing in a second gain medium to produce a very narrow band laser beam useful for integrated circuit lithography. In a preferred embodiment, two tunable etalon output couplers are used to narrow band an $F_2$ laser and the output of the seed laser is amplified in an $F_2$ amplifier.

BRIEF DESCRIPTION OF THE DRAWINGS

FIGS. 5A through 5M show single chamber injection seeded F2 laser embodiments.

FIG. 7A is a drawing showing features of a preferred preionizer tube.

FIG. 7B is a drawing showing a blower drive unit including magnetic bearings.

FIG. 8D is a prospective assembly drawing of a pulse transformer used in the above preferred embodiment.

FIGS. 8F1, 8F2 and 8F3 are time line charts showing pulse compression using the above preferred embodiment.

FIGS. 8G1 and 8G2 are drawing showing two views of a saturable inductor.

FIGS. 8H1 and 8H2 shows the mounting of a compression head in a preferred embodiment.

FIGS. 11A, 11B, 11C and 11D show features of a preferred pulse transformer for producing high voltage pulses.

FIG. 22C shows detailed view of etalon output coupler.

DETAILED DESCRIPTION OF PREFERRED EMBODIMENTS

FIRST PREFERRED EMBODIMENT

A preferred embodiment of the present invention can be described by reference to the drawings.

MODULAR LASER DESIGN

Figure 4:
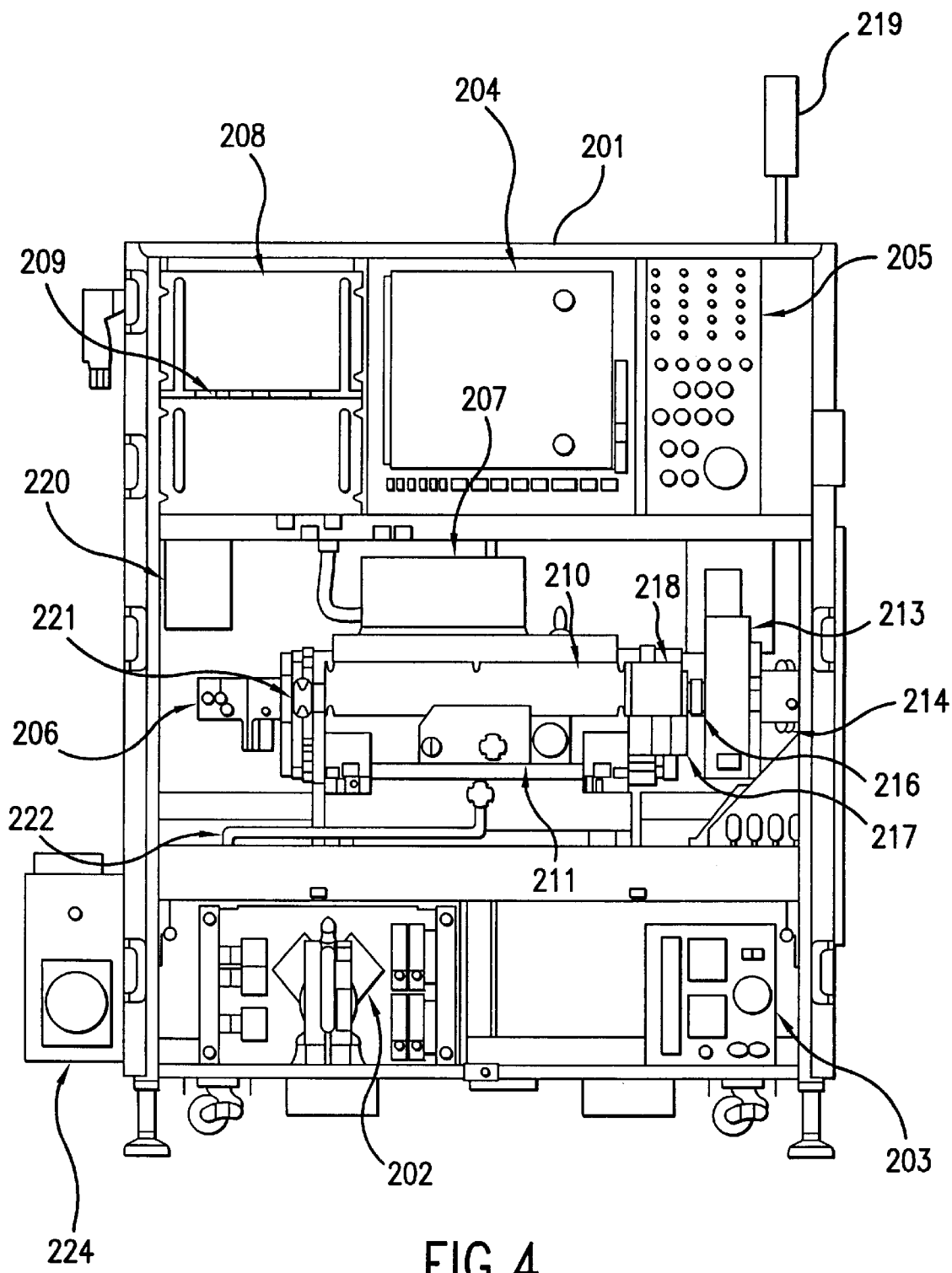
FIG. 4 is a drawing of a preferred embodiment of the present invention.

A front view of a preferred embodiment of the present invention is shown in FIG. 4 respectively. This drawing emphasizes the modular nature of their particular invention which is similar to prior art KrF lasers fabricated by Applicants employer and allows very quick replacement of modules for repair, replacement and maintenance of this $F_2$ laser system. The principal features of this embodiment are listed below corresponding to the reference numbers shown on FIG. 4.

201 Laser enclosure
202 Gas module
203 Cooling water supply module
204 AC/DC distribution module
205 Control module
206 Line narrowing module
207 Compression head
208 High voltage pulse power supply module
209 Commutator module for pulse power supply
210 Metal fluoride trap
211 Laser chamber
213 Wavemeter module
214 Automatic shutter
216 Output coupler
217 Blower motor
218 Metal fluoride trap power supply
219 Status lamp
220 24 volt power supply
221 Chamber window
222 Gas control flexible connection
224 Vent box

Preferred Embodiment

Figure 1:
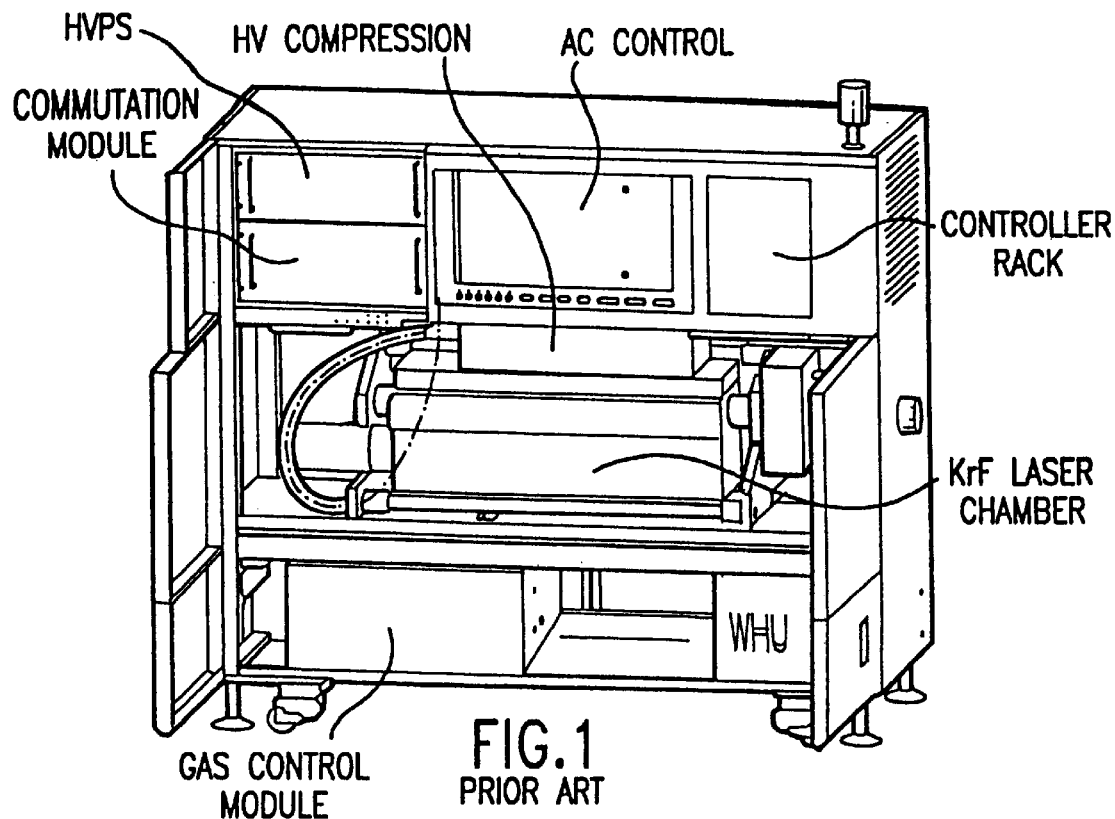
FIG. 1 is a drawing of a prior art commercial excimer lithography laser.
Figure 2:
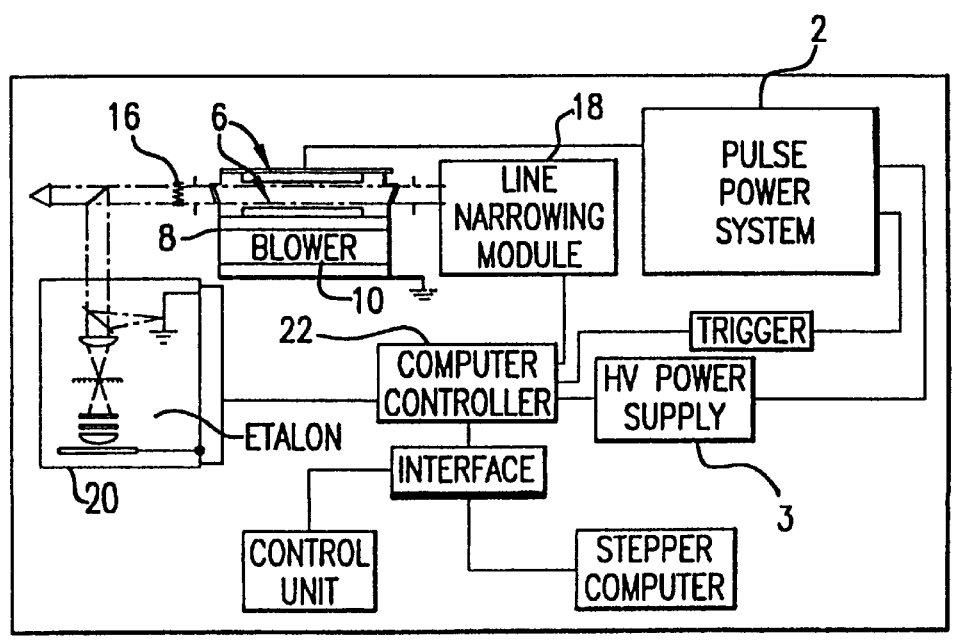
FIG. 2 is a block diagram showing some of the principal elements of a prior art commercial excimer lasers used for integrated circuit lithography.
Figure 3:
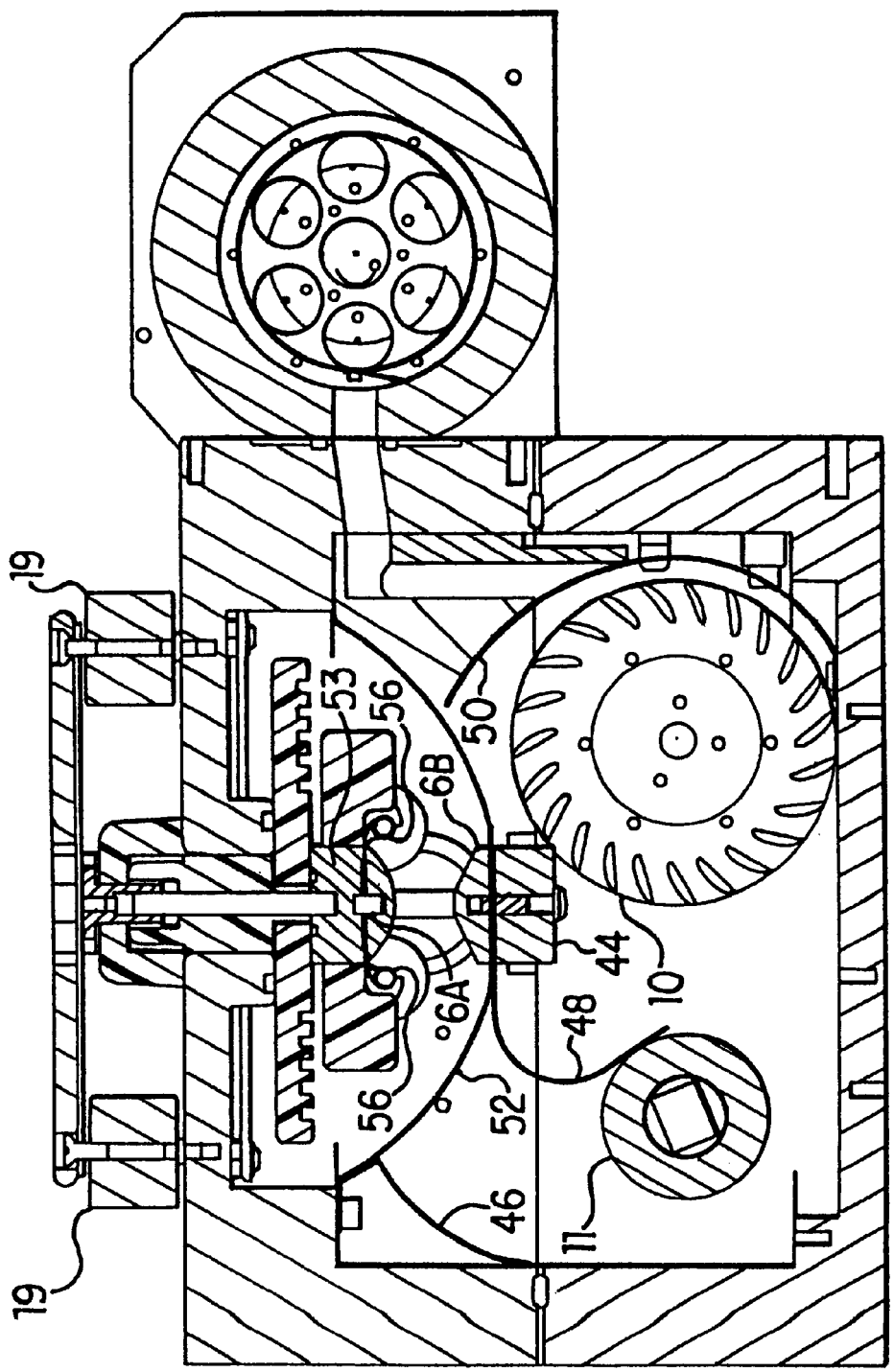
FIG. 3 is a drawing of the laser chamber of the FIG. 2 laser.
Figure 3A:
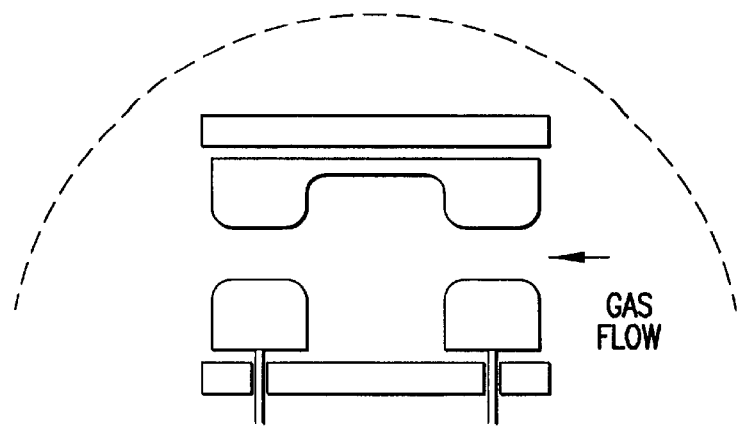
FIGS. 3A, 3B and 3C show prior art single chamber injection seeded lasers.
Figure 3B:
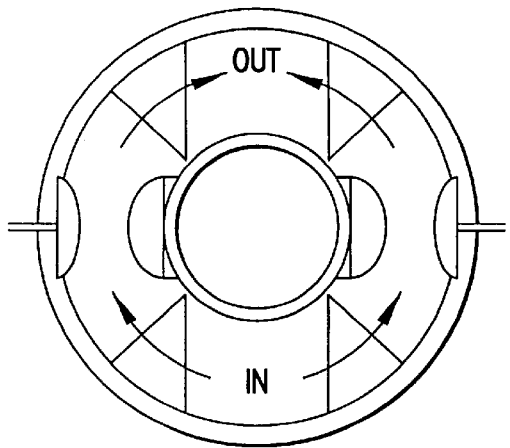
Figure 3C:
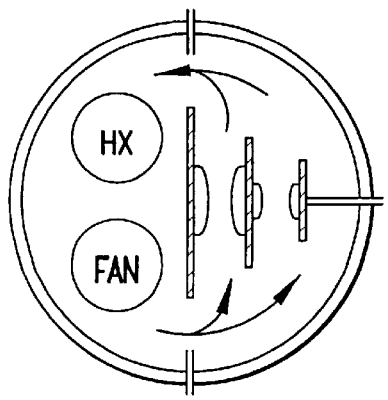

The preferred embodiment shown in FIG. 4 is an improved version of the laser described in FIGS. 1, 2 and 3. This preferred embodiment includes the following improvements not provided in the prior art excimer lasers:

1) The electrodes are segmented into a master section and a slave section as shown in FIG. 5 and,
2) The solid-state pulse power system has been modified to accommodate the segmented electrodes, to drive both segments separately, to produce faster rise time, providing more consistent pulses, and improved laser efficiency at higher voltages.

In addition, the following embodiment includes the following improvements which are not directly related to the master slave configuration:

1) More precise control of the charging voltage of the pulse power system;

2) A computer controller programmed with a new algorithm providing a much improved control of pulse energy and burst energy; and
3) A single tube larger preionizer replaces the prior-art combination of a two-tube preionizer to provide improved efficiency, better preionization and improved laser gas flow between the electrodes.

In Line Gain Media

Figure 5G:
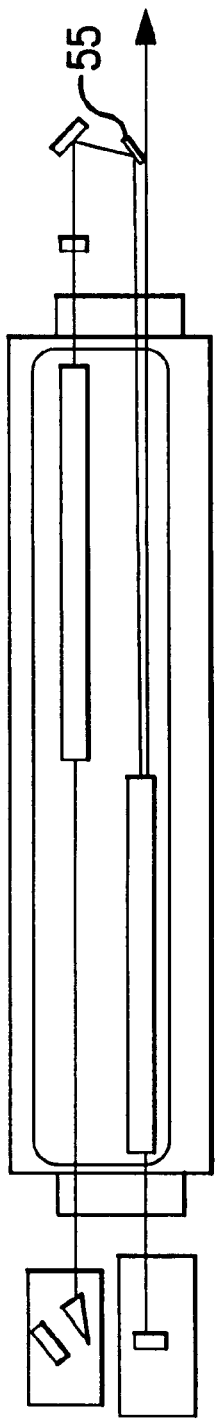
Figure 6:
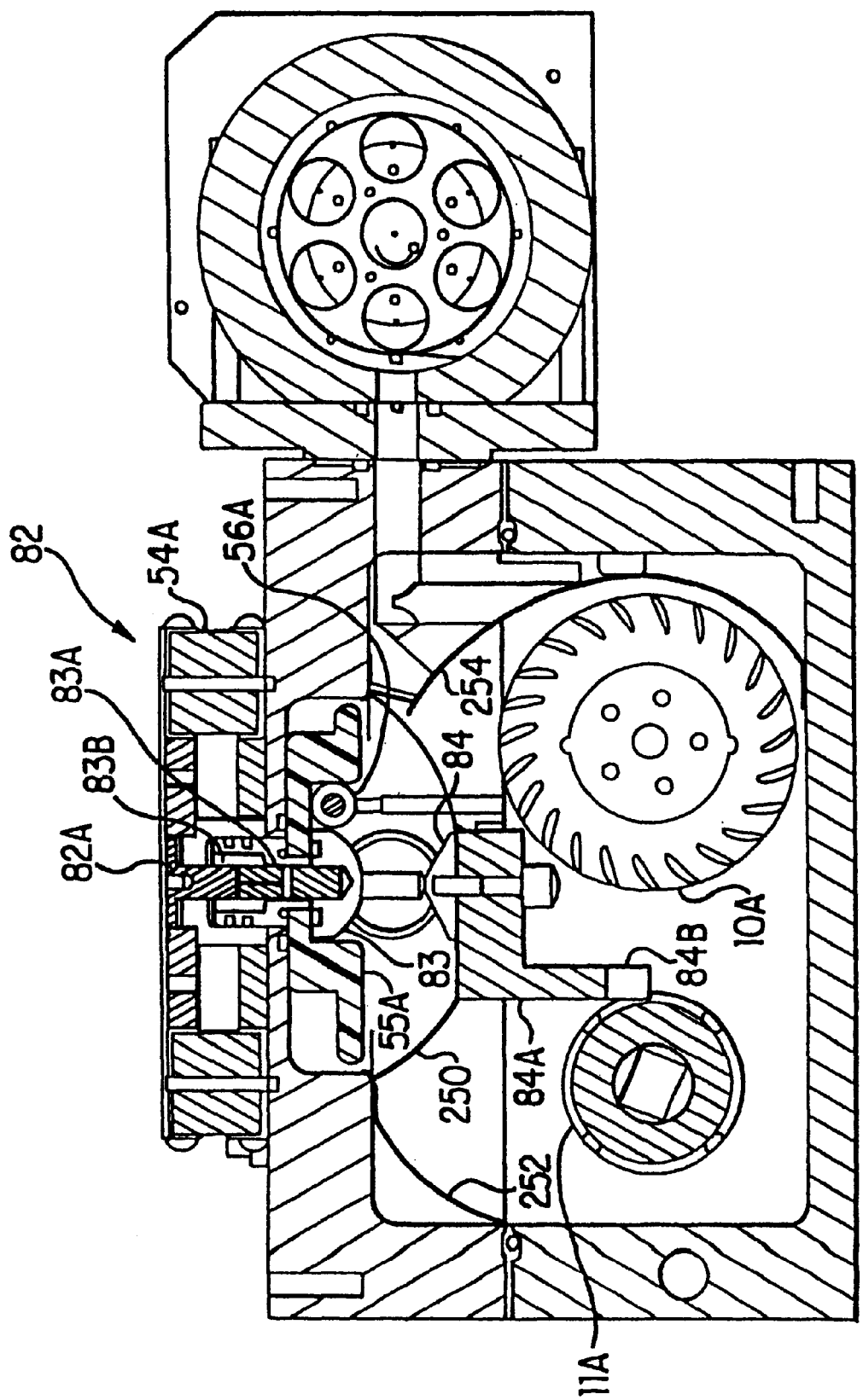
FIG. 6 is a cross section of a laser chamber showing features of the present invention.
Figure 6A:
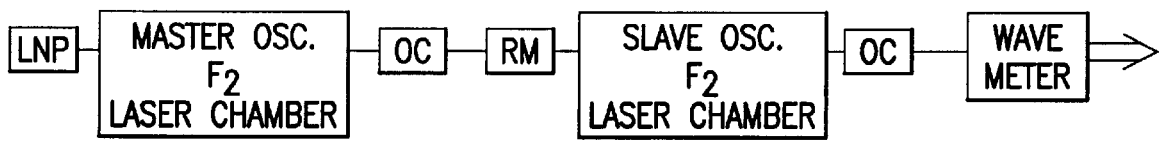
FIGS. 6A through 6J show various embodiments utilizing gain media in separate chambers.

Drawings of a first preferred embodiment of the present invention is shown in FIGS. 6A and 5B. In this case, the cathode 6A of the prior art laser shown in FIG. 3 is separated into a short cathode 18A and a long cathode 18B as shown in FIG. 5B. Short cathode 18A is positioned about 17 mm above anode 20 and fed by five brass feed throughs from the high voltage bus as shown in FIG. 1 whereas long cathode 18B is located in the prior art position of approximately 20 mm above anode 20 and is fed by ten brass feed throughs from the same high voltage bus. The result is that the discharge between short cathode 18A and anode 20 begins approximately 10 ns prior to the discharge between long cathode 18B and anode 20. Thus, laser light produced by short cathode 18A and anode 20 at the beginning of the discharge has time for up to two trips through line narrowing package 15 before the discharge begins between long electrode 18B and anode 20. The result is an increase in the pulse duration and a decrease in the line width of the beam.

Alternatives to the embodiment shown in FIGS. 5A and 5B is to provide the same spacing between the two cathodes and the anode but to provide for the earlier discharge electronically such as by adding additional inductance to the circuit comprising electrode 18B. In these alternatives, anode 20 could be separated into anodes 20A and 20B corresponding to 18A and 18B. Inductance could be added between the anode and ground. A more complicated approach would be to separate high voltage bus 23 so that a separate peaking capacitor bank is provided for each of the cathodes.

Other Single Chamber Embodiment

Side By Side Gain Media

Another single chamber embodiment which will fit in the laser cabinet shown in FIG. 4 is shown in FIGS. 5C, D, E and F.

This embodiment is similar to that shown in FIGS. 5A and 5B in which the gain media are offset from each other. Cathode 50A and anode 20 define a gain media of the seed portion of the laser system. The resonance cavity of the seed portion is defined by LNP 15 and output coupler 52 which may be a partially reflecting mirror with a reflectivity of about 20 percent. In this embodiment, the seed beam reflects off totally reflecting mirrors 54 and 56 and is amplified in the amplifier portion of the laser system in a gain medium created by cathode 50B and anode 20.

Figure 5H:
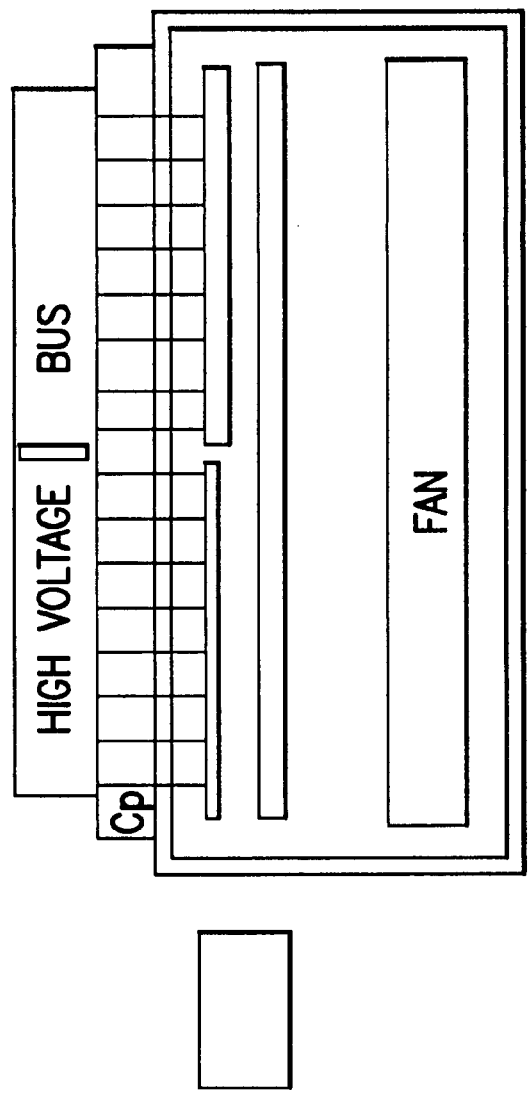

In the embodiment shown in FIGS. 5G and 5H an additional totally reflecting mirror 55 and a shifting of the electrodes permits two passes through the amplifying gain medium. In both embodiments, the electrodes or the electrical circuits are arranged to give the seed portion a head start of a few nanoseconds. FIG. 5E shows how the cathodes and the anode of the FIG. 1 laser can be modified for these two embodiments. FIG. 5F shows an alternative to the 5C arrangement, but in this case the beam exits the laser in a direction opposite the other embodiments.

Side By Side Gain Media

Figure 5I:
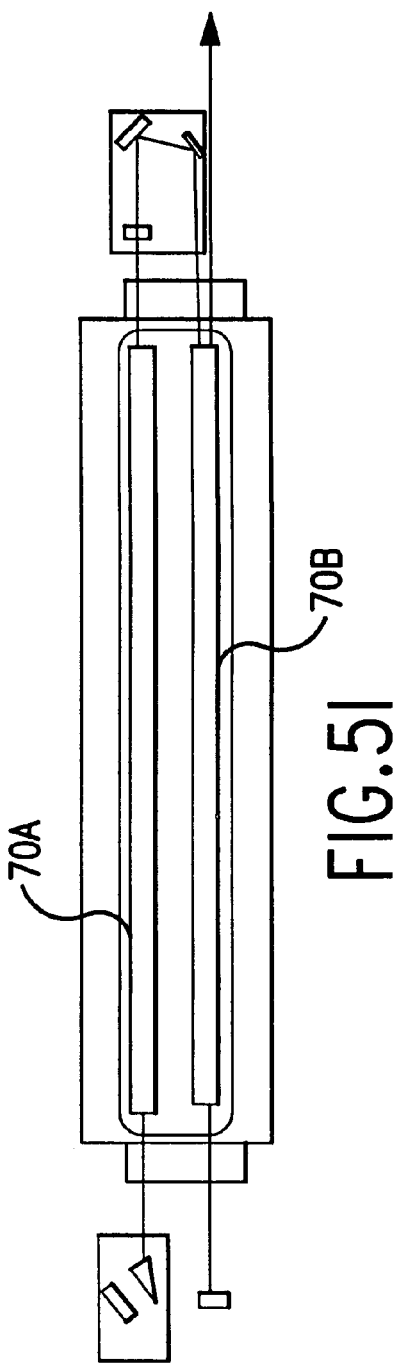
Figure 5J:
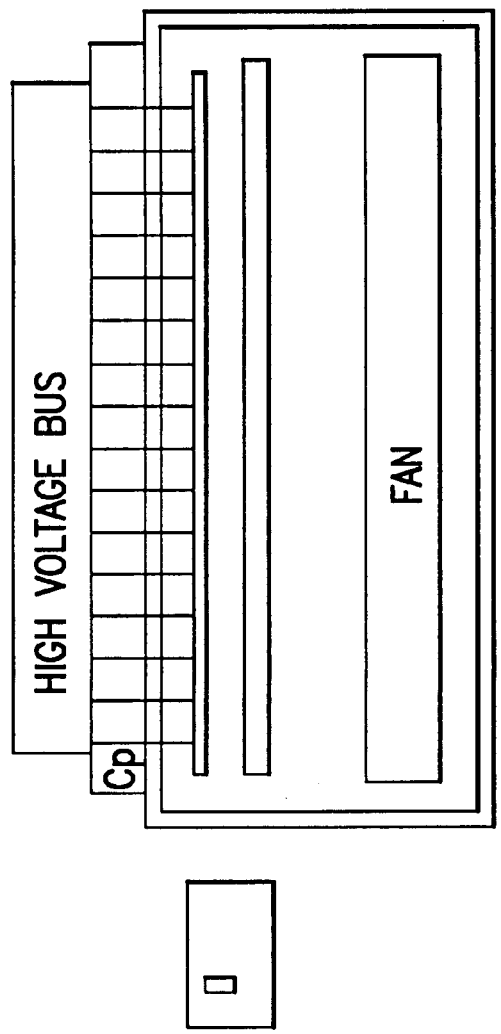
Figure 5K:
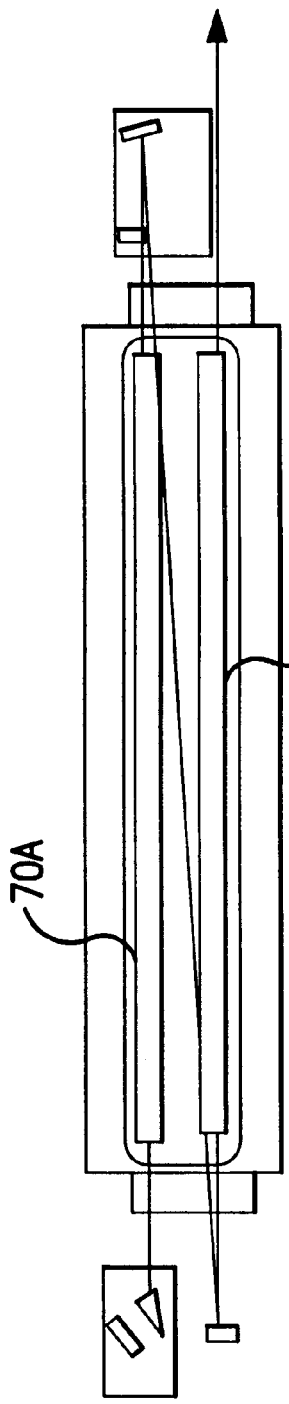
Figure 5L:
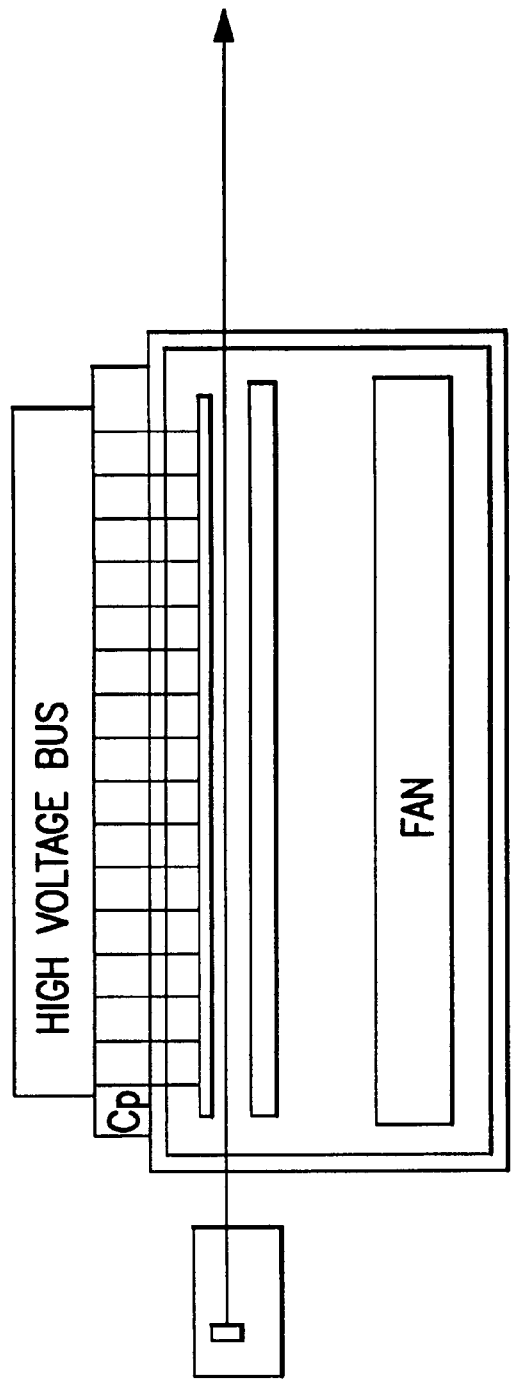

FIGS. 5I and 5J and FIGS. 5K and 5L show embodiments where the two gain media are side by side. FIGS. 5I and 5J embodiment provides for two passes through portions of the amplifier gain media. As stated in the Background section of this specification, debris from the upstream discharge could interfere with the downstream discharge. This problem is dealt with in this embodiment by providing very stable laser gas flow through between the electrodes and by providing a flow rate fast enough that debris from the upstream discharge passes the downstream gain region before the next pulse. Another alternative is to adjust the gas flow rate so that the debris from the upstream discharge is located about ⅔ the distance between the electrodes at the time of the subsequent pulse. For example, if the laser is operating at a pulse rate of 2,000 Hz and the distance between the upstream and downstream electrode is 6 cm, the speed of the gas between the electrodes could be about 8,000 cm/sec so as to center the debris from the upstream discharge is about 2 cm upstream of the downstream electrodes during the first subsequent pulse and 2 cm downstream of the downstream electrodes during the second subsequent pulse.

In the FIGS. 5I and 5J and 5K and 5L embodiments, pulse power is preferably provided with just minor modifications to the prior art pulse power system of the prior art laser shown in FIGS. 1 and 2A and 2B. In a preferred embodiment, the portion of the peaking capacitor bank on one side of the laser chamber feeds cathode 70A and the capacitor on the other side feeds cathode 70B. In this embodiment the total number of capacitors is preferably increased from 28 to 40 (20 on each side). Cathode 70A is slightly closer to anode 20 than cathode 70B to give the seed a head start.

Slanted Seed Beam

Another embodiment of the present invention is shown in FIG. 5M. In this embodiment, the resonance cavity of a seed portion of the laser system is formed by prior art LNP 15 and prior art output coupler 52A which in this case is a 50% reflectivity mirror. As shown in FIG. 5M the seed cavity slants completely across the gain medium formed between the electrodes. During a typical pulse of a KrF excimer laser the beam would make about 5 trips through the seed gain medium. On each trip the light is both amplified and line narrowed in the seed cavity. On each trip about 50% of the light passes through output coupler 52A, and is reflected by mirrors 80A and 80B and is further amplified in the gain medium between mirrors 80B and 80C. For this embodiment the pulse power system for the laser preferably is arranged to produce a pulse shape similar to that shown in FIG. 10C. This would provide a first pulse primarily for the seed beam and a second overlapping larger pulse for the amplified beam.

Excellent Line Narrowing With Slanted Beam

Figure 10B:
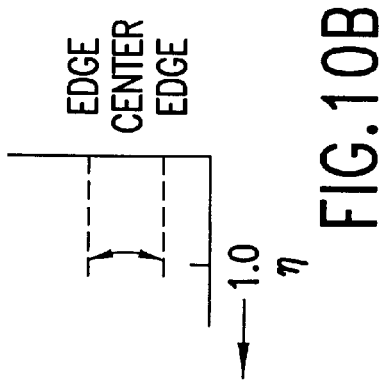
FIGS. 10A, 10B and 10C shows features of a cross-electrode seed beam technique.

The slanting of the seed beam across the gain medium between the electrodes eliminates a significant problem with prior art systems such as that described in FIGS. 2A and 2B. This problem results from the fact that the index of refraction, n, (which is a measure of the phase velocity of the beam) near the edges of the gain medium is significantly higher than at the center of the gain medium. This means that the phase of light at both sides of the beam as it traverses the gain medium travels slower than the phase of the light in the center of the beam. This produces a distortion of the wave front entering the LNP. This distortion in turn limits the ability of the LNP 15 to produce very narrow band linewidths. This distortion can be somewhat compensated for by slightly bending the grating but Applicants have determined that much of the distortion in the gain medium is time dependent at nanosecond time intervals. The grating cannot respond to changes this quickly. By directing the beam slant-wise across the gain medium all portions of the beam see the same variations in index of refraction. FIG. 10B shows qualitatively how n varies across the gain medium in the horizontal direction. (The gain medium is, in a typical lithography excimer laser, about 5 mm wide in the horizontal direction and is about 18 mm high in the vertical direction. The index of refraction, in the vertical direction, is relatively flat over most of gain medium.)

Figure 10A:
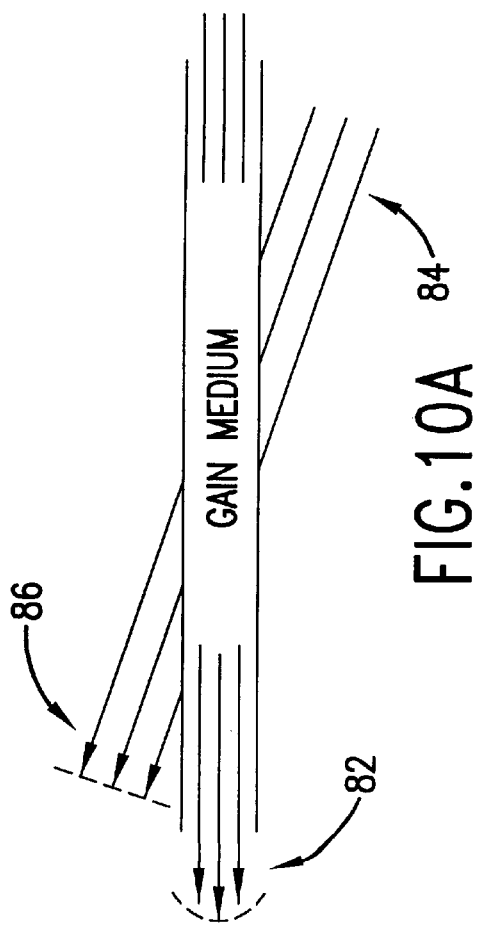
Figure 10C:
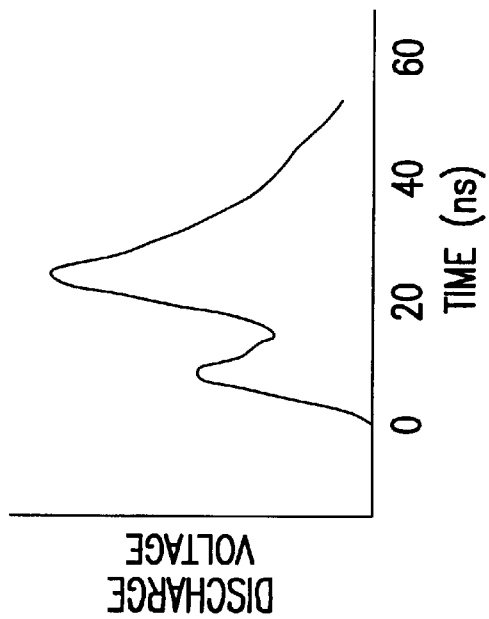

In FIG. 10A, three beams of light are shown passing through the gain medium along the axis of the gain medium, one in the center of the gain medium and the other two at the horizontal edges. As indicated at 82 the wave-front is distorted because the beams at the edges travel slower than the one at the center. However, when three similar beams pass slantedly across the gain medium as shown at 84, they each encounter the same variation in index of refraction, thus they emerge on the other side "neck and neck" as shown at 86. A flatter wave-front permits the LNP to more effectively line narrow the beam.

Separate Chambers

The present invention can be practiced with separate laser chambers. In this case, one chamber houses the gain media for the master oscillator and a separate chamber houses the gain media for the slave oscillator or the power amplifier.

An ISO arrangement is shown in FIG. 6A using a line narrowed $F_2$ gas discharge lasers as a master oscillator to drive an $F_2$ gas discharge slave oscillator. The pulse power source for the gas discharges can be completely separate units or portions of the power supplier can be common to both lasers. The discharge for the master oscillator should preferably precede the slave oscillator by a few nanoseconds.

Figure 20:
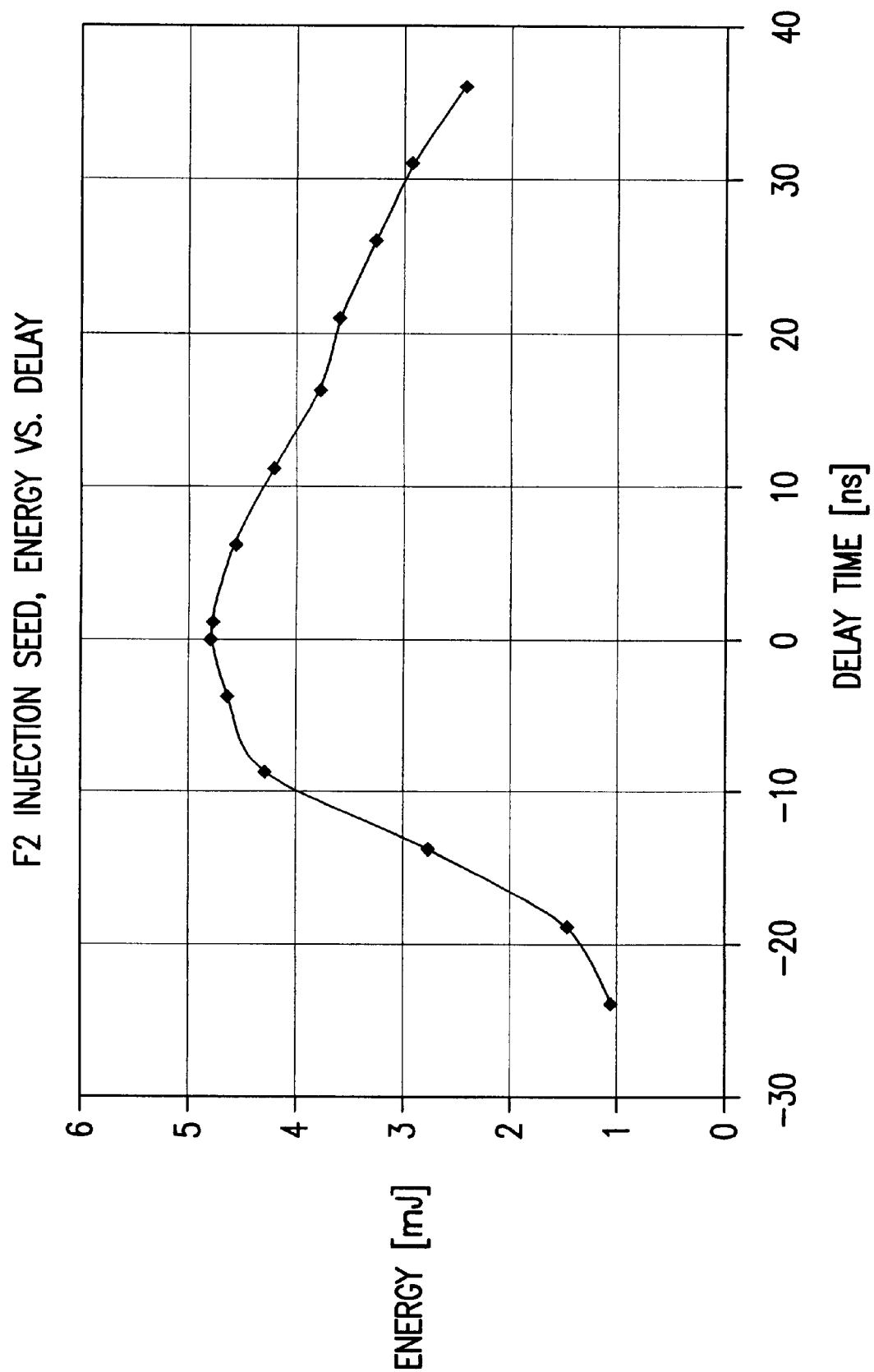
FIG. 20 is a graph showing output pulse energy versus change in delay time between discharges.

In prototype units built and tests by Applicants completely separate pulse power supplies were provided with both power supplier controlled by a master control unit. In a preferred embodiment, however, both the master and the slave is supplied by a common power supply and commutator with each laser having its own compression head. It is important that the discharge into both gain media is properly tuned. FIG. 20 shows the effects of changes in delay times. The zero delay time represents the delay time for producing maximum output in these tests. This time is a few nanoseconds but Applicants were not able to precisely determine what that time was.

Figure 6B:
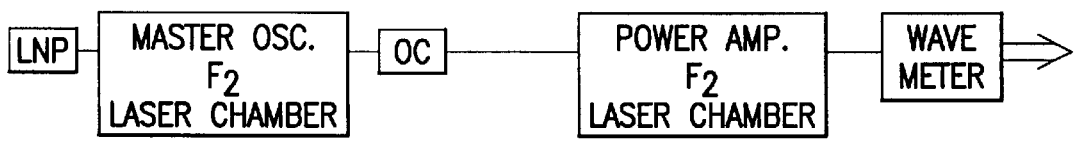

A MOPA system is shown in FIG. 6B. This system is similar to the 6A system except for the optics. In addition to the features shown in the drawing, normally some injection optics are provided between the master oscillator and the power amplifier. In some MOPA embodiments, more than one optical path through the chamber is provided using techniques well known in the art.

Figure 6C:
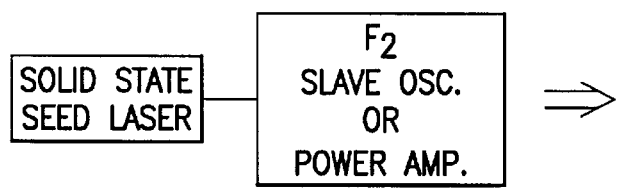

FIG. 6C shows an embodiment in which an $F_2$ gas discharge slave oscillator or power amplifier is seeded by a narrow band seed laser other than an $F_2$ laser. This laser could be a dye laser tuned to a portion of the 157.6 nm $F_2$ "line". Alternately, the seed laser could utilize an OPO device to produce a narrow band output within the $F_2$ 157.6 nm "line".

Figure 6D:
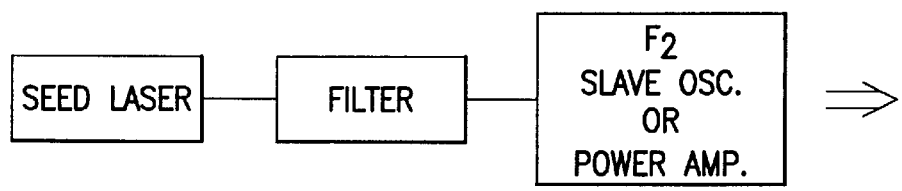

In FIG. 6D the output of the seed laser is filtered with an optical filter passing only a very narrow line within the $F_2$ 157.6 nm natural line.

NARROW BANDING WITH ETALON OUTPUT COUPLERS

The Etalon Output Coupler

Figure 22A:
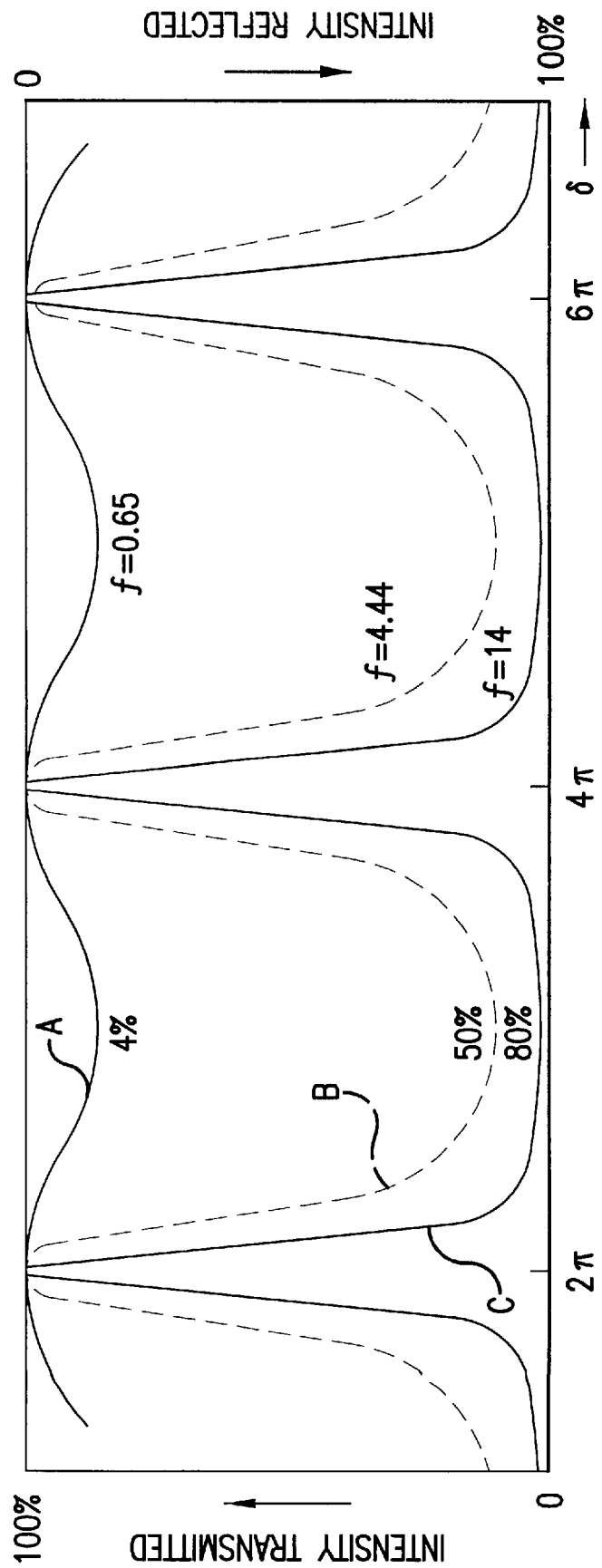
FIG. 22A shows relative transmission for prior art etalons.
Figure 22B:
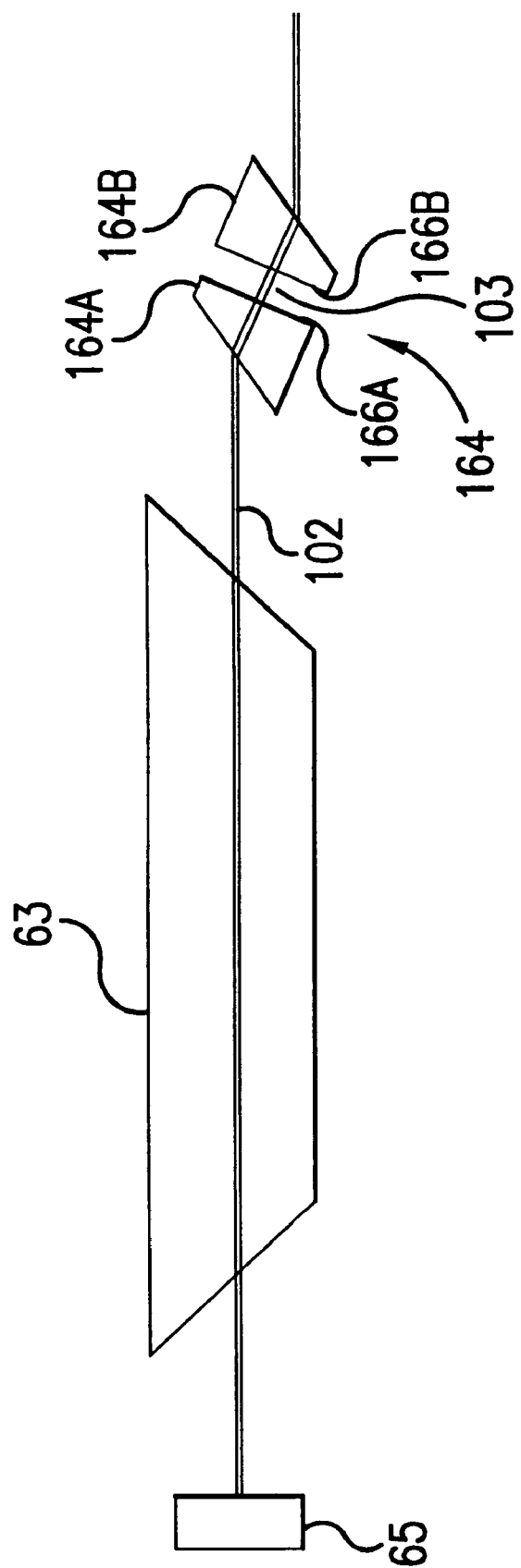
FIG. 22B shows $F_2$ laser with etalon output coupler.

A technique for narrow banding an $F_2$ laser using an etalon output coupler is explained by reference to FIGS. 22A through 22E. The resonator of the laser comprises high reflecting mirror 65 and an Fabri-Perot etalon 164 as shown in FIG. 22B. The Fabri-Perot etalon consists of two prisms 164A and 164B made out of $CaF_2$. Two sides 166A and 166B of the prisms are made parallel to each with very high precision and separated by a gap. The apex angle of each prism is about 33°. The laser beam 102 enters the prism 164A and is refracted by this prism. The prism 164A is aligned in such a way, that the portion of the beam 102, which exits the prism 164A, exits it at exactly normal incidence angle to the prism surface. The rest of the incoming beam is reflected from the surface 164A straight back. Transmitted portion of the beam 102 is shown as a beam 103. On the entrance surface 166B of the second prism 164B, part of the beam 103 is again reflected straight back and the rest transmits through the prism 164B. Because the beam 103 is exactly perpendicular to both surfaces 166A and 166B, the reflected beam reflects straight back to the laser. Therefore, the Fabri-Perot etalon 164 serves as an output coupler for the laser 60. Both prisms are enclosed in a nitrogen atmosphere at a pressure slightly above 1.0 atmosphere as shown in FIG. 22C.

Referring now to FIG. 22C, the beam 102 enters the first prism 164A at an angle of about 57 degrees which is close to Brewster's angle. Therefore, for the beam 102 polarized in the plane of incidence, there will be no reflection from the first surface 165A of prism 164A. The apex angle of prism 164A is about 33 degrees. Therefore, because of refraction of the beam 102 on surface 165A, the propagation direction of beam 102 is changed, so it will cross the second surface 166A of prism 164A at an angle of 90 degrees. The position of the prism is finely aligned so that this angle is exactly 90 degrees. The beam 102 enters the second prism 164B at exactly the same 90 degree angle with surface 166B as surfaces 166A and 166B are parallel to each other. Beam 102 will have another refraction at the second surface 165B of prism 164B, so that the existing beam will make a Brewster's angle of about 57 degrees with the surface 165B. The apex angle of prism 164B is again about 33 degrees. None of the surfaces of prisms 164A and 164B has any coatings. Windows 98 and 99 are positioned at an angle close to Brewster's angle if no reflection is desired from them. Or if a window is used to sample a portion of the beam 102, the angle could be a little less than Brewster's angle. Therefore, the preferred embodiment has no coatings on any of its surfaces.

Each of the uncoated inside parallel surfaces of the prisms has a Fresnel reflectivity of about 4.7 percent for normal incident 157 nm light. These surfaces reflect a portion of beam 102 back to the laser.

More generally where the prism material has an index of refraction nm and the adjacent gas has an index of refraction na, the apex angle of the prism is such that $$\sin \alpha = \frac{1}{\sqrt{1 + (n_m)^2 (n_a)^2}}. \quad (1)$$

If the prism material is $CaF_2$ with $n_m$=1.56 and the surrounding gas is nitrogen at about one atmosphere with an $n_a$=1.0003, then =32.67 degrees.

Tunable Etalon Output Coupler As Line-Selecting and Line-Narrowing Device

In the preferred embodiment, the reflectivity from each surface of 166A and 166B is about 4.7% as determined by Fresnel reflection from uncoated $CaF_2$ material with a refractive index of $n_m \cong 1.56$. Because of interference of two beams reflected from surfaces 166A and 166B correspondingly, the total reflectivity has a close to sinusoidal dependence on the laser wavelength as described by equation:

$$R = \frac{4r\sin^2\left[\frac{2\pi}{\lambda_l} n_a d\right]}{(1-r)^2 + 4r\sin^2\left[\frac{2\pi}{\lambda_l} n_a d\right]} \quad (2)$$

where r is reflection from surfaces 166A and 166B equal to 0.047, $n_a$ is refractive index of nitrogen, d is the distance between surfaces 166A and 166B and $\lambda_l$ is the laser wavelength. This dependence is shown in FIG. 22D.

The maximum reflectivity is about 17% and the minimum reflectivity is about 0%. The distance between reflection peaks $\lambda_{FSR}$ usually referred to as a free spectral range of the etalon is determined by its gap d, refractive index of nitrogen $N_a$ and laser wavelength $\lambda_l$:

$$\lambda_{FSR} = \frac{\lambda_l^2}{2dn_a} \quad (3)$$

Figure 22D:
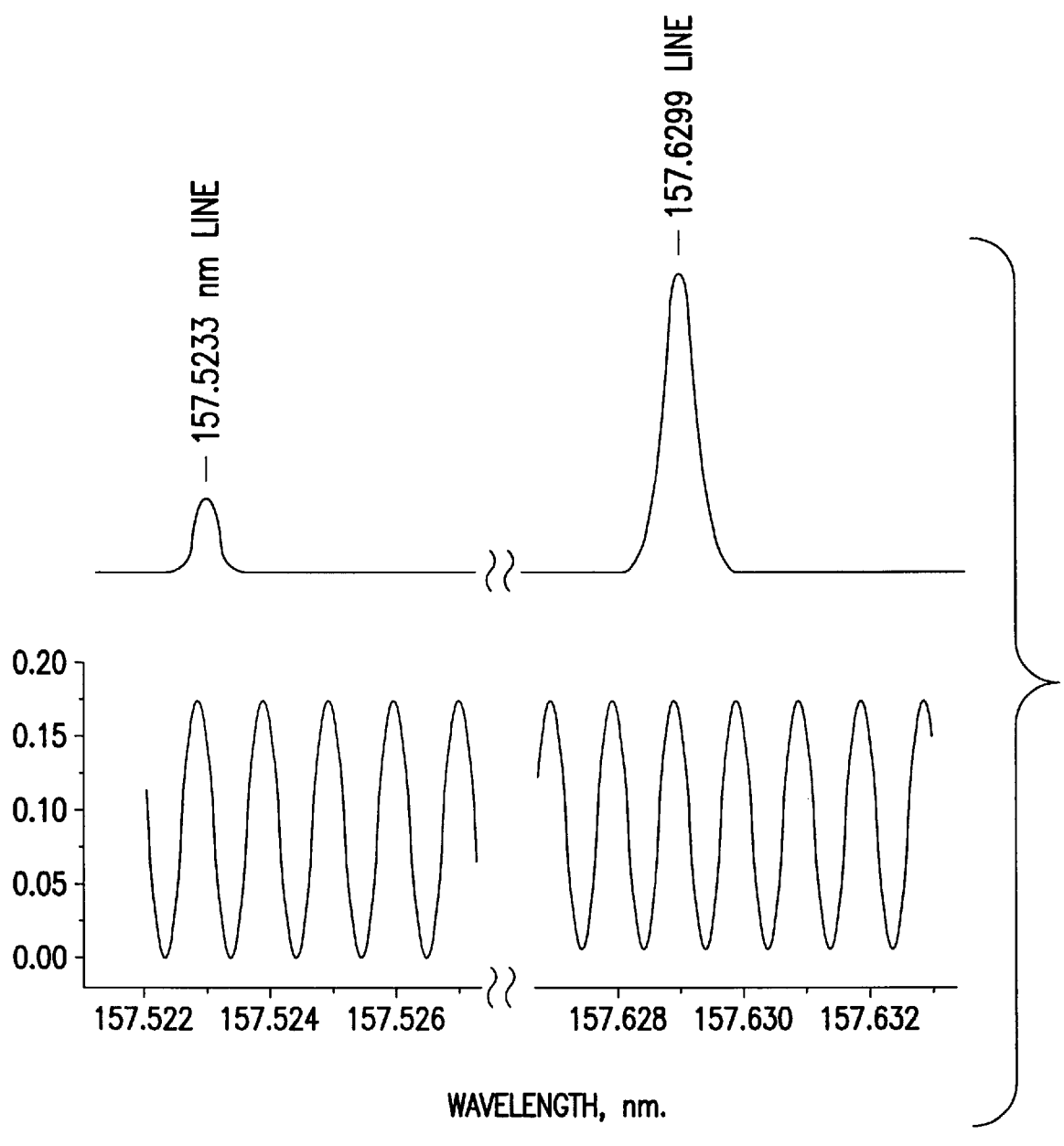
FIG. 22D illustrates spectral line selection with etalon output coupler.
Figure 22E:
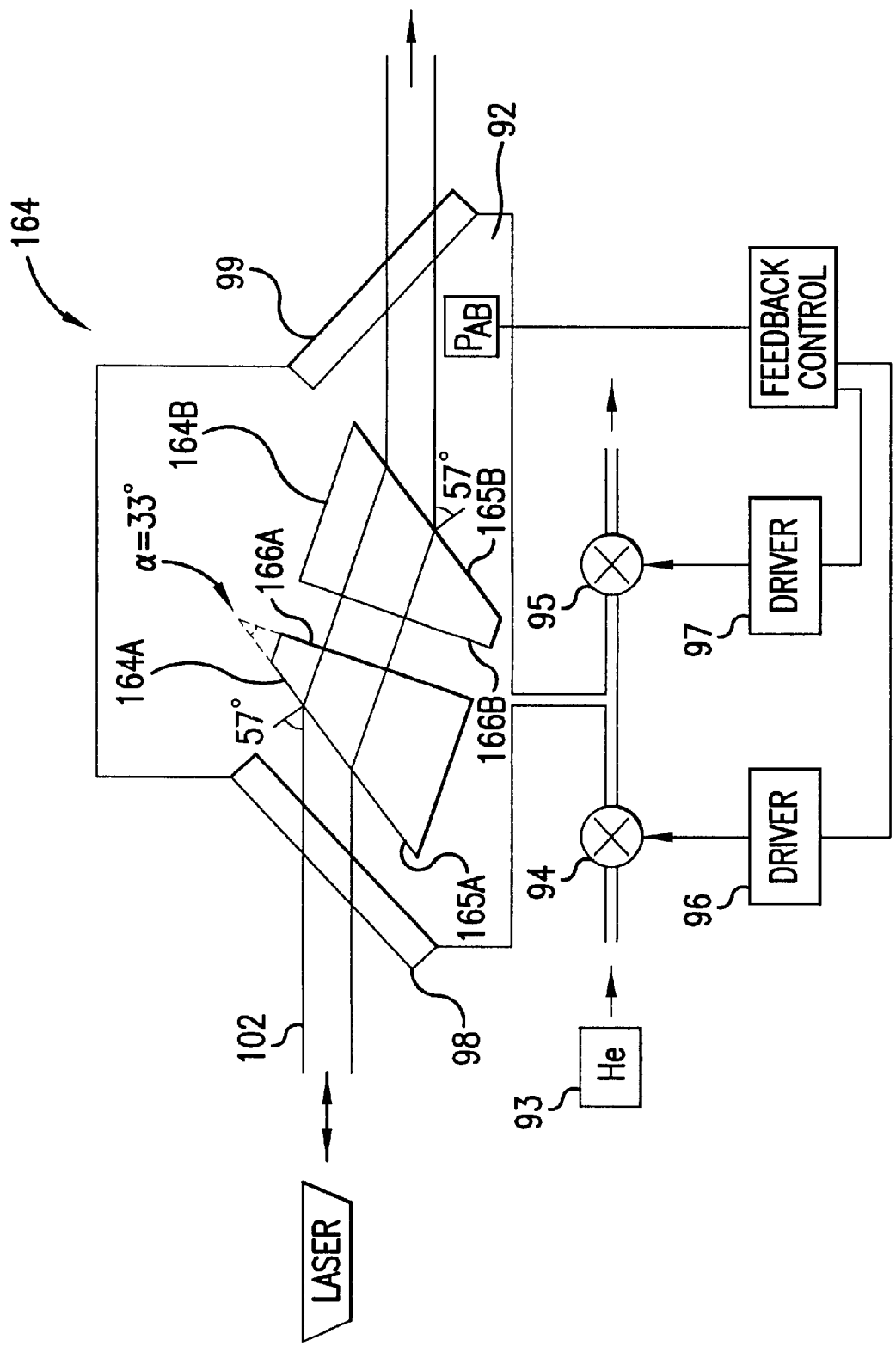
FIG. 22E shows etalon output coupler tuned by He.

The spectrum of $F_2$ laser is also shown in FIG. 22D. There are two peaks, each of them has FWHM of about 1.1 pm and they are separated by $\Delta\lambda$=106.6 nm. The effects of line-selection of the strong line and its simultaneous line-narrowing are achieved in the present embodiment by aligning the etalon output coupler such that one of its peaks lies right at the center of the strong line, and one of its minimums lies right at the center of the weak line. This can be done, if $$\Delta\lambda = (N+1/2)\lambda_{FSR} \quad (4)$$

where N is 1, 2, 3. . .

For example, if $\lambda_{FSR}$=1.04 pm. (and $\Delta$=106.6 nm) then N=102. Using formula (3) and $n_a$=1.0004 for pressure about 30% above atmosphere, we obtain that d=11.941 mm.

Fine tuning of EOC can be done by adjusting nitrogen pressure.

Tuning of EOC

Tuning of EOC can be done by changing pressure in chamber 92 (FIG. 22C) using inject value 94 and release valve 95. These valves are controlled by drivers 96 and 97 correspondingly. Signals to the drivers are sent by laser onboard computer (not shown).

In one embodiment, the He is used instead of nitrogen, and pressure in the chamber 92 is maintained to the required value. This value is determined at the factory as the most optimum for the output power and spectrum bandwidth. Preferably the percentage of light reflected at the chosen spectral line is between 10 and 17 percent and the light reflected at the other is about 0. The 17 percent reflectivity at the chosen line is obtained when no coatings are used on etalon surfaces. The lower reflectivity can be obtained by applying coatings to etalon surfaces 166A and 166B (FIG. 22C) in order to reduce their reflectivity to below that of uncoated surfaces.

Control of the pressure for tuning the EOC can be accomplished using a feedback arrangement based on actual wavelength measurements in the manner described in U.S. Pat. No. 5,856,991 issued Jan. 5, 1999 entitled "Very Narrow Band Laser". That patent is incorporated herein by reference.

A simpler alternate tuning method is to control the pressure of the etalon to a selected absolute pressure (FIG. 6) in order to keep the etalon adjusted to reflect at a selected wavelength range within the selected $F_2$ line and to transmit at the wavelength of the other line. This technique is possible because the $F_2$ laser of the present invention (unlike prior art KrF and ArF lasers like those described in the '991 patent) can be operated at a narrow band without the use of grating based line narrowing unit which itself must be tuned.

Since both lines of the $F_2$ laser are absolute values, they do not change due to influences such as beam direction in the laser cavity or temperature of laser components. The reflectivity of the etalon (assuming a fixed spacing between the prisms and constant temperature of the etalon gas) are values which depend only on the etalon pressure. Therefore, the etalon can be calibrated in the factory to determine the proper etalon pressure to provide the desired reflectance at the two F2 lines. Then a feedback control can be provided which utilizes an absolute pressure transducer reading etalon pressure in order to keep the etalon gas pressure at the desired pressure. If helium is the etalon gas the index of refraction for the etalon gap is:

$$n_{He} = 1 + 4 \times 10^{-5} \frac{P_{He}}{14.5 \text{ psi}} \quad (5)$$

where $P_{He}$ is the absolute helium pressure in the etalon.

According to equation 2, the peaks and minimums of the reflection curve shown in FIG. 22D shifts in proportion to $n_{He}$; thus the etalon is appropriately sensitive to pressure changes. For example, 1 psi change in absolute pressure will shift the reflectance curve by about 0.4 pm. Absolute pressure transducers are readily available for reading pressures to an accuracy of about 0.02 psi; thus a feedback control using such a transducer could easily control the etalon reflectance to an accuracy of better than 0.01 pm. These absolute pressure transducers are available from suppliers such as Druck, Inc. with offices in New Fairfield, Conn. An acceptable unit would be their Model No. PMP 4000.

Preferably the etalon temperature is regulated to an approximately constant temperature, but an alternative is to measure the temperature and to correct for temperature varation. This is done in accordance with the following formula.

$$n_{He} = 1 + \left(4 \times 10^{-5} \frac{P_{He}}{14.5 \text{ psi}}\right)\left(\frac{T_{STD}(K)}{T_{He}(K)}\right) \quad (6)$$

where $T_{STD}(K)$ is a reference temperature in degrees Kelvin and $T_{He}(K)$ is the helium gas temperature in degrees Kelvin. In this case the constant distance between the surfaces 166A and 166B (FIG. 22C) can be maintained by using spacers made out of low expansion material, such as fused silica or ULE glass.

Minimizing Divergence of Seed Beam

Line narrowing techniques such as the beam expander-grating combination and the etalon output coupler depend for good performance on a low divergence laser beam. A simple technique to reduce divergence of the beam is to utilize apertures with small dimensions. However, reducing aperture dimensions reduces the beam energy. Applicants' initial experiments for producing very narrow band $F_2$ output beams have utilized small apertures. However, other techniques for reducing divergence without substantial loss of energy could be used when high output energy is important.

Alternate Etalon Output Coupler Configurations

The laser system shown in FIG. 22B could be used as a seed laser in an arangement such as those shown in FIGS. 6A and 6B. Other preferred designs are shown in FIGS. 6E, 6F, 6F1, 6G, 6H and 6H1. The designs shown in these figures could be adapted to a two chamber configuration or, by using suitable mirrors, could be adapted to a single chamber configuration. In the FIG. 6E, design, an etalon output coupler is positioned at the rear of the laser and a 40% reflection mirror operates as a second output coupler providing the seed beam to the amplifier. Applicants' experiments have indicated better line narrowing with this configuration as compared to using a seed laser as shown in FIG. 22B.

Figure 6E:
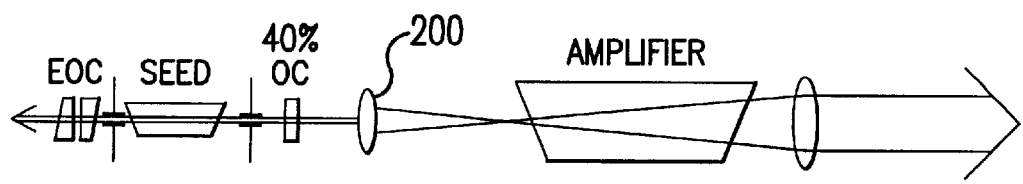
Figure 6F:
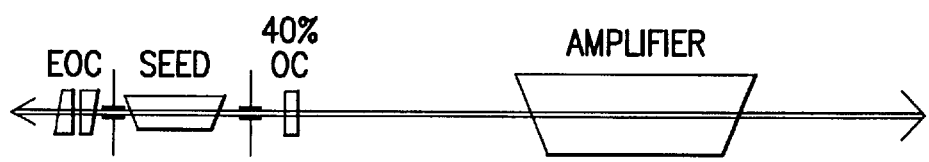
Figure 6F:
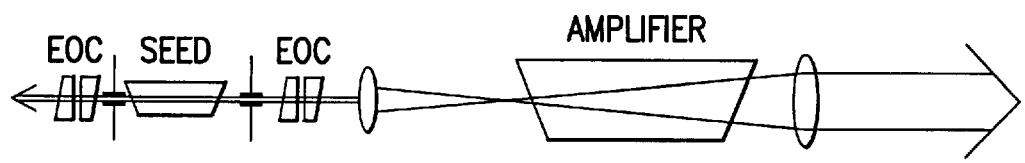
Figure 21A:
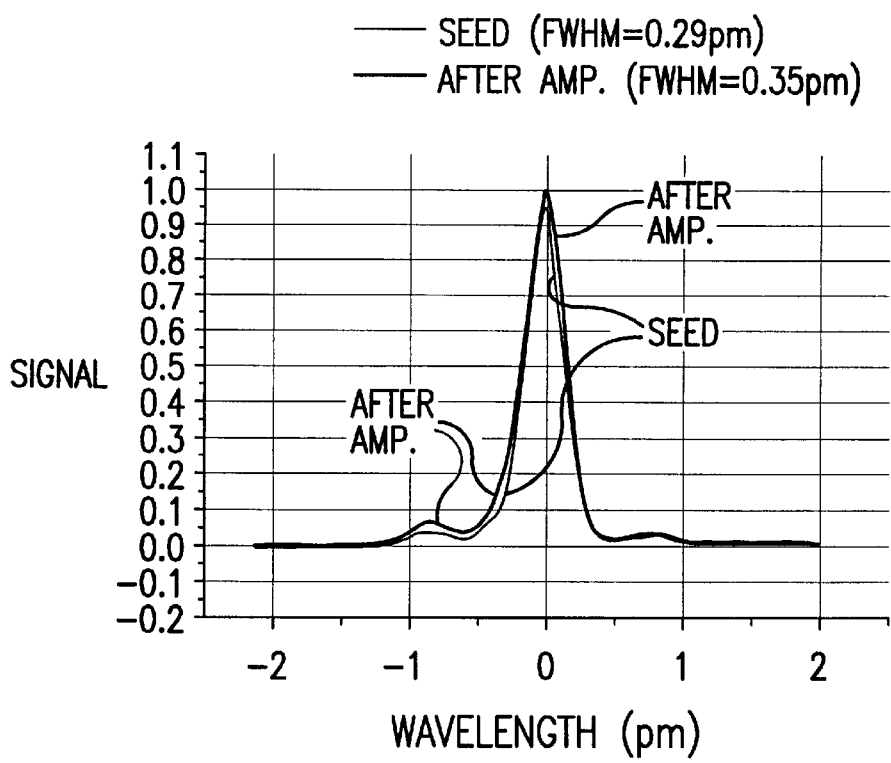
FIGS. 21A and 21C show spectrum of seed laser beam and amplified laser beam.
Figure 21B:
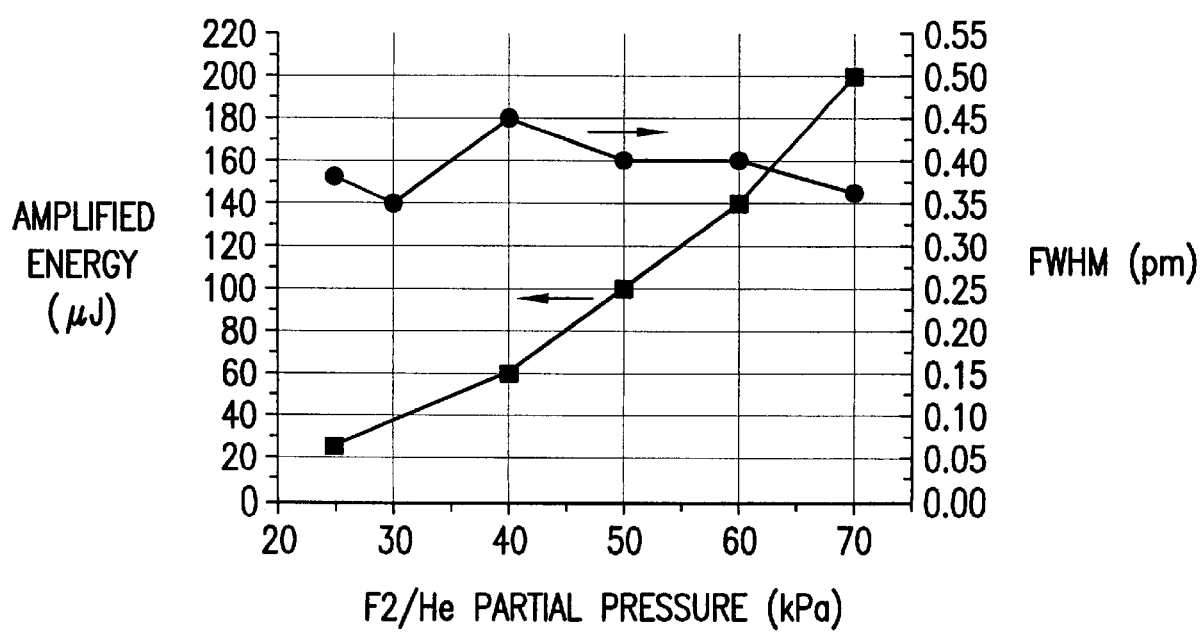
FIG. 21B shows dependance of amplified laser pulse energy and spectrum bandwidth on fluorine partial pressure.

Applicants have shown excellent results with the configuration shown in FIG. 6F. Here two etalon output couplers are used, both of which are tuned to reflect at the desired wavelength. Applicants' refer to this configuration as a "double EOC seed laser system." The beam geometry through the amplifier was a divergent beam produced by lens 200 such that the beam size at the entrance to the amplifier gain media was about 0.3 mm diameter, but the beam size at the exit was about 2.7 mm. Early test results show an amplified beam energy of 0.2 mJ on a 2.7 mm spot. The gas in seed laser was 70 kPa of 0.1% $F_2$ in neon, with the balance of Ne for a total pressure of 440 kPa. and the gas in the amplifier was 25 kP of 1% $F_2$ in He with the balance of Ne for a total pressure of 440 kPa. The laser system output was measured with increasing concentrations of $F_2$/He portion, and the results are shown in FIGS. 21A and 21B. The seed FWHM was 0.29 pm, and after amplification, the output beam had an FWHM of 0.35 pm. Maximum energy was 0.2 mJ. For this test the seed laser was apertured to small circles apertures of about 1mm diameter. This output can be increased without adversely impacting bandwidth by using additional small apertures as shown in FIG. 6F1 at both front and rear of the seed laser chamber.

Figure 6K:
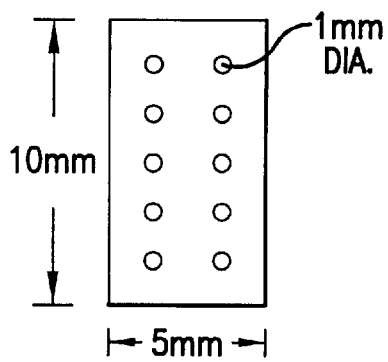
FIG. 6K shows a technique for reducing divergence.
Figure 6K:
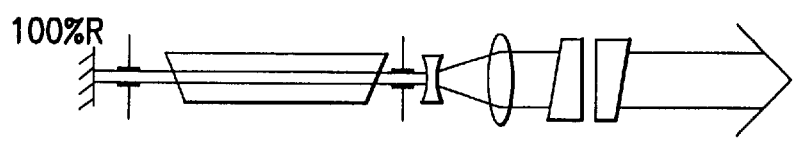
Figure 6G:
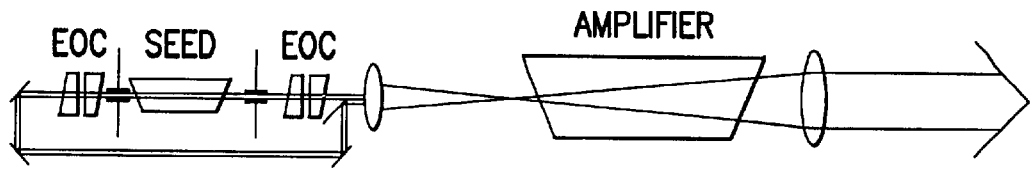

The system output could also be increased using the technique shown in FIG. 6G where the rear output beam (which is wasted in the 6F example) is combined with the front output beam.

FIG. 6K shows another alternative for reducing the divergence of the beam to improve etalon performance. In this case, the beam exiting the gain medium is expanded in a beam expanding telescope before the etalon output coupler. If two etalon output couplers are utilized as shown in FIG. 6F, each end of the gain medium could include a beam expanding telescope. Use of the telescope permits larger apertures to be used such as 3 mm×3 mm or 3 mm×4 mm.

Saturation

Figure 6H:
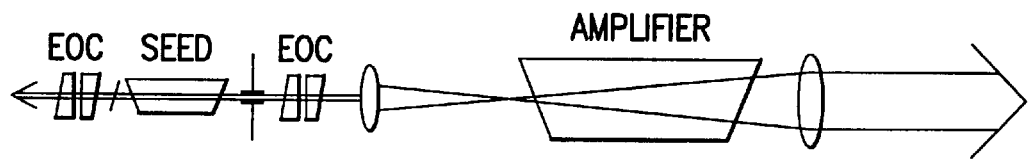
Figure 6I:
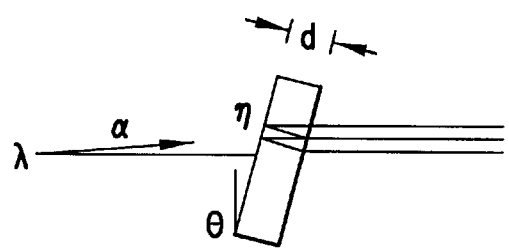
Figure 6I:
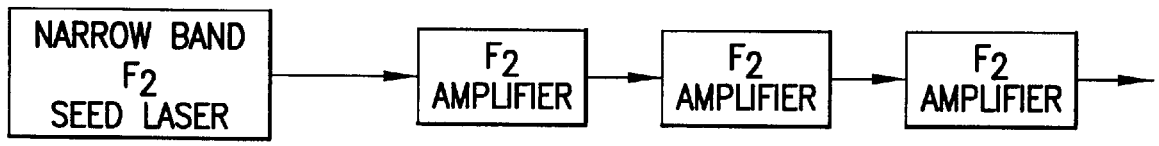
Figure 6J:
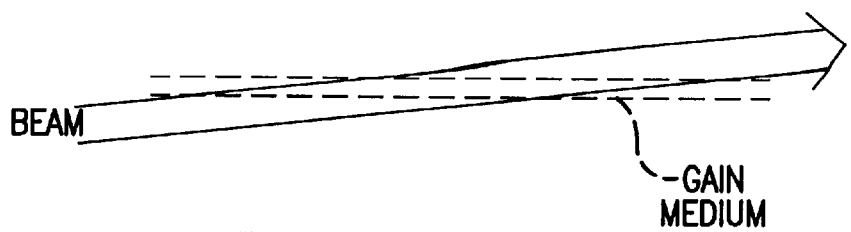
Figure 21C:
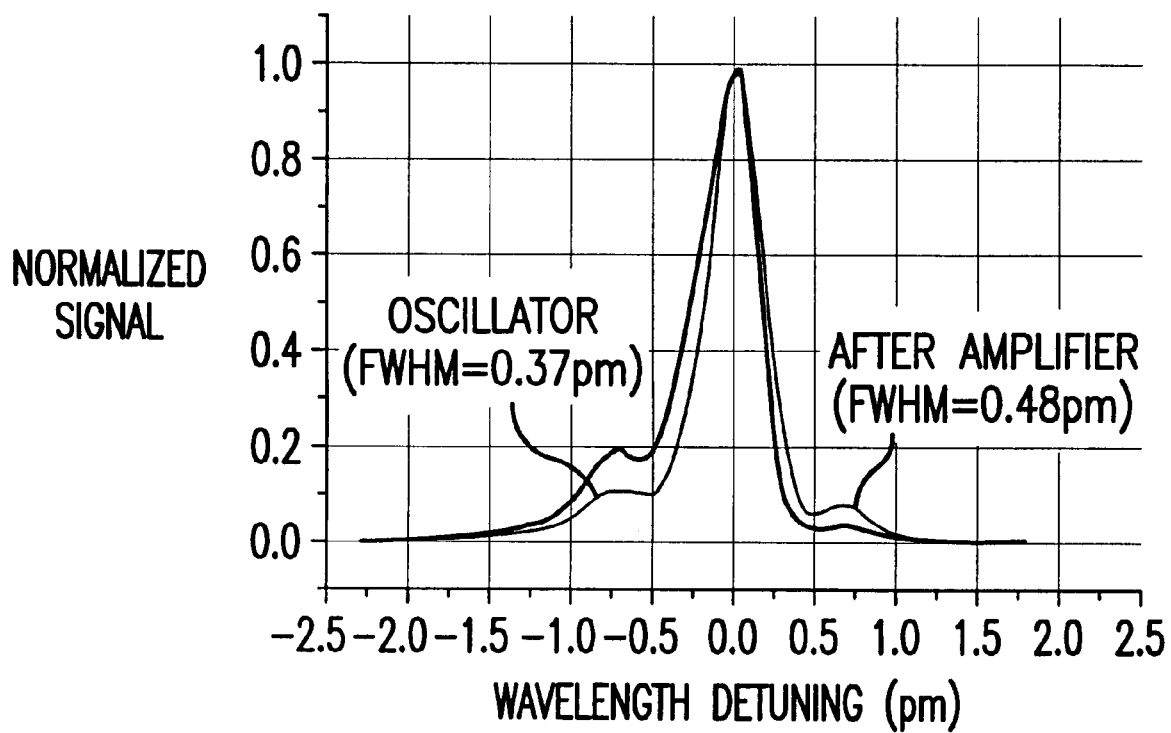

Applicants' experiments have shown that a seed beam can saturate the gain medium in an amplifier with high gain if the beam is directed straight through the gain medium. For example, FIG. 21C shows what happens if the lens in FIG. 6E is removed as shown in FIG. 6E1. In this case, saturation occurs at the desired wavelength so that the tails of the spectrum are amplified much more than the peak so that the bandwidth of the output beam is substantially broadened. This problem can be minimized by increasing the size of the beam, as shown in FIG. 6E, 6F, 6G, and 6H, or by increasing the number of separate beams as suggested by FIG. 6F1. Another approach would be to widen the gain volume, but this would require faster circulation of the laser gas. Another approach is to slant the beam at an angle through a standard gain volume as shown in FIG. 6J.

Divergent Filter

Another technique for increasing the output without compromising bandwidth is to use a divergence filter. This concept is shown in FIGS. 6H and 6H1. The divergence filter operates in a manner similar to a conventional etalon.

Let us consider an etalon with a gap d, tilted by angle θ relative to the laser axis X. We will consider a solid etalon with refractive index n. Let also have a beam with a wavelength λ propagating at some angle α relative to axis X as shown in FIG. 6. Then the following equations will describe transmission of the etalon for this beam of light:

$$I_t=I_0(1-R)^2/[(1-R)_2+4\ R\ \sin^2(\delta/2)], \quad (7)$$

$$\delta=2\pi\Delta S/\lambda, \quad (8)$$

$$\Delta S=2nd\ \cos\beta, \quad (9)$$

$$\beta=\theta+\alpha. \quad (10)$$

Etalon FSR as it follows from eqs. (7)–(10) is $$FSR=\lambda^2/2nd\ \cos\beta, \quad (11)$$

The idea of using etalon as a divergence filter is to make it very sensitive to small changes in beam propagation angle a so that rays with α=0 would have maximum transmission, and transmission will decrease rapidly once α≠0. On the other hand, the etalon FSR should be big enough, so that all laser spectrum would have maximum transmission as long as α=0.

In the preferred embodiment, a solid etalon with thickness d=0.25 mm made out of $CaF_2$ is used. Refractive index of $CaF_2$ at 157.63 is about 1.57. If the etalon is tilted by an angle =1.99 degrees, it will have a maximum transmission for the beam propagating at Θ=0. This maximum transmission corresponds to interferometric order N=4977:

$$\delta/2=\pi\cdot 4977 \quad (12)$$

The FSR of this etalon according to (5) is 31.67 pm which is much larger than the laser bandwidth.

From eqs (7)–(19):

$$2nd\ \cos\beta=N\lambda \quad (13)$$

where N=4977 is an interferometric order.
Therefore, $$d\lambda/d\beta=-2nd\ \sin\beta/N \quad (14)$$

So, all of the beams with α≠0 will have the position of transmission maximum shifted towards the shorter wavelengths.

For example, beams propagating with α=0.001 rad will have position of the maximum shifted by $$\Delta\lambda=(-2nd\ \sin\Theta/N)\cdot\alpha=-5.49\ pm \quad (15)$$

In the preferred embodiment, the etalon divergence filter has partially reflective coatings with reflectivity of about 30%. The light goes through the etalon divergence filter twice per each round trip in the resonator. The displacement of the position of maximum transmission by −5.49 pm leads to reduction of transmission by more than 50% on a double pass. Therefore, the rays proipagating at α≠0 will be suppressed by the etalon divergence filter.

This filter reduces divergence of the laser beam in one plane only (plane of the drawing FIG. 6H and 6H1 in the current example 1). In order to reduce divergence in other plane also (perpendicular to the plane of drawing), a second etalon divergence filter can be used, which is tilted in the other direction by the same 1.99 degrees.

Multiple Amplifiers

Applicants have discovered if a low energy very narrow band $F_2$ seed beam is greatly amplified in an $F_2$ amplifier, there is a tendency of the beam to be broadened in the amplifier. Therefore, the energy of the seed beam should be as large as feasible while keeping the bandwidth within desired limits. An alternative approach is to go with a very low energy seed beam and use multiple amplifiers as shown in FIG. 6I.

Prototype Unit

Several prototype $F_2$ laser systems have been built and tested by Applicants and their fellow workers.

The prototype laser systems are largely based on current production KrF and ArF lasers incorporating several important improvements over prior art excimer laser systems, utilizing a high efficiency chamber and solid-state pulsed power excitation. The discharge is corona pre-ionized to minimize gas contamination. The entire optical beam path is nitrogen purged to avoid light absorption by oxygen and to avoid damage to optical components. All resonator optics were external to the angled chamber window equipped laser chamber. The gas mixture was 0.1% fluorine in 4 atmospheres of helium and the electrode gap was reduced to 10 mm.

In this prototype unit, for both the master oscillator and the downstream laser a modified pulse transformer is utilized. In this pulse transformer the single four-section stainless steel rod (described below under the section entitled Pulse Power system and shown in FIG. 8D) which functions as a secondary winding is replaced by a transformer secondary conductor consisting of an inner cylindrical rod and two coaxial tubes all connected in series and insulated from each other as shown in FIGS. 11A, 11B and 11C. The secondary conductor consists of two coaxial assemblies (the cross-section of which are depicted in FIGS. 11B and 11C) connected with bus bar as shown at 302 and HV cable as shown at 304. FIG. 11D shows the same cross-sections as 11B and 11C and also the layers 306 of Metglas™ and mylar film which is wrapped around the cylinder portion 308 of the spools forming the primary winding. Also identified in FIG. 11D are the central wire 310 and hollow cylindrical conductors 312 and 314 forming the secondary portion of the pulse transformer. The Metglas™ and mylar layers are not shown in FIGS. 11A, 11B and 11C. A current pulse having a voltage peak of about 1,000 volts (as indicated at 316) will produce a pulse at the secondary HV terminal of about 0–36,000 volts as indicated at 318 in FIG. 11A.

Coupling between the primary cylinders and the three coaxial secondary conductors is provided by wrappings of Metglas™ and mylar film as described above with reference to FIG. 8E. In this embodiment an extra stage of compression (with one additional capacitor bank $C_{p-1}$) is provided. The capacitor banks in this embodiment have the following values:

$C_o$=about 12.1 μF
$C_1$=about 12.4 μFC
$C_{p-2}$=about 8.82 μF
$C_{p-1}$=about 8.4 μF
$C_p$=about 10 nF The modified pulse power system in this prototype embodiment produces an output use time of about 80 ns into the peaking capacitor bank. The step-up ratio of the pulse transformer is 36× (as compared to the 23× in the embodiment described in detail above). This permits the laser to operate at substantially higher voltages with correspondingly lower $F_2$ concentrations. Applicant has determined that the higher voltage operation improves discharge stability, and permits higher repetition rates.

Monitoring Pulse Energy

With the prototype unit described above, prior art UV pulse energy detectors do not provide good results. This is because the pulse energy detectors used in prior art KrF and ArF lasers are very sensitive to light in the red and neon infrared spectral ranges. In fact these standard silicon photodiodes are much more sensitive to red and infrared than to laser light at 157 nm. Therefore, even when light is in the range of about 3% as indicated above, the effect on the silicon photodiode is much greater than 3%. For this reason, an energy detector should preferably be provided which is not significantly affected by visible red and infrared light. Detectors are available on the market which are especially sensitive to UV radiation and are relatively or completely sensitive to red and infrared radiation. These detectors generally are referred to as solar blind detectors and are use in above the atmosphere astronomical work but to the best of Applicants knowledge, they have not been applied to measure laser pulse energy. There are a number of methods available to construct a "solar blind" photodetector. Several strategies are discussed below.

Phototube

A phototube is a vacuum device consisting of two electrodes, a photocathode and an anode. Light striking the photocathode can cause the ejection of electrons from the cathode material via the photoelectric effect. The application of a positive voltage between the anode and cathode will drive the ejected electrons to the anode, generating a current through the device proportional to the number of photons/second striking the photocathode. This effect has a cutoff; irradiation with light of wavelength higher than a certain value does not produce photoelectrons. The maximum wavelength is defined by:

$$\lambda_{max} = hc/\Phi$$

where H is Planck's constant, c is the speed of light in vacuum, and $\Phi$ is a property of the material called the work function. Choice of a photocathode material with a sufficiently high work function (say, >4 electron volts) will result in the generation of photocurrent only for illumination at wavelengths shorter than 300 nm, i.e., solar-blind response. Examples of photocathode materials with acceptable work functions are CsTe, and CsI diamond films.

Photoconductor

Illumination of some semiconductors and/or insulating materials produces an effect closely related to the photoelectric effect: interaction between photons and electrons in the material excite electrons such that they are no longer bound to a specific site in the material (i.e., in the valence band), but are free to move through the crystal in response to an applied voltage (i.e, the conduction band). Again, a current is generated proportional to the flux of photons striking the material. This effect exhibits a wavelength cutoff identical to that given in the above equation, with the exception that the material work function, $\Phi$, is replaced by a different property usually called the band gap, $E_g$. Again, a material with sufficiently high band gap will respond only to short wavelength radiation. Diamond, with a 5.48 eV band gap, has a photoconductive response at wavelengths less than 200 nm.

Photodiode

Illumination of a diode junction (Schottky, p-n, or p-i-n doped semiconductor) can also promote electrons from the valence band to the conduction band, generating a photocurrent. The diode may be forward biased, in which case its performance is very similar to the photoconductor except that the charge carrier lifetime is longer. When reversed biased, the applied field improves the device response speed. Once more, a junction with sufficiently high band gap will allow response only at UV wavelengths.

Absorption Depth Grading

One way to greatly suppress the red response of a low-bandgap photoconductor or diode as compared to its UV response is by appropriate choice of the device thickness. It is characteristic of such materials that penetration of UV photons into the depth of the material is much less than that of visible light. That is to say, complete absorption of the UV light occurs in a much thinner layer near the surface. By choosing device thickness to be comparable to the absorption depth of the UV light (at some cutoff wavelength), one can make the device relatively transparent (and thus unresponsive) to longer wavelengths. While not truly solar-blind, such constructions can diminish the visible/IR response of the device below the threshold of detectability.

Preferred off-the-shelf solar-blind phototube detectors are available from suppliers such as Hamamatsu, Ltd. with offices in Los Angeles, Calif. and in Japan. Its Model R1187 using CsI has a spectral response in the range of 115 nm to 200 nm. Models R1107 and R763 use CsTe and have a best response range somewhat above 157 nm but could be used.

Figure 18:
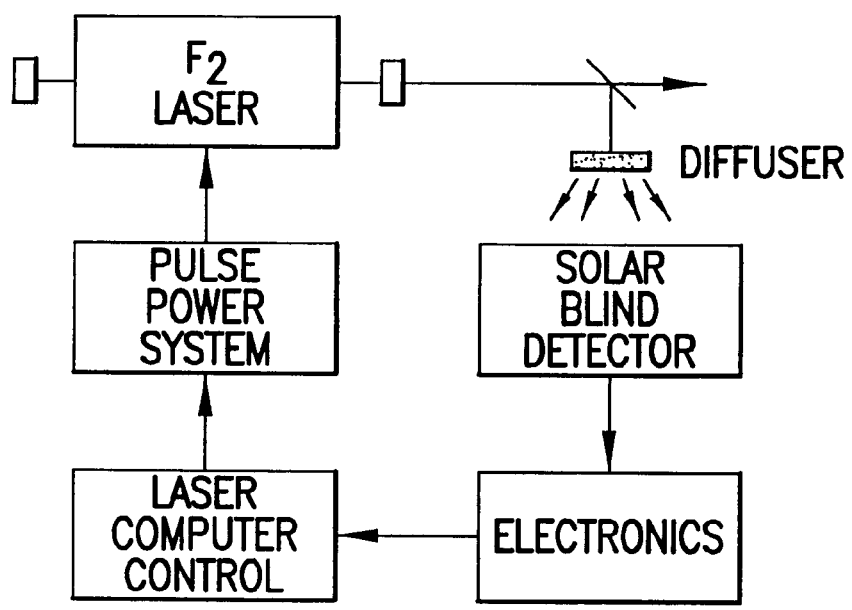
FIG. 18 shows a preferred pulse energy detector system.

FIG. 18 shows a solar-blind detector being used in a laser system to keep the pulse energy and/or dose energy controlled to a desired level. (See prior section for details of controlling pulse and dose energy.)

Reflection Based Monitor

The sampled beam (Red and VUV) is reflected off several mirrors with dielectric coatings designed to produce high reflectivity at the (157 nm) VUV wavelength and low reflectivity in the red/infrared (the undesired wavelengths span a range from 635 nm to 755 nm). A typical optic might have 95% reflectivity at 157 nm and 4% reflectivity in the red/IR, giving an extinction ratio of ~24:1. The desired extinction ratio (typically 500 or 1000:1) may be obtained through successive incidences on several mirrors. The light transmitted through these mirrors should impinge on a red/IR-absorbing color glass filter, or other light trapping element, to prevent scattered light from finding its way to the detector.

Separation by Dispersion

A dispersive element (prism or grating) may be used to separate the VUV from the red/IR wavelengths, and the photodiode is placed to intercept only the VUV beam. With a grating element, the groove spacing must be chosen such that there is no substantial overlap between higher diffraction orders of the red/IR wavelengths and the UV wavelengths. That is, the grating equation must not be simultaneously satisfied at the design angle theta for the ultraviolet wavelengths and the visible/infrared wavelengths by varying the value of m (m is always an integer, e.g. D sin (theta)=$m_1$*157 nm≠$m_2$*755 nm (etc., for all visible/IR emission wavelengths).

Detection with Fluorescence

A material which, upon exposure to 157 nm light, fluoresces in the visible or infrared is placed in front of a silicon photodetector. By converting the VUV light to visible/IR light, the enhanced red response of the photodiode is counteracted. If the fluorescent emission wavelengths are substantially different from the red/IR laser emission wavelengths, one may employ a red/IR absorbing filter after the fluorescent converter to directly suppress the red/IR emission. The fluorescent converter might also be constructed or doped with such an absorber material.

Reducing the Red Radiation

Prior art $F_2$ lasers typically utilize helium as the buffer gas. It is known that neon can be used but the efficiency of the laser with the Ne buffer is greatly reduced as compared to the $F_2$ laser using He as a buffer. Generally, the use of Ne as a buffer requires substantially higher concentrations of $F_2$ and also higher voltage to produce equivalent laser pulse energy. Helium is much cheaper than neon, therefore, in the prior art He has been the natural choice for the $F_2$ buffer gas. However, as stated above the $F_2$ laser with the helium buffer produces a significant proportion of visible red and infrared light so that super fluorescence or even lasing occurs at the wavelengths. Normally the contribution is high enough so that lasing actually occurs at these longer wavelengths. These longer wavelengths in the laser beam can cause problems with regard to energy detection as discussed above and also the red wavelengths can cause problems in a downstream lithography system. These problems can be dealt with but a better solution in many cases is to substantially reduce or eliminate the red and infrared light from the beam as it is being created in the laser.

Figure 19:
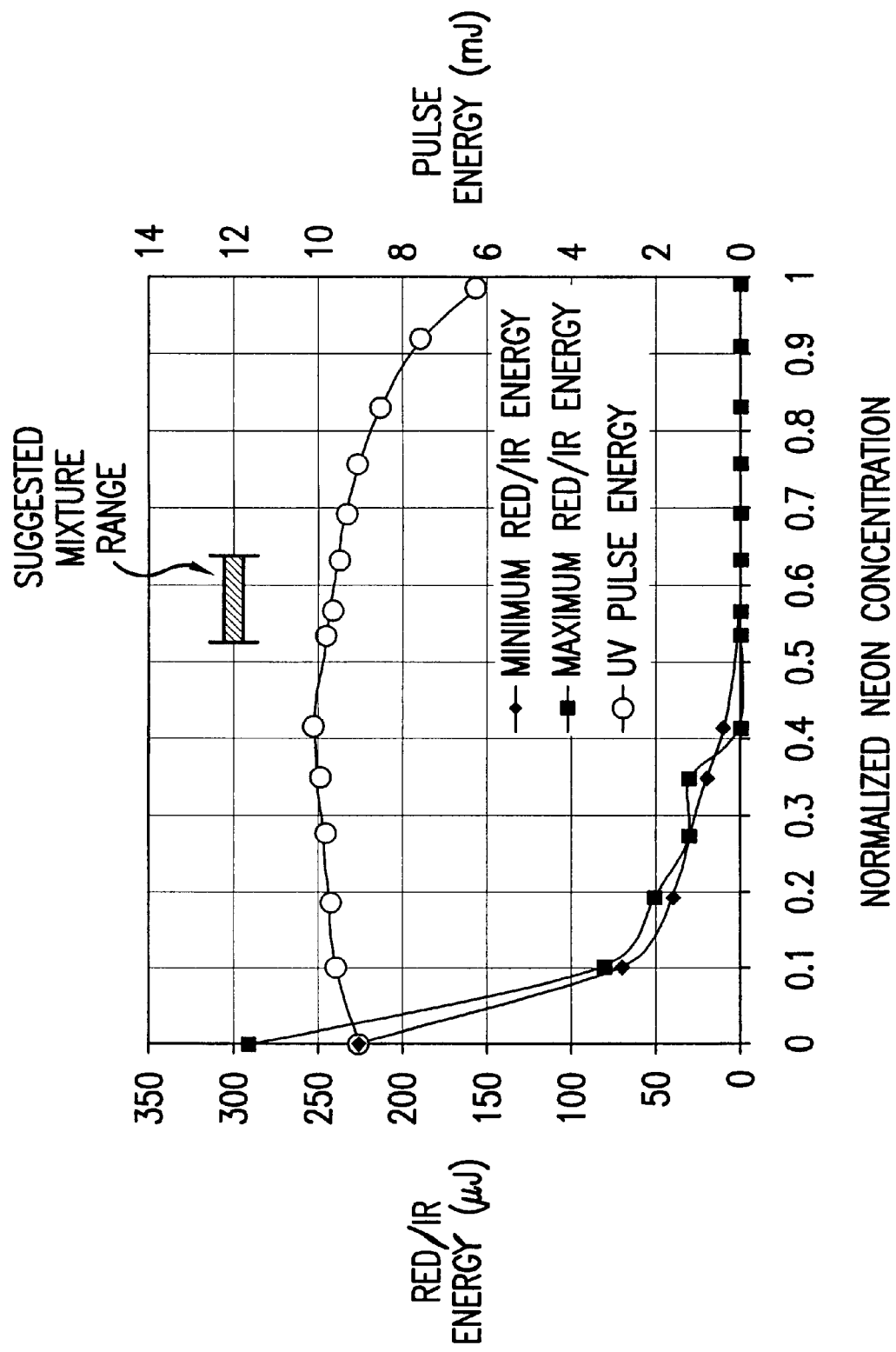
FIG. 19 shows the variation of pulse energy and light spectrum with increasing neon concentration where the other buffer gas is helium.

Applicants have described that the red and near-infrared light in the beam is in fact eliminated when the buffer gas is changed from pure helium to an appropriate mixture of helium and neon. However, in addition to substantially reducing the undesirable red and near-infrared components, the addition of Ne affects the efficiency of the laser at the desired UV wavelength. Therefore the best mixture of He and Ne may be different depending on the importance of maximum pulse energy and the relative importance of eliminating the red and near-infrared light. Normally, the preferred range of Ne as a percent of the total buffer quantity will be from about 40% to 95%. As indicated in FIG. 19, a good buffer gas mixture range providing substantially zero Red-IR but maximum UV pulse energy is between 0.52 and 0.63 neon and the rest helium.

Figure 12:
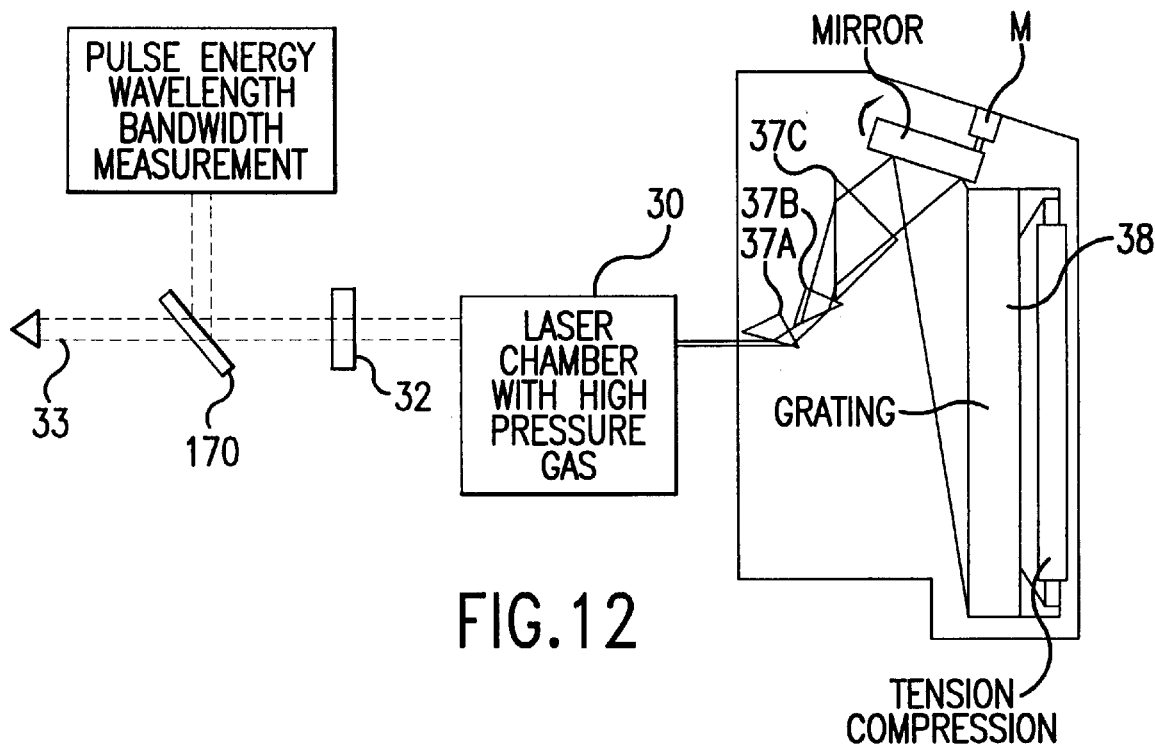
FIG. 12 shows a technique for line narrowing an $F_2$ laser.
Figure 13:
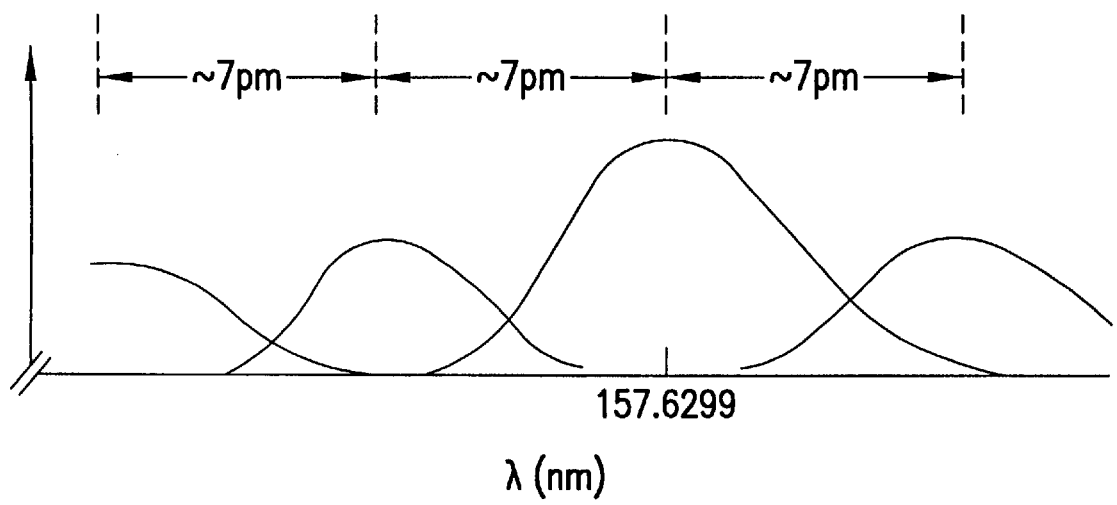
FIG. 13 shows qualitatively the broadening of the $F_2$ laser beam with increased pressure.

FIGS. 12 and 13 describe a tunable fluorine master oscillator with increased tuning range. The laser resonator consists of an output coupler mirror 32 and a wavelength tuning optical setup. The wavelength tuning optical setup consists of a beam expanding optic subassembly 37 and a diffraction grating 38. The optical gain medium is created within a gas discharge chamber 30 by means of excitation of fluorine gas molecules in a gas discharge. Similar configurations are currently used in narrow band exciplex lasers for lithography operating at longer wavelengths, i.e., the KrF at 248 nm and the ArF laser at 193 nm. The major difference between these lasers is the spectral gain distribution and temporal gain dynamic of the gain medium. Whereas the exciplex molecules typically show gain in a much broader spectral region of at least several 10 pm, the spectral gain distribution of the observed molecular fluorine transitions at approximately 157 nm is, in accordance with recent measurements of multi-line and single-line laser emission spectra, commonly considered to be restricted to about 1.1 pm. However, a closer view reveals that this is not true, since the observed spectrum does not necessarily reflect the true gain distribution of the gain media, i.e., when high specific gain values are involved. Due to the high specific gain of the molecular fluorine laser media and the typical used length of the gain medium of about 0.5 m to 1 m, the observable emitted spectrum gets narrowed and peaked up at the maximum of its natural transition wavelength already within a single path through the gain medium. This physical well-understood behavior is described in many standard laser handbooks, i.e., in A. E. Siegman, "Lasers", Univ. Science Books, Mill Valley, Calif. Unfortunately, the necessary gain-length product to achieve line-narrowed operation down to a bandwidth which is useful for lithography with dioptic imaging optics using this simple approach requires unreasonable amplification lengths of at least several meters.

The real available FWHM (Full Width Half Maximum) gain bandwidth of any of the individual UV/VUV molecular fluorine laser transition can be estimated to be 4 pm at 157.6299 nm at typical operating conditions of the gas discharge that generates the gain by exciting fluorine molecules. The optical resonator of the laser and thus the emission wavelength can be tuned over a range of about the FWHM bandwidth of any single transition of the UV/VUV molecular fluorine laser. Since the major contribution to the FWHM gain bandwidth is pressure-induced collision broadening, the tuning range can easily extend by increasing the pressure within the discharge chamber. Almost continuous tuning over an extended range of wavelengths (approximately 50 pm) can be achieved if the adjacent, by approximately 7 pm separated, rotational line transitions of the 157 nm fluorine molecule transition overlap due to pressure broadening of the individual transitions at elevated pressures. FIG. 20 depicts the spectral gain distribution in the vicinity of the strong line at 157.6299 nm at elevated pressures.

Of course, increasing the laser chamber pressure beyond the typical pressures of about 3 atmospheres used in prior art excimer lasers and can increase the cost of the chamber. However, Applicants propose that pressures in the range of about 7 to 10 atmospheres can be dealt with without major cost increases and would produce substantial broadening of the tuning range.

Single Preionizer Tube

As shown in FIG. 7A, a single larger preionizer tube 56A has replaced the two-preionizer tubes 56 shown in FIG. 3. The single tube preionizer is fabricated in accordance with the description in U.S. Pat. No. 5,719,896, issued Feb. 17, 1998, which is incorporated herein by reference. Applicants have discovered that one preionizer tube is not only sufficient, but very surprisingly provides improved performance over the two-preionizer design. In this embodiment the preionizer is located upstream of the electrodes. Applicants have determined that the one tube preionizer improves in the pulse-to-pulse stability by providing improved spatial stability of the discharge.

Referring now to FIG. 7A, this preionizer utilizes an integrated tube design, having bushing element 180 with anti-tracking grooves 170 incorporated therein as an integral component of the tube. The diameter of the rod portion 145 and the OD of the bushing portion 180 of the preionizer is ½ inch. The inside conductor rod 146 has a diameter of 7/37 inch and the connecting wire extending through the bushing section to make a ground connection is about 1/16 inch diameter. Prior preionizer tube designs utilized a two-diameter design, with the rod portion at about ¼ inch diameter and the bushings at about 1 inch diameter. This necessitated, for manufacturing purposes, a bonding process to join the bushing component with the tube component. The constant diameter, thicker tube design is contrary to conventional design rules, which would predict a reduction in ionization due to lower capacitances. In most designs, the tube thickness is dependent upon the dielectric strength of the material selected. Those skilled in the art will recognize that the prior art conventional preionizer tube design technique is to select a material with the highest dielectric strength and determining a wall thickness to match this capacity. For example, a sapphire material is known to have a dielectric strength ranging from 1200 volts/mil to 1700 volts/mil. Therefore, a dielectric thickness of 0.035 inches thick, provides a safety factor of 2 if the laser operates at 25 kV. This design yields a lower capacitance; however, the actual effect of this reduced capacitance on laser operation was discovered to be negligible, with a surprising increase in the measured geometric irradiation of the electrode gap. Because of the constant diameter, thicker tube wall, integral bushing design, a single piece of material can be machined to provide anti-tracking grooves 170. Because of the single piece construction, there is no need to use ultra-pure (i.e., 99.9%) polycrystalline translucent aluminum oxide ceramic, although Applicants continue to use the ultra-pure material. There is no requirement to perform the difficult surface polishing of tube geometries in preparation for diffusion bonding to artificially create the integral relationship between bushing 180 and tube 145. In fact, it has been determined that high purity is not as important a property as porosity of the material. It has been found that the greater the porosity, the more the dielectric strength is reduced. As a result, a commercial grade ceramic, preferably with purity of at least 99.8% and low porosity, such as that manufactured by Coors Ceramics Company under the material No. AD-998E and having a dielectric strength of 300 volts/mil may be used.

Bushings 180, having anti-tracking grooves 170 disposed therein, as previously described, act to prevent high voltage tracking axially along the surface of the tube from the cathode to the ground plane 160.

As explained above, Applicants have discovered that a single preionizer works dramatically better than two preionizers, and as explained above the first preferred embodiment places the single preionizer system upstream of the electrodes. Applicants have also experimented with the single preionizer located downstream and has discovered that at certain blower speeds this arrangement produces substantially better pulse energy stability than the upstream arrangement on the two tube arrangement.

High Efficiency Chamber

Improvements have been made to the chamber to improve the efficiency of the laser. A single piece cathode insulator 55A comprised of alumina, $Al_2O_3$ insulates the cathode from the upper chamber structure as shown in FIG. 6. In a prior art design, eight separate insulators were needed to avoid insulator cracking due to thermal expansion stress in the insulator. This important improvement permitted the head portion of the chamber to be made shorter which significantly reduced the distance between cathode 83 the peaking capacitor 82. The individual capacitors 54A forming the peaking capacitor array 82 were moved horizontally in closer to the cathode as compared to the prior art.

Prior art cathodes for commercial lithography lasers were typically supported by a cathode support bar 53 as shown in FIG. 3. In this preferred embodiment, the cathode support bar was eliminated and the cathode 83 was made slightly thicker and mounted directly on the single piece insulator 55A. The cathode 83 is connected to the high voltage side 82A of peaking capacitor 82 by 15 feed through rods 83A and connecting nuts 83B. In the preferred embodiment, a new anode support bar 84A is substantially more massive than prior art anode support bars and comprises fins 84B located in the gas flow region. Both of these features minimize temperature variations of the anode.

Metal Seals

Applicants have discovered that prior art elastomer seals reacted with fluorine gas to produce contaminants in the laser gas which degraded laser performance. A preferred embodiment of the present invention uses all metal seals to seal the laser chamber. The preferred metal seals are tin plated inconel 1718 seals.

Monel Current Return and Vanes

Applicants have also discovered that elements of stainless steel also react with fluorine to produce contaminants in the laser gas. Therefore, in this preferred embodiment, prior art stainless steel current return structures and gas flow vanes have been replaced with monel current returns 250 and monel flow vanes 252 and 254.

Fan Improvements

This preferred embodiment of the present invention includes a braze free blower blade structure. The blower blade includes a non-symmetrical blade arrangement which greatly decreases resonance effects and improves bearing life.

Silicon Free Fan Blade Structure

Applicants have discovered that a brazing material commonly used in blower blade construction was the primary source of $SiF_6$ in the laser chamber. This gas significantly degraded laser performance for KrF lasers but was a total disaster for ArF lasers and $F_2$ lasers. Applicants have identified four solutions to this problem. First the blade structure was machined in segments from a solid block of material (in this case aluminum). Another solution was to cast the blade structure in segments. The segments then are welded together using electron beam welding in which no new material is added. It is also feasible to fabricate the blade structure by joining blades to a frame structure but in this case the joining is by electron beam welding instead of the prior art brazing process. The fourth method is to join the blade to a frame structure using a soldering process using a silicon free solder. Aluminum 6061 is used as the base material for all of the component pieces. These parts are then copper-plated in prelude to the soldering process. With all of the parts assembled, the fan is then soldered together using a low temperature solder, typically 91% tin (Sn) and 9% Zinc (Zn) in a vacuum furnace. This solder is chosen due to its lack of silicon and its ability to work with copper plated aluminum. The assembled and soldered fan is then nickel-plated. This method of construction yields a on-silicon fan that is inexpensive to manufacture.

Reducing Resonance Effects

Figure 14B:
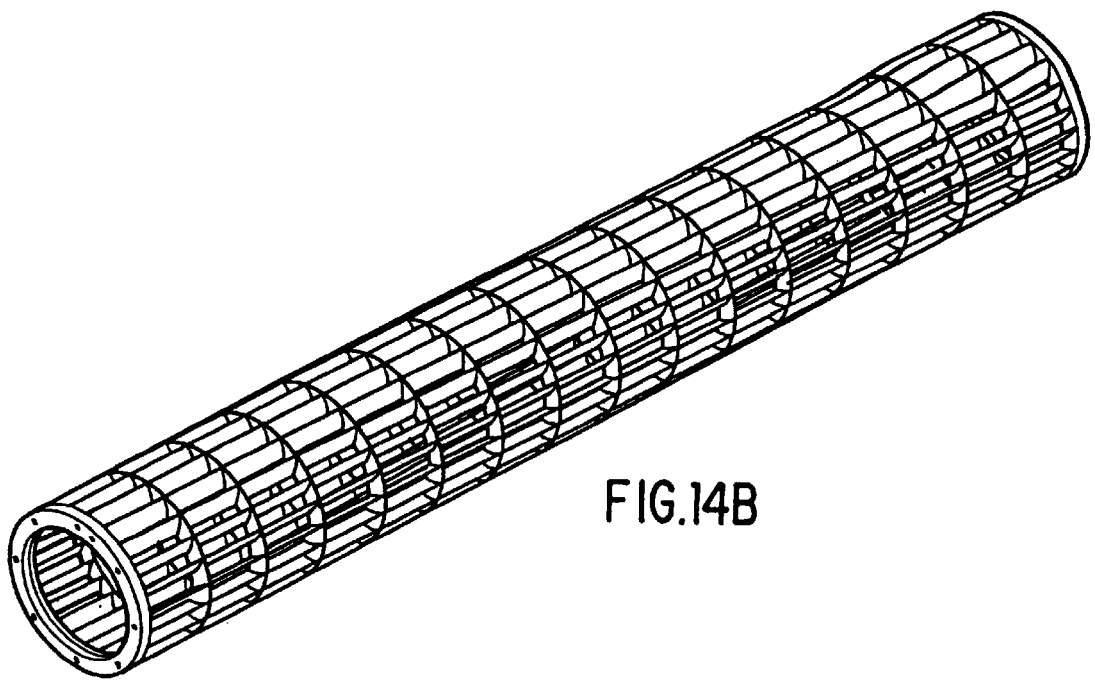
FIGS. 14A, 14B and 14C show preferred blower blade structure designs.
Figure 14A:
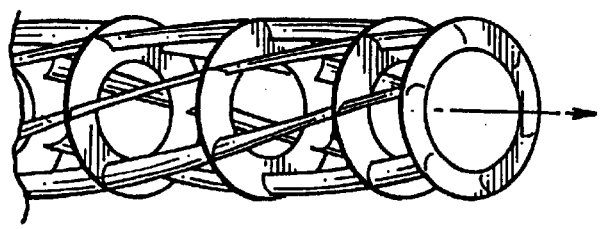
Figure 14C:
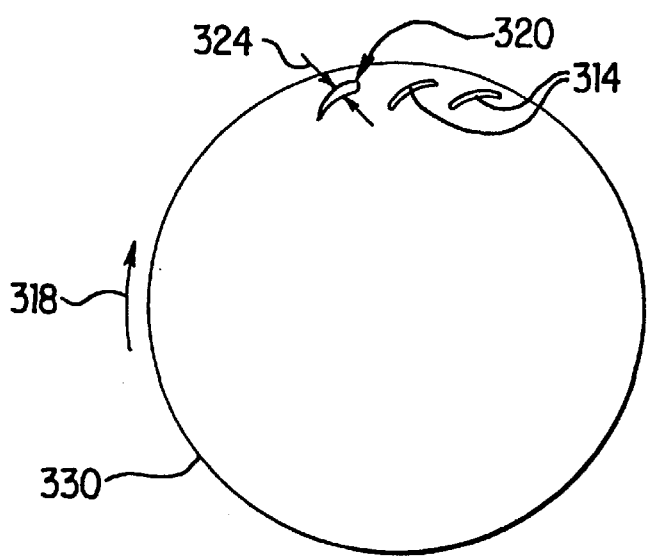
Figure 15:
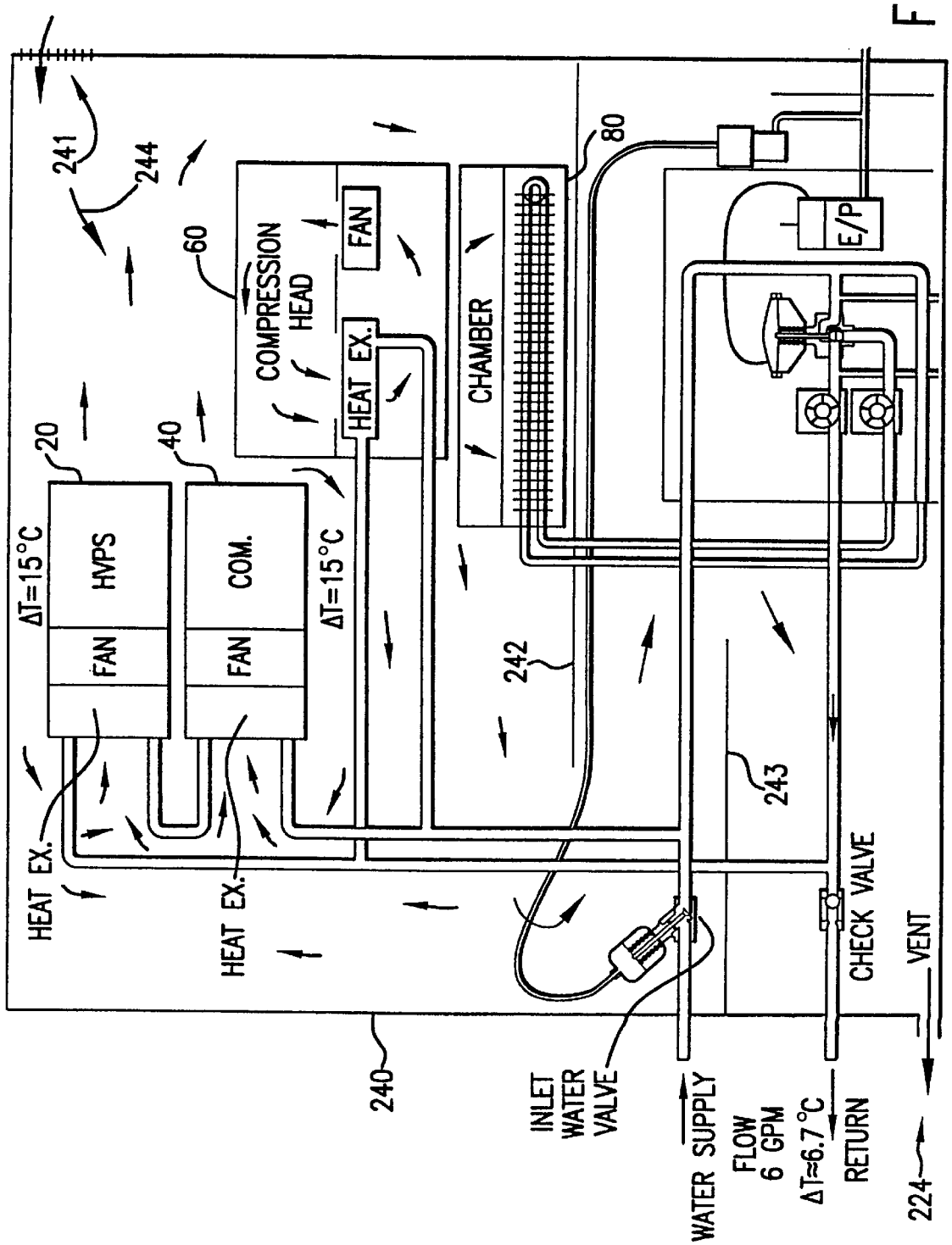
FIG. 15 describes a preferred enclosure cooling system.

Prior art blower blade structures consisted of a tangential blower with 23 longitudinal blades. These blades were mounted symmetrically at the circumference of the structure. Substantial resonance effects were measured both with respect to fan parameters and actual laser performance. Perturbations in the laser beam were shown to correspond to acoustic waves at 23 times the rotating frequency of the fan. Adverse affects on bearing performance were also measured corresponding to 23 times the fan's rotating frequency. Improvements in fan structure design call for a non-symmetrical blade arrangement such as that shown in FIG. 14A. An alternative as shown in FIG. 14B where the fan blade structure is formed of 16 separate machined or cart segments with each segment having 23 blades is to rotate each segment by 360°/(15×23) or about 1° relative to the adjacent segment. Another improvement which is made relatively easy in the machine or cast approach to fan blade structure fabrication is to form the blades into air foils as shown at 320 in FIG. 14C. Prior art blades were stamped and a cross section of the two of the stamped blades are shown for comparison at 314. The direction of rotation is shown at 318 and 330 represents the circumference of the blade structure. Whereas conventional blades are uniform in thickness, airfoil blades have a tear shape profile including a rounded leading edge, a thickened midsection and a tapered trailing edge.

Bearing Improvements

Embodiments of the present invention will be made available with one of two alternative bearing improvements over the prior art.

Ceramic Bearings

A preferred embodiment of the present invention includes ceramic bearings. The preferred ceramic bearings are silicon nitride lubricated with a synthetic lubricant, preferably perfluoropolyalkylether (PFPE). These bearings provide substantially greater life as compared to prior art excimer laser fan bearings. In addition, neither the bearings nor the lubricant are significantly affected by the highly reactive fluorine gas.

Magnetic Bearings

Another preferred embodiment of the present invention comes with magnetic bearings supporting the fan structure as shown in FIG. 7B. In this embodiment, the shaft 130 supporting the fan blade structure 146 is in turn supported by an active magnetic bearing system and driven by a brushless DC motor 130 in which the rotor 129 of the motor and the rotors 128 of at least two bearings are sealed within the gas environment of the laser cavity and the motor stator 140 and the coils 126 of the magnetic bearing magnets are located outside the gas environment. This preferred bearing design also includes an active magnetic thrust bearing 124 which also has the coils located outside the gas environment.

PULSE POWER SYSTEM

Functional Description of Four Pulse Power Modules

Figure 8A:
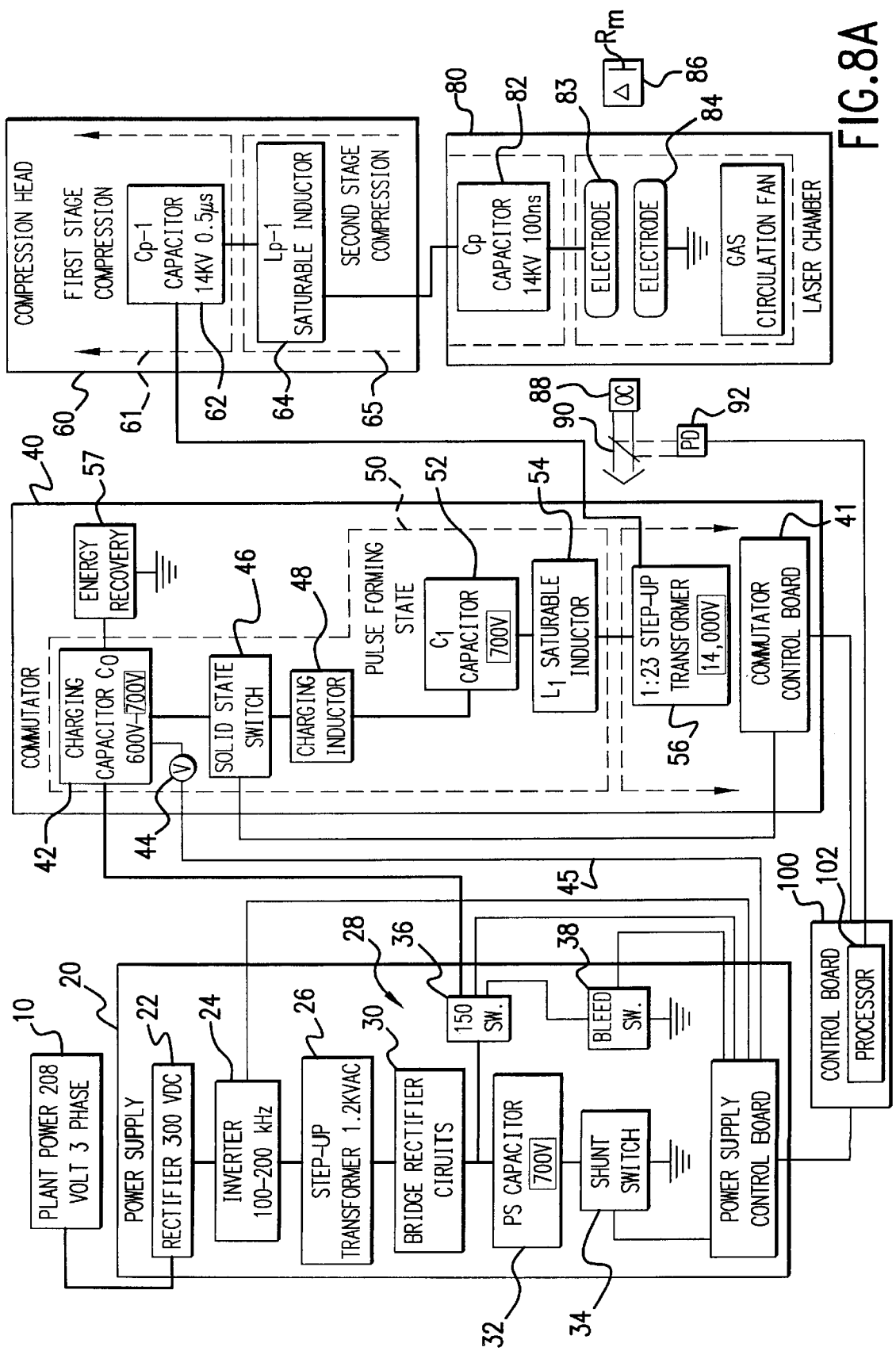
FIG. 8A is a block diagram of a pulse power system of the preferred embodiment of the present invention.
Figure 8B:
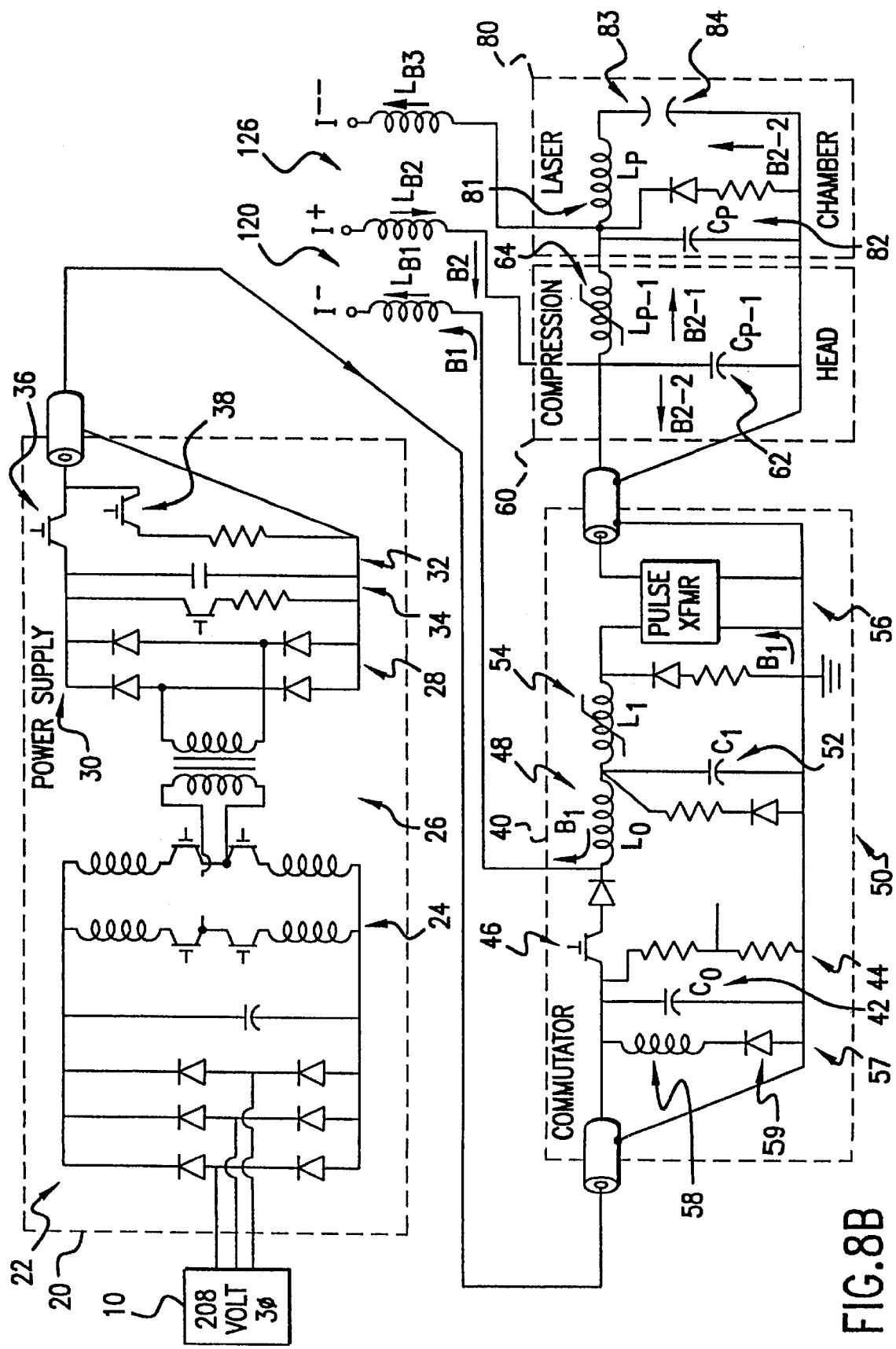
FIG. 8B is a simplified circuit diagram of the above preferred embodiment.

A preferred pulse power system is manufactured in four separate modules as indicated in FIGS. 8A and 8B, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting 280 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F $C_o$ charging capacitor 42 in commutator module 40 as directed by HV power supply control board 21 which controls the operation of inverter 24 as shown in FIG. 8A. Set points within HV power supply control board 21 are set by laser system control board 100.

The reader should note that in this embodiment as shown in FIG. 8A that pulse energy control for the laser system is provided by power supply module 20. The electrical circuits in commutator 40 and compression head 60 merely serve to utilize the electrical energy stored on charging capacitor 42 by power supply module 20 to form at the rate of 1,000 to 2,000 times per second an electrical pulse, to amplify the pulse voltage and to compress in time the duration of the pulse. As an example of this control, FIG. 8A indicates that processor 102 in control board 100 has controlled the power supply to provide precisely 700 volts to charging capacitor 42 which during the charging cycle is isolated from the down stream circuits by solid state switch 46. The electrical circuits in commutator 40 and compression head 60 will upon the closure of switch 46 very quickly and automatically convert the electrical energy stored on capacitor 42 into the precise electrical discharge pulse across electrodes 83 and 84 needed to provide the next laser pulse at the precise energy needed as determined by processor 102 in control board 100.

Commutator Module

Commutator module 40 comprises $C_o$ charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

In this embodiment (designed to provide electrical pulses in the range of about 3 Joules and 16,000 volts at a pulse rate of 2000 Hz pulses per second), about 250 microseconds (as indicated in FIG. 8F1) are required for power supply 20 to charge the charging capacitor 42 to 800 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor $C_o$ into a 16,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the $C_o$ charging capacitor 42.

Pulse Generation Stage

The first stage of high voltage pulse power production is the pulse generation stage 50. To generate the pulse the charge on charging capacitor 42 is switched onto $C_1$ 8.5 μF capacitor 52 in about 5 μs as shown on FIG. 8F2 by closing IGBT switch 46.

First Stage of Compression

A saturable inductor 54 initially holds off the voltage stored on capacitor 52 and then becomes saturated allowing the transfer of charge from capacitor 52 through 1:23 step up pulse transformer 56 to $C_{p-1}$ capacitor 62 in a transfer time period of about 550 ns, as shown on FIG. 8F3, for a first stage of compression 61.

The design of pulse transformer 56 is described below. The pulse transformer is extremely efficient transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84 and preionizer 56A. This transformation of a 550 ns long pulse into a 100 ns long pulse to charge Cp peaking capacitor 82 makes up the second and last stage of compression as indicated at 65 on FIG. 8A.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the optical resonance chamber of the excimer laser. The optical resonance chamber is defined by a line selection package 86 comprised in this example by a 2 prism wavelength selector and a R-max mirror together, indicated as 86 in FIG. 8A and an output coupler 88. The laser pulse for this laser is a narrow band, 20 to 50 ns, 157 nm pulse of about 10 mJ and the repetition rate up to 2000 pulses per second. The pulses define a laser beam 90 and the pulses of the beam are monitored by photodiode 92, all as shown in FIG. 8A.

Control of Pulse Energy

The signal from photo detector 92 is transmitted to processor 102 in control board 100 and the processor uses this energy signal and preferably other historical pulse energy data (as discussed below in the section entitled Pulse Energy Control Algorithm) to set the command voltage for the next and/or future pulses. In a preferred embodiment in which the laser operates in a series of short bursts (such as 100 pulse 0.5 second bursts at 2000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimize pulse-to-pulse energy variations and also to minimize burst-to-burst energy variations. This calculation is performed by processor 102 in control board 100 using this algorithm during a period of about 35 μs. The laser pulses occurs about 5 μs following the $T_o$ firing of IGBT switch 46 shown on FIG. 8F3 and about 20 μs are required to collect the laser pulse energy data. (The start of the firing of switch 46 is called $T_o$.) Thus, a new control voltage value is thus ready (as shown on FIG. 8F1) about 70 microseconds after the firing of IGBT switch 46 for the previous pulse (at 2,000 Hz the firing period is 500 μs). The features of the energy control algorithm are described below and are described in greater detail in U.S. patent application Ser. No. 09/034,870 which is incorporated herein by reference.

Energy Recovery

This preferred embodiment is provided with electronic circuitry which recovers excess energy onto charging capacitor 42 from the previous pulse. This circuitry substantially reduces waste energy and virtually eliminates after ringing in the laser chamber 80.

The energy recovery circuit 57 is comprised of energy recovery inductor 58 and energy recovery diode 59, connected in series across Co charging capacitor 42 as shown in FIG. 8B. Because the impedance of the pulse power system is not exactly matched to that of the chamber and due to the fact that the chamber impedance varies several orders of magnitude during the pulse discharge, a negative going "reflection" is generated from the main pulse which propagates back from the chamber towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIG. 8F1, 2 and 3 are time line charts showing the charges on capacitor Co, $C_1$, $C_{p-1}$ and Cp. The charts show the process of energy recovery on Co.

Magnetic Switch Biasing

In order to completely utilize the full B-H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15A backwards (compared to the directional normal pulse current flow) through the inductors. This bias current is provided by bias current source 120 through isolation inductor LB1. Actual current flow travels from the power supply through the ground connection of the commutator, through the primary winding of the pulse transformer, through saturable inductor 54, through saturable inductor 48, and through isolation inductor LB1 back to the bias current source 120 as indicated by arrows B1.

In the case of compression head saturable inductor, a bias current B2 of approximate 5A is provided from the second bias current source 126 through isolation inductor LB2. At the compression head, the current splits and the majority B2-1 goes through saturable inductor Lp-1 64 and back through isolation inductor LB3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The mount of current which splits into each of the two legs is determined by the resistance in each path and is intentionally adjusted such that each path receives the correct amount of bias current.

Direction of Current Flow

In this embodiment, we refer to the flow of pulse energy through the system from a standard three-phase power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

By reference to FIGS. 8A and 8B, in this preferred embodiment Co capacitor 42 is charged to (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from $C_1$ capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 is toward ground. The result is that current flow between pulse transformer 56 and the electrodes during the initial portion of the discharge (which represents the main portion [typically about 80 percent] of the discharge) is in the direction away from the electrodes toward transformer 56. Therefore, the direction of electron flow during the main discharge is from ground through the secondary of pulse transformer 56 temporarily onto $C_{p-1}$ capacitor 62 through inductor 64, temporarily onto Cp capacitor 82, through inductor 81, through electrode 84 (which is referred to as the discharge cathode) through the discharge plasma, through electrode 83 and back to ground. Thus, between pulse transformer 56 and the electrodes 84 and 83 during the main discharge electrons flow in the same direction as the pulse energy. Immediately following the main portion of the discharge, currents and electron flow are reversed and the reverse electron flow is from ground up through the grounded electrode 84, though the discharge space between the electrodes to electrode 83 and back through the circuit through transformer 56 to ground. The passage of reverse electron flow through transformer 56 produces a current in the "primary" loops of transformer 56 with electron flow from ground through the "primary" side of pulse transformer 56 (the same direction as the current flow of the main pulse) to ultimately charge Co negative as indicated qualitatively in FIG. 8F2. The negative charge on Co is reversed as shown in FIG. 8F2 and explained above in the section entitled Energy Recovery.

DETAILED DESCRIPTION OF PULSE POWER COMPONENTS

Power Supply

Figure 8C:
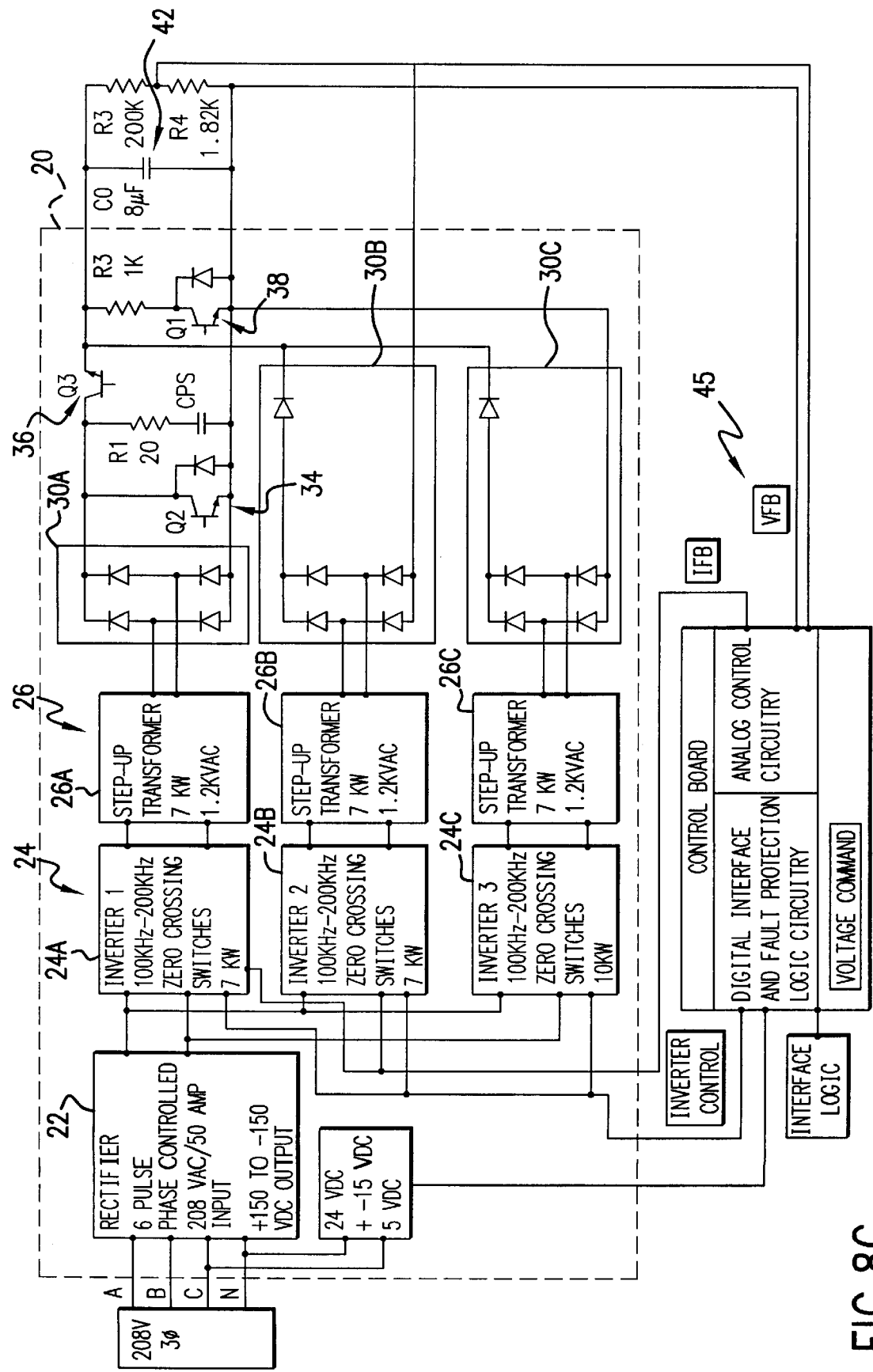
FIG. 8C is a combination block diagram, circuit diagram of a high voltage power supply which is part of the above preferred embodiment.

A more detailed circuit diagram of the power supply portion of the preferred embodiment is shown in FIG. 8C. As indicated in FIG. 8C, rectifier 22 is a 6 pulse phase controlled rectifier with a plus 150v to −150V DC output. Inverter 24 is actually three invertors 24A, 24B and 24C. Invertors 24B and 24C are turned off when the voltage on 8.1 $\mu$F Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above, Q2 switch 34 closes to dissipate stored energy within the supply, Q3 isolation switch 36 opens to prevent any additional energy leaving the supply and Q1 bleed switch 38 closes to bleed down the voltage on Co 42 until the voltage on Co equals the command voltage. At that time Q1 opens.

Commutator and Compression Head

The principal components of commutator 40 and compression head 60 are shown on FIGS. 8A and 8B and are discussed above with regard to the operation of the system. In this section, we describe details of fabrication of the commutator.

Solid State Switch

In this preferred embodiment solid state switch 46 is an P/N CM 1000 HA-28H IGBT switch provided by Powerex, Inc. with offices in Youngwood, Pa.

Inductors

Inductors 48, 54 and 64 comprise saturable inductors similar to those described in U.S. Pat. Nos. 5,448,580 and 5,315,611. A top and section view of a preferred saturable inductor design is shown respectively in FIGS. 8G1 and 8G2. In the inductors of this embodiment, flux excluding metal pieces such as 301, 302, 303 and 304 are added as shown in FIG. 8G2 in order to reduce the leakage flux in the inductors. The current input to this inductor is a screw connection at 305 to a bus also connected to capacitor 62. The current makes four and one half loops through vertical conductors. From location 305 the current travels down a large diameter conductor in the center labeled 1A, up six smaller conductors on the circumference labeled 1B, down 2A, up 2B, down all of the flux excluder elements, up 3B, down 3A, up 4B and down 4A, and the current exits at location 306. Where a pot like housing 64A serves as a high voltage current lead. The "lid" 64B of the saturable inductor is comprised of an electrical insulator material such as teflon. In prior art pulse power systems, oil leakage from oil insulated electrical components has been a problem. In this preferred embodiment, oil insulated components are limited to the saturable inductors and the oil is contained in the pot-like oil containing metal housing 64A which is, as stated above, the high voltage connection output lead. All seal connections are located above the oil level to substantially eliminate the possibility of oil leakage. For example, the lowest seal in inductor 64 is shown at 308 in FIG. 8G2. Since the flux excluding metal components are in the middle of the current path through the inductor, the voltage allowing a reduction in the safe hold-off spacing between the flux exclusion metal parts and the metal rods of the other turns. Fins 307 are provided to increase heat removal.

Capacitors

Capacitor banks 42, 52 and 62 are all comprised of banks of commercially available off-the-shelf capacitors connected in parallel. These capacitors are available from suppliers such as Murata with offices in Smyrna, Ga. Applicants preferred method of connecting the capacitors and inductors is to solder or bolt them to positive and negative terminals on special printed circuit board having heavy nickel coated copper leads in a manner similar to that described in U.S. Pat. No. 5,448,580.

Pulse Transformer

Figure 8E:
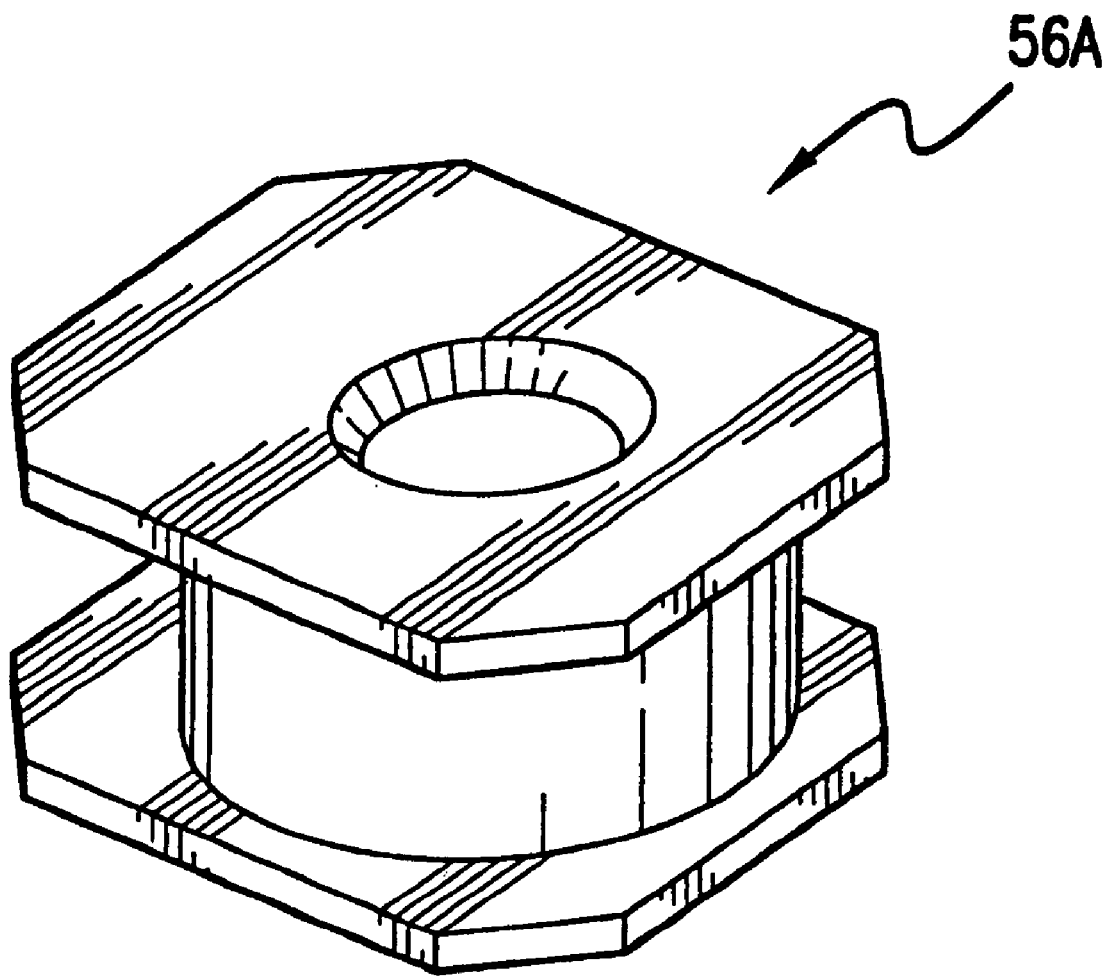
FIG. 8E is a drawing of a primary winding of a pulse transformer used in the above preferred embodiment.
Figure 9A:
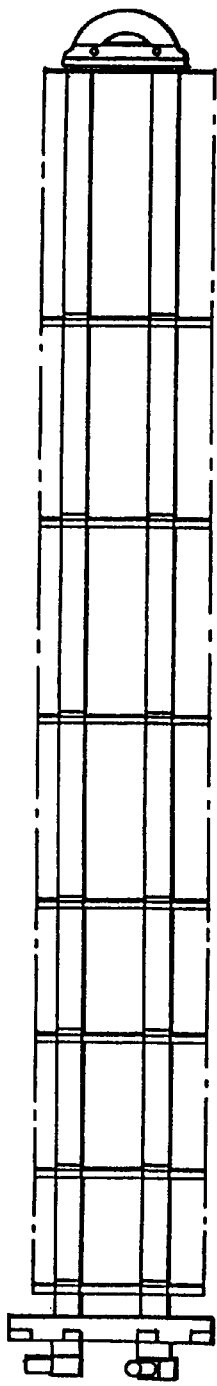
FIGS. 9A and 9B are drawings describing a preferred heat exchanger design.
Figure 9B:
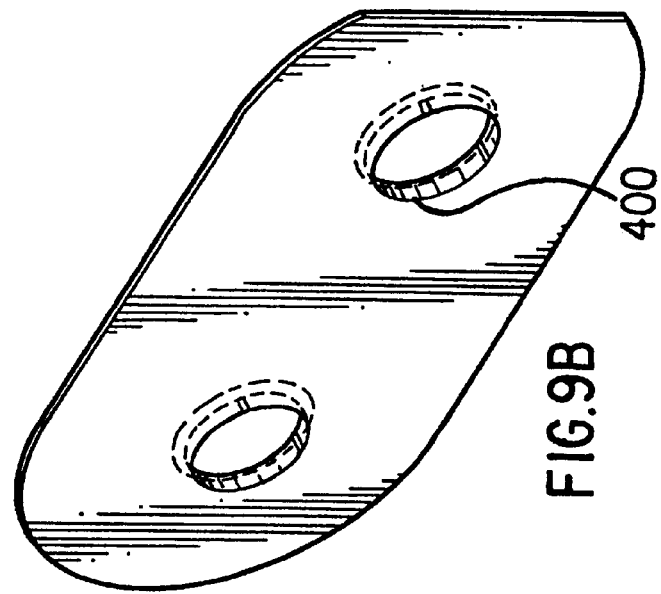

Pulse transformer 56 is also similar to the pulse transformer described in U.S. Pat. Nos. 5,448,580 and 5,313,481; however, the pulse transformers of the present embodiment has only a single turn in the secondary winding and 23 separate primary winding. A drawing of pulse transformer 56 is shown in FIG. 8D. Each of the 23 primary windings comprise an aluminum spool 56A having two flanges (each with a flat edge with threaded bolt holes) which are bolted to positive and negative terminals on printed circuit board 56B as shown along the bottom edge of FIG. 8D. Insulators 56C separates the positive terminal of each spool from the negative terminal of the adjacent spool. Between the flanges of the spool is a hollow cylinder 1⅙ inches long with a 0.875 OD with a wall thickness of about 1/32 inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 8E.

The secondary of the transformer is a single stainless steel rod mounted within a tight fitting insulating tube of electrical glass. The winding is in four sections as shown in FIG. 8D. The stainless steel secondary shown as 56D in FIG. 8D is grounded to a ground lead on printed circuit board 56B at 56E and the high voltage terminal is shown at 56F. As indicated above, a 700 volt pulse between the + and − terminals of the primary windings will produce a minus 16,100 volt pulse at terminal 56F on the secondary side for a 1 to 23 voltage transformation. This design provides very low leakage inductance permitting extremely fast output rise time.

Laser Chamber Pulse Power Components

The Cp capacitor 82 is comprised of a bank of twenty-eight 0.59 nf capacitors mounted on top of the laser chamber pressure vessel. The electrodes 83 and 84 are each solid brass bars about 28 inches long which are separated by about 0.5 to 1.0 inch. In this embodiment, the top electrode 83 is the cathode and the bottom electrode 84 is connected to ground as indicated in FIG. 8A.

Compression Head Mounting

This preferred embodiment of the present invention includes a compression head mounting technique shown in FIGS. 8H1 and 8H2. FIG. 8H1 is a side section view of the laser system showing the location of the compressor head module 60 in relation to electrodes 83 and 84. This technique was designed to minimize the impedance associated with the compression lead chamber connection and at the same time facilitates quick replacement of the compression head. As shown in FIGS. 8H1 and 8H2 the ground connection is made with an approximately 28 inch long slot tab connection along the back side of the compression head as shown at 81A in FIG. 8H1 and 81B in FIG. 8H2. The bottom of the slot tab is fitted with flexible finger stock 81C. A preferred finger stock material is sold under the trade name Multilam®.

The high voltage connection is made between a six-inch diameter smooth bottom of saturable inductor 64 and a mating array of flexible finger stock at 89 in FIG. 8H1. As above, a preferred finger stock material is Multilam®. This arrangement permits the replacement of the compression head module for repair or preventative maintenance in about five minutes.

GAS CONTROL MODULE

This preferred embodiment comprises a fluorine control system which permits operation within a chosen sweet spot without the use of a fluorine monitor. This embodiment can be described by reference to FIG. 16.

Fluorine Depletion

Laser chamber 1 comprises about 20.3 liters of laser gas. Nominally as described above, the constituents are 0.1 percent fluorine and the remainder being a buffer gas (preferably, helium, neon or a combination of helium and neon) at a pressure of about 4 atmospheres. The 0.1 percent fluorine represents a volume of about 0.0023 liters or 2.3 ml of fluorine at 4 atm. In mass terms the nominal amount of fluorine in the laser chamber is about 110 mg. The partial pressure of the pure fluorine is about 411 Pa, pure fluorine (corresponding to about 41 kPa of the 1% fluorine mixture). During normal operations with the laser operating at a duty factor of about 40 percent (which is typical for a lithography laser) fluorine is depleted at a rate of about 4.5 mg per hour (this corresponds to about 4% of the fluorine in the chamber per hour). In terms of partial pressure of pure fluorine, this normal depletion rate of fluorine is about 16 Pa per hour. To make up for this depletion using the 1% fluorine gas mixture, a volume of the mixture equivalent to about 1.6 kPa per hour is added to the chamber.

The fluorine depletion rate for the laser is far from constant. If the laser fan is operating but no lasing is taking place the fluorine depletion rate is cut approximately in half. If the fan is shutdown the fluorine depletion rate is cut to about 1¼ the 40% duty factor depletion rate. At 100% duty factor the depletion rate is about double the 40% duty factor depletion rate.

Gas Replacement

The process described above basically replaces depleted fluorine on an almost continuous basis. Since the fluorine gas source is only 1% fluorine it also replaces a portion of the buffer gas or gases in the chamber on an almost continuous basis. Nevertheless, even though a portion of the laser gas is being substantially continuously replaced, operation in this mode results in a build up of contaminants in the laser gas which reduces the efficiency of the laser. This reduction in efficiency requires an increase in the voltage and/or an increase in the fluorine concentration to maintain the desired pulse energy. For this reason, normal practice with prior art systems suggest that periodically the laser be shutdown for a substantially complete gas exchange. This substantially complete gas exchange is referred to as a refill. These periods may be determined based on number of laser pulses such as 100,000,000 pulses between refills, or refill times may be determined based on calendar time since the last refill or a combination of pulses and calendar time. Also the refill times may be determined by the magnitude of the charging voltage needed for a desired output at a particular fluorine concentration. Preferably after a refill a new test for the "sweet spot" should be run. Also, periodically in between fills the sweet spot test should be performed so that if the sweet spot changes the operator will know where the new sweet spot is.

Figure 16:
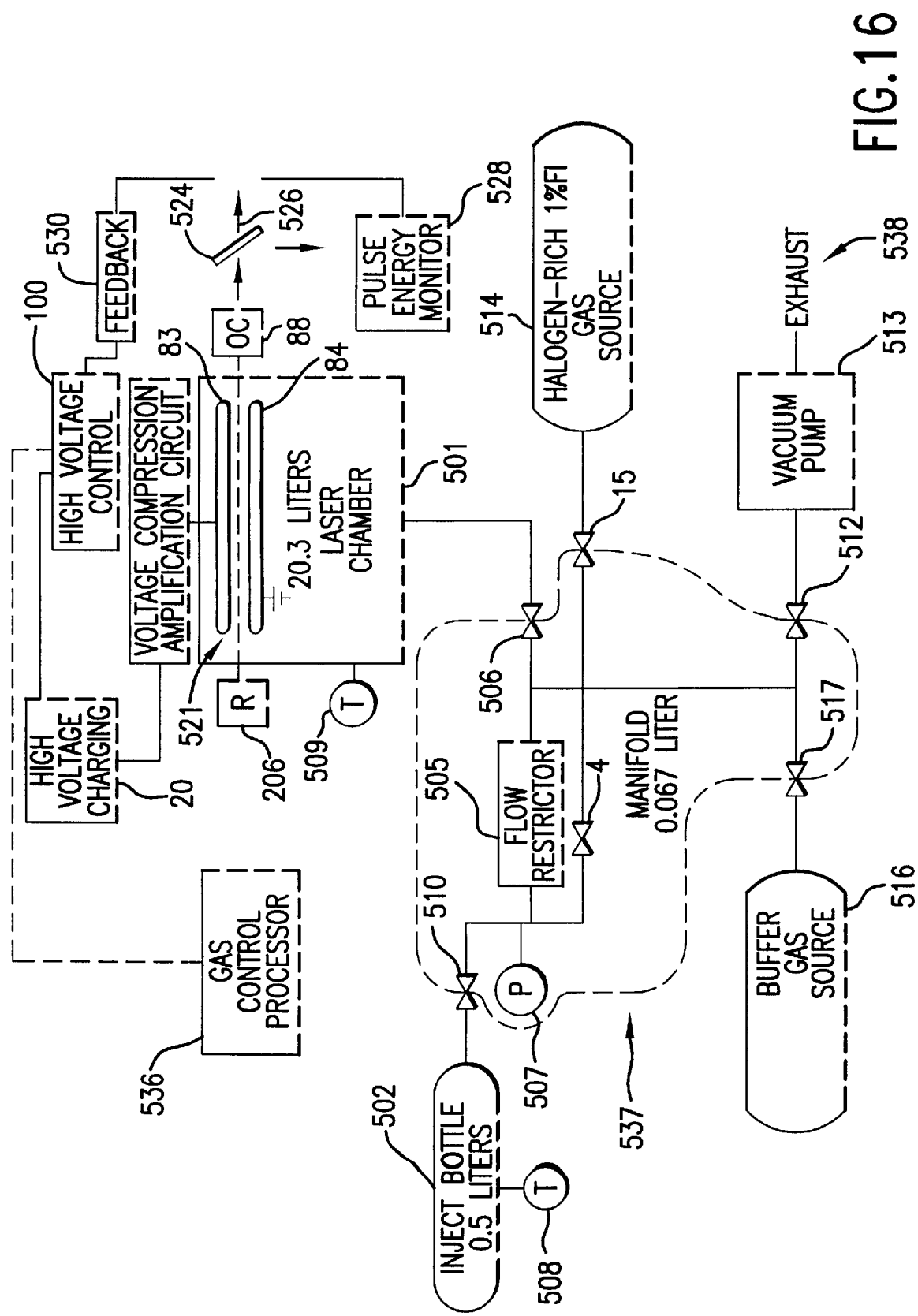
FIG. 16 shows a big manifold gas supply system.

A refill may be accomplished using the system shown in FIG. 16 as follows. This discussion presumes a laser gas normally consisting of 0.1% Fl and the rest buffer gas. With valves 510, 506, 515, 512, 517, and 504 closed, valves 506 and 512 are opened, vacuum pump 513 is operated and the laser chamber is pumped down to an absolute pressure of less than 13 kPa. (A direct pump down line may be provided between the chamber 1 and vacuum pump 513 to permit a quick pump down.) Valve 512 is closed.

Valve 516 is opened and 100% He buffer gas from buffer gas bottle 516 is added to the chamber to fill it to a pressure equivalent to 262 kPa at 50° C. (Note that for this 20.3 liter laser chamber, temperature correction can be approximated using a $\Delta P/\Delta T$ correction of 1 kPa/° C. for a chamber temperature deviation from 50° C. So if the chamber temperature is 23° C. it would be filled to 247 kPa.) Valve 517 is closed and valve 515 is opened and a quantity of the 1% Fl, 99% buffer gas mixture from halogen rich gas bottle 514 is added to chamber 1 to fill it to a pressure equivalent to 290 kPa at 50° C. (Note a temperature correction should be used.) This will produce a gas mixture in the chamber of approximately 0.1% Fl and 99.9% buffer gas. When the chamber is heated to about 50° C. the pressure will be about 4 atm.

PURGE SYSTEM

Because $O_2$ strongly absorbs 157 mn light, $O_2$ must be excluded from the beam path. Applicants have developed an $N_2$ purge system that is greatly improved over prior art systems. All optical components associated with the laser that are outside the chamber are purged with nitrogen. This nitrogen system is operated at a pressure that is during operation of the laser only about 10 pascals in excess of atmospheric pressure. This small pressure differential is preferred to avoid a pressure distortion effect on the optical components. Components purged include the line narrowing module, the output coupler, the wavemeter and the shutter assembly.

Figure 17:
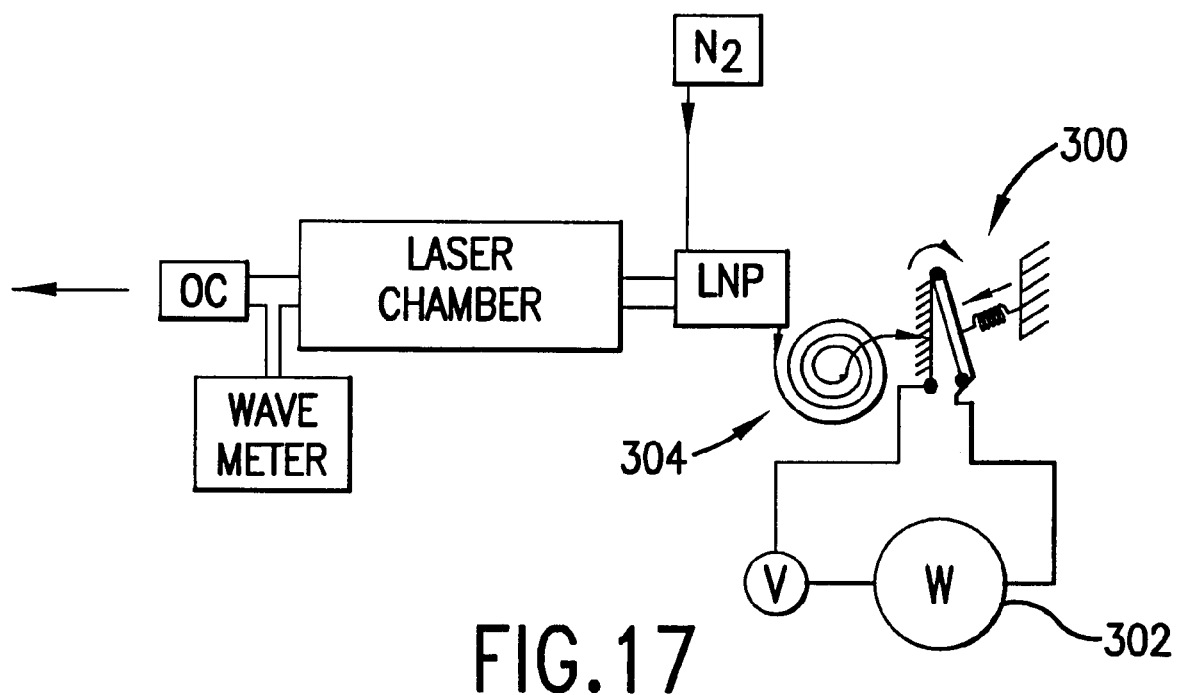
FIGS. 17 and 17A, 17B, 17C and 17D show optical purge systems.

Seals are provided at all potential leakage sites. Output ports consisting of 1/16 inch id. tubes about 6 feet long are provided. The flow through the output ports is monitored to assure proper functioning of the purge system. Preferred flow rates of about 4 liters/minute through the 1/16 -inch id. 6-foot long tube is a preferred flow rate to correspond to the desired $N_2$ pressure differential. Preferably, the 6-foot output port tube 304 coiled up. Flow may be monitored with a simple flap switch 300 which is held open by the $N_2$ flow and energizes a warning light 302 if the flow is lost as shown in FIG. 17. A similar purge system preferably is applied for the output coupler and the wavemeter.

Helium can also be used for the purge gas. Advantages of helium include better heat transfer properties and better optical properties. Helium however is much more expensive than nitrogen and if it is used in a production laser, a collection system for recycling the helium should be considered.

Figure 17B:
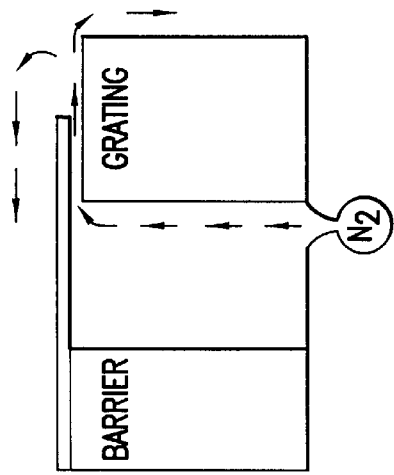
Figure 17D:
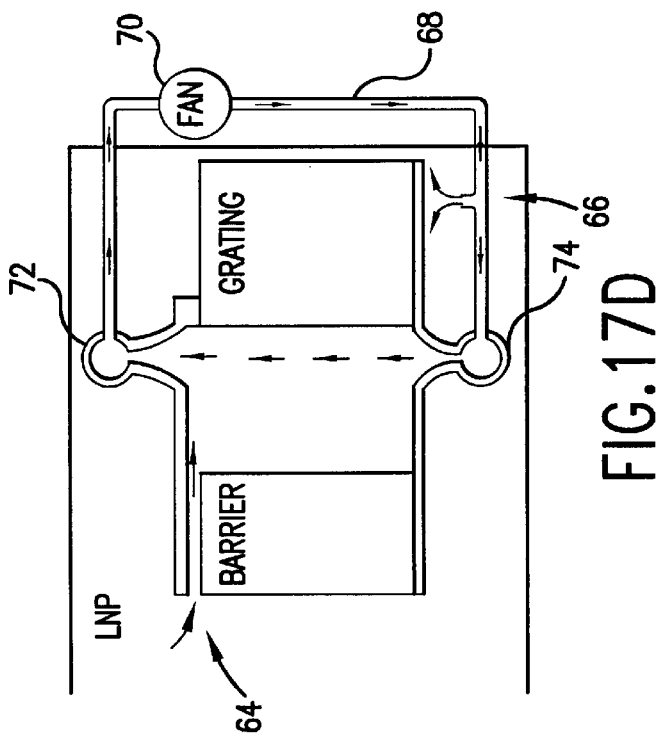
Figure 17A:
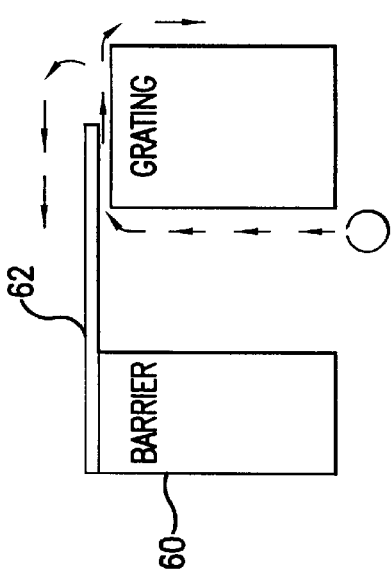
Figure 17C:
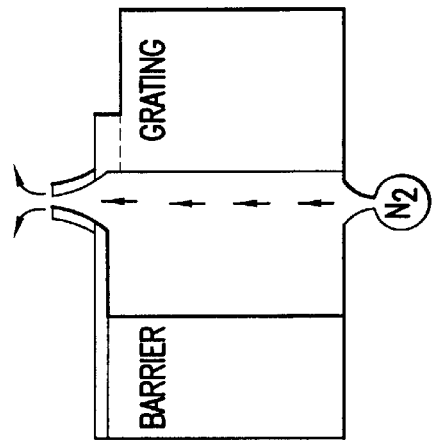

At very high repetition rates, the face of the grating is the LNP shown in FIG. 17 can get hot enough to create a hot boundary layer on the face of the grating and distort the beam. For this reason, a purge flow across the face of the grating may be desired. Examples of such systems are shown in FIGS. 17A, B, C, and D and is described in detail in patent application Ser. No. 09/451,407 entitled "High Power Gas Discharge Laser with Line Narrowing Unit", filed Nov. 30, 1999, which is incorporated herein by reference.

LASER COMPONENT COOLING

Preferred embodiments of the present invention which is especially useful for operation at repetition rates in excess of 1000 to 2000 Hz, includes a unique cooling technique shown in FIG. 13 for cooling an excimer laser.

Components of the laser are contained in enclosure 240 which is maintained on the inside at a slight vacuum produced by a blower mounted in a vent as shown at 224 in FIGS. 13 and 4A. The cabinet comprises filtered intake port 241 near the top of the cabinet and a few small leakage sources, such as around gasketed doors, so that the flow of room air through the laser enclosure is about 200 ft$^3$/min which is not nearly sufficient to remove the heat produced by heat producing components of the laser.

The very great majority (roughly 90 percent) of the waste heat produced by the laser (roughly 12 kw at 100% duty factor) is removed by a chilled water system as shown in FIG. 13.

In this embodiment the major heat sources in the laser are the high voltage supply 20, the commutator 40, the compression head 60 and the laser chamber 80. For the chamber a water cooled heat exchanger is located inside the chamber and heat is transferred from circulating laser gas to the heat exchanger to the cooling water. Another heat exchanger (not shown) is mounted on an outside surface of the chamber. For the rest of the major heat producing components cooling water is piped to the location of the component and one or more fans force air through a water-to-air heat exchanger onto the component as shown in FIG. 13. For the compression head the circulation is contained as shown, but for the HVPS and the commutator the circulation is onto the component then through other portions of the enclosure to also cool other components before being recirculated back to the heat exchangers.

Dividing pans 242 and 243 guide the general ventilation air from filter 241 through a path shown by open headed arrows 244 to vent 224.

This cooling system contains no ducts and except for a water line feeding the heat exchangers inside of and attached to the laser chamber there is no water line connection to any laser component. Since all components (other than the laser chamber) are cooled by air blown about inside the enclosure, there are no cooling connections to make a break when installing and replacing components. Also, the lack of need for ducting greatly increases useable components and working space inside the enclosure.

Although this $F_2$ laser system has been described with reference to a particular embodiment, it is to be appreciated that various adaptations and modifications may be made. For example, many alternative embodiments are discussed in the patent applications listed in the first sentence of this specification, all of which have been incorporated herein by reference. An etalon output coupler could be used to provide additional line narrowing. The laser system could be designed for a variety of modules but preferably the system would include at least seven separate modules. The buffer gas could be neon instead of helium. The invention is to be limited only by the appended claims.

What is claimed is:

1. A tunable narrow band $F_2$ injection seeded laser system comprising:
   A) a tunable seed laser having a first gain medium for generating a narrow band seed beam centered at a wavelength of approximately 157.6 nm and at least one etalon output coupler,
   B) at least one beam amplifier, each of said at least one beam amplifier having second gain medium for amplifying said seed beam to produce an output laser beam at a wavelength of about 157.6 nm with a bandwidth of less than 0.8 pm, said beam amplifier comprising:
      1) a laser chamber module comprising a laser chamber comprising:
         a) at least two elongated electrodes;
         b) a laser gas comprised of
            i) fluorine, and
            ii) a buffer gas mixture;
         c) a gas circulator for circulating said gas between said electrodes at speeds of at least two cm/millisecond
      2) pulse power system of a power supply and pulse compression and amplification circuits and pulse power controls for producing high voltage electrical pulses of at least 14,000 volts across said electrodes at rates of at least about 1000 Hz; and
      3) a laser pulse energy control system for controlling the voltage provided by said pulse power system, said control system.

2. A laser system as in claim 1 wherein said first gain medium and said second gain medium are disposed in a single laser chamber.

3. A laser system as in claim 1 wherein said first gain medium and said second gain medium are disposed in a separate laser chamber.

4. A laser system as in claim 1 wherein said etalon output coupler is tunable.

5. A laser system as in claim 1 wherein said laser system is comprised of at least seven easily replaceable modules.

6. A laser system as in claim 1 wherein the mixture defines a neon concentration within a range of 0.4 to 0.95.

7. A laser system as in claim 6 wherein the mixture defines a neon concentration within a range of 0.52 to 0.63.

8. A laser system as in claim 1 wherein said seed laser comprises resonance cavity comprised of a tunable etalon output coupler and a partially reflecting mirror.

9. A laser system as in claim 1 wherein said seed laser comprises a resonance cavity comprised of two tunable etalon output couplers.

10. A laser system as in claim 1 wherein said seed laser comprises at least two aperture elements, each comprising a plurality of holes.

11. A laser system as in claim 9 wherein beam output of each of said two etalon output couplers are directed through said amplifier.

12. A laser system as in claim 1 wherein said seed laser further comprises a divergence filter.

13. A laser system as in claim 12 wherein said divergence filter is a solid etalon.

14. A laser system as in claim 1 wherein said at least one beam amplifier comprises a plurality of beam amplifiers.

* * * * *